United States Patent
Moriya et al.

(10) Patent No.: US 8,665,945 B2
(45) Date of Patent: Mar. 4, 2014

(54) ENCODING METHOD, DECODING METHOD, ENCODING DEVICE, DECODING DEVICE, PROGRAM, AND RECORDING MEDIUM

(75) Inventors: Takehiro Moriya, Kanagawa (JP); Noboru Harada, Kanagawa (JP); Yutaka Kamamoto, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 72 days.

(21) Appl. No.: 13/202,335

(22) PCT Filed: Mar. 5, 2010

(86) PCT No.: PCT/JP2010/053676
§ 371 (c)(1),
(2), (4) Date: Aug. 19, 2011

(87) PCT Pub. No.: WO2010/104011
PCT Pub. Date: Sep. 16, 2010

(65) Prior Publication Data
US 2011/0305272 A1 Dec. 15, 2011

(30) Foreign Application Priority Data
Mar. 10, 2009 (JP) .................................. 2009-056017

(51) Int. Cl.
*H04B 1/66* (2006.01)
(52) U.S. Cl.
USPC ........... 375/240; 375/296; 704/222; 704/230; 704/229
(58) Field of Classification Search
USPC ................... 375/240, 296; 704/222, 230, 229
See application file for complete search history.

(56) References Cited

U.S. PATENT DOCUMENTS 5,970,443 A * 10/1999 Fujii ............................. 704/222
2003/0046064 A1 3/2003 Moriya et al.
(Continued)

FOREIGN PATENT DOCUMENTS

| JP | 11 272297 | 10/1999 |
| JP | 2002 278600 | 9/2002 |

(Continued)

OTHER PUBLICATIONS

Liebchen et al. (Tilman Liebchen et al., "MPEG-4 ALS: an Emerging Standard for Lossless Audio Coding", 2004, Data Compresion Conference, pp. 439-448).*

(Continued)

*Primary Examiner* — Sam K Ahn
*Assistant Examiner* — Fabricio R Murillo Garcia
(74) *Attorney, Agent, or Firm* — Oblon, Spivak, McClelland, Maier & Neustadt, L.L.P.

(57) ABSTRACT

To improve the encoding compressibility of prediction residuals. An encoder performs prediction analysis of input time-series signals to generate prediction residuals expressed by integers, and sets an integer separation parameter that depends on the amplitude of the prediction residuals for each certain time segment. The encoder selects a side information code table corresponding to an index representing the prediction effectiveness of the time-series signals from a set of side information code tables including a side information code table used for variable length coding of side information corresponding to the separation parameter. A decoder selects a side information code table corresponding to the index representing the prediction effectiveness of the time-series signals from a set of side information code tables including a side information code table used for decoding of a code corresponding to the side information corresponding to the integer separation parameter corresponding to the magnitude of the prediction residuals.

35 Claims, 47 Drawing Sheets

(56) References Cited

U.S. PATENT DOCUMENTS

2007/0043575 A1    2/2007   Onuma et al.
2008/0089438 A1    4/2008   Harada et al.
2011/0254713 A1   10/2011   Moriya et al.

FOREIGN PATENT DOCUMENTS

| JP | 2003 332914 | 11/2003 |
| JP | 2004 151433 | 5/2004 |
| JP | 2007 034230 | 2/2007 |
| WO | 2007 007672 | 1/2007 |

OTHER PUBLICATIONS

Hans, et al., "Lossless Compression of Digital Audio," IEE Signal Processing Magazine, vol. 18, No. 4, pp. 21-32 (Jul. 2001).
ISO/EIC 14496-3:2005 FDAM2, "Amendment 2: Audio Lossless Coding (ALS), new audio profiles and BSAC extensions" (2005).
ITU-T Recommendation G.711, "Pulse Code Modulation (PCM) of Voice Frequencies," International Telecommunication Union (1993).
International Search Report issued Jun. 8, 2010 in PCT/JP10/53676 filed Mar. 5, 2010.

* cited by examiner

| s(0) \ s(1) | 00 | 01 | 10 | 11 |
|---|---|---|---|---|
| 00 | 0 | 1 | 2 | 3 |
| 01 | 4 | 5 | 6 | 7 |
| 10 | 8 | 9 | 10 | 11 |
| 11 | 12 | 13 | 14 | 15 |

FIG.12A

| h \ s | 0 | 1 | 2 | 3 | 4 | OTHER VALUES |
|---|---|---|---|---|---|---|
| | | | T1 | | | |
| 0 | T1[0,0] | T1[0,1] | T1[0,2] | T1[0,3] | T1[0,4] | T1[0,E] |
| 1 | T1[1,0] | T1[1,1] | T1[1,2] | T1[1,3] | T1[1,4] | T1[1,E] |
| 2 | T1[2,0] | T1[2,1] | T1[2,2] | T1[2,3] | T1[2,4] | T1[2,E] |
| 3 | T1[3,0] | T1[3,1] | T1[3,2] | T1[3,3] | T1[3,4] | T1[3,E] |
| 4 | T1[4,0] | T1[4,1] | T1[4,2] | T1[4,3] | T1[4,4] | T1[4,E] |

FIG.12B

| h \ s | 0 | 1 | 2 | 3 | 4 | OTHER VALUES |
|---|---|---|---|---|---|---|
| | | | T1 | | | |
| 0 | II | II | II | II | III | III |
| 1 | I | III | I | II | III | III |
| 2 | I | III | II | III | III | III |
| 3 | II | III | II | III | III | III |
| 4 | III | III | III | III | III | III |

FIG.13A

| T2 | | | | | | |
|---|---|---|---|---|---|---|
| h \ s | 0 | 1 | 2 | 3 | 4 | OTHER VALUES |
| 0 | T2[0,0] | T2[0,1] | T2[0,2] | T2[0,3] | T2[0,4] | T2[0,E] |
| 1 | T2[1,0] | T2[1,1] | T2[1,2] | T2[1,3] | T2[1,4] | T2[1,E] |
| 2 | T2[2,0] | T2[2,1] | T2[2,2] | T2[2,3] | T2[2,4] | T2[2,E] |
| 3 | T2[3,0] | T2[3,1] | T2[3,2] | T2[3,3] | T2[3,4] | T2[3,E] |
| 4 | T2[4,0] | T2[4,1] | T2[4,2] | T2[4,3] | T2[4,4] | T2[4,E] |

FIG.13B

| T2 | | | | | | |
|---|---|---|---|---|---|---|
| h \ s | 0 | 1 | 2 | 3 | 4 | OTHER VALUES |
| 0 | III | III | I | I | II | III |
| 1 | III | III | I | II | III | III |
| 2 | II | II | II | II | III | III |
| 3 | II | II | II | II | III | III |
| 4 | III | III | II | II | III | III |

| T1[1,0] | | |
|---|---|---|
| INPUT VALUE | CODE | NUMBER OF BITS |
| 0 | 110 | 3 |
| 1 | 10 | 2 |
| 2 | 0 | 1 |
| 3 | 1110 | 4 |
| 4 | 11110 | 5 |
| 5 | 111110 | 6 |
| 6 | 1111110 | 7 |
| 7 | 1111111 | 7 |

FIG.14A

| T2[0,2] | | |
|---|---|---|
| INPUT VALUE | CODE | NUMBER OF BITS |
| 0 | 0 | 1 |
| 1 | 10 | 2 |
| 2 | 110 | 3 |
| 3 | 1110 | 4 |
| 4 | 11110 | 5 |
| 5 | 111110 | 6 |
| 6 | 1111110 | 7 |
| 7 | 1111111 | 7 |

FIG.14B

| Tc[1] | |
|---|---|
| [h,s] | CODE |
| [1,0] | 0 |
| [2,0] | 10 |
| [1,2] | 110 |
| [0,0] | 1110 |
| [0,3] | 11110 |
| [0,2] | 111110 |
| [2,2] | 1111111 |
| [3,2] | 11111100 |
| [1,3] | 111111010 |
| ⋮ | ⋮ |
| [4,E] | 111111...10 |

FIG.15A

| Tc[2] | |
|---|---|
| [h,s] | CODE |
| [0,2] | 0 |
| [0,3] | 10 |
| [1,2] | 110 |
| [1,3] | 1110 |
| [2,2] | 11110 |
| [2,3] | 111110 |
| [2,0] | 1111111 |
| [2,1] | 11111100 |
| [3,2] | 111111010 |
| ⋮ | ⋮ |
| [4,E] | 111111...10 |

| h \ s | 0 | 2 | 4 | OTHER VALUES |
|---|---|---|---|---|
| | | | T1 | |
| 0 | T1[0,0] | T1[0,2] | T1[0,4] | T1[0,E] |
| 1 | T1[1,0] | T1[1,2] | T1[1,4] | T1[1,E] |
| 2 | T1[2,0] | T1[2,2] | - | - |
| 3 | T1[3,0] | T1[3,2] | - | - |
| 4 | T1[4,0] | T1[4,2] | - | - |

FIG.25B

| h \ s | 0 | 2 | 4 | OTHER VALUES |
|---|---|---|---|---|
| | | | T1 | |
| 0 | II | II | III | III |
| 1 | I | I | III | III |
| 2 | I | II | - | - |
| 3 | II | II | - | - |
| 4 | III | III | - | - |

FIG.26A

| h \ s | 0 | 2 | 4 | OTHER VALUES |
|---|---|---|---|---|
| | | T2 | | |
| 0 | T2[0,0] | T2[0,2] | T2[0,4] | T2[0,E] |
| 1 | - | T2[1,2] | T2[1,4] | T2[1,E] |
| 2 | - | T2[2,2] | - | - |
| 3 | - | T2[3,2] | - | - |
| 4 | - | T2[4,2] | - | - |

FIG.26B

| h \ s | 0 | 2 | 4 | OTHER VALUES |
|---|---|---|---|---|
| | | T2 | | |
| 0 | III | I | III | III |
| 1 | - | I | III | III |
| 2 | - | II | - | - |
| 3 | - | II | - | - |
| 4 | - | II | - | - |

| T1 | |
|---|---|
| h \ s | ALL VALUES |
| 0 | T1[0,A] |
| 1 | T1[1,A] |
| 2 | T1[2,A] |
| 3 | T1[3,A] |
| 4 | T1[4,A] |

FIG.27A

| T1 | |
|---|---|
| h \ s | ALL VALUES |
| 0 | II |
| 1 | I |
| 2 | I |
| 3 | II |
| 4 | III |

FIG.27B

| T1 |
|---|
| T1[0,A] |

FIG.27E

| T2 |
|---|
| T2[0,A] |

FIG.27F

| T2 | | | | | | |
|---|---|---|---|---|---|---|
| h \ s | 0 | 1 | 2 | 3 | 4 | OTHER VALUES |
| 0 | T[0,0] | T[0,1] | T[0,2] | T[0,3] | T[0,4] | T[0,E] |

FIG.27C

| T2 | | | | | | |
|---|---|---|---|---|---|---|
| h \ s | 0 | 1 | 2 | 3 | 4 | OTHER VALUES |
| 0 | III | III | I | I | III | III |

| s \ h | 0 | 1 | 2(LOWER) | 2(UPPER) | 3(LOWER) | 3(UPPER) | 4 | OTHER VALUES |
|---|---|---|---|---|---|---|---|---|
| 0 | T2[0,0] | T2[0,1] | T2[0,2,L] | T2[0,2,U] | T2[0,3,L] | T2[0,3,U] | T2[0,4] | T2[0,E] |
| 1 | - | T2[1,1] | T2[1,2,L] | T2[1,2,U] | T2[1,3,L] | T2[1,3,U] | T2[1,4] | T2[1,E] |
| 2 | - | T2[2,1] | T2[2,2,L] | T2[2,2,U] | T2[2,3,L] | T2[2,3,U] | - | - |
| 3 | - | T2[3,1] | T2[3,2,L] | T2[3,2,U] | T2[3,3,L] | T2[3,3,U] | - | - |
| 4 | - | - | T2[4,2,L] | T2[4,2,U] | T2[4,3,L] | T2[4,3,U] | - | - |

| s \ h | 0 | 1 | 2(LOWER) | 2(UPPER) | 3(LOWER) | 3(UPPER) | 4 | OTHER VALUES |
|---|---|---|---|---|---|---|---|---|
| 0 | III | II | I | I | I | I | III | III |
| 1 | - | II | I | I | I | I | III | III |
| 2 | - | III | II | II | II | II | - | - |
| 3 | - | III | III | III | II | III | - | - |
| 4 | - | - | III | III | II | III | - | - |

FIG.31A

| $S=s_1س_2$ \ $h$ | 00 | 01 | 02 | 10 | 11 | 12 | 20 | 21 | 22 |
|---|---|---|---|---|---|---|---|---|---|
| 0 | II | III | II | III | III | II | II | III | II |
| 1 | I | III | II | - | III | II | I | III | II |
| 2 | II | II | I | - | II | II | II | II | III |
| 3 | II | II | II | - | II | - | - | II | - |

| $S=s_1s_2$ \ $h$ | 00 | 01 | 02 | 10 | 11 | 12 | 20 | 21 | 22 |
|---|---|---|---|---|---|---|---|---|---|
| 0 | III | III | I | III | III | I | I | I | I |
| 1 | - | III | II | - | III | II | II | II | I |
| 2 | - | III | II | - | III | II | II | II | II |
| 3 | - | III | II | - | III | II | III | III | II |

T2

| T1 | | | |
|---|---|---|---|
| s \ H=$h_1|h_2$ | 0 | 2 | 4 |
| 00 | II | II | III |
| 01 | I | II | III |
| 02 | I | I | II |
| 03 | I | II | II |
| 10 | II | II | II |
| 11 | I | III | III |
| 12 | II | III | III |
| 13 | II | III | III |
| 20 | II | III | III |
| 21 | II | III | III |
| 22 | III | III | - |
| 23 | III | - | - |
| 30 | II | - | - |
| 31 | - | III | - |
| 32 | - | III | - |
| 33 | - | III | - |

FIG.36A

| T2 | | | |
|---|---|---|---|
| s \ H=$h_1|h_2$ | 0 | 2 | 4 |
| 00 | II | I | II |
| 01 | II | I | II |
| 02 | III | II | III |
| 03 | III | II | III |
| 10 | II | I | II |
| 11 | II | I | II |
| 12 | III | II | II |
| 13 | III | II | III |
| 20 | - | II | III |
| 21 | - | II | III |
| 22 | - | III | III |
| 23 | - | III | III |
| 30 | - | II | III |
| 31 | - | III | - |
| 32 | - | III | - |
| 33 | - | III | - |

| S=s1\|s2 \ H=h1\|h2 | T1 | | | | | | | | |
|---|---|---|---|---|---|---|---|---|---|
| | 00 | 01 | 02 | 10 | 11 | 12 | 20 | 21 | 22 |
| 00 | III | III | I | III | III | I | I | I | I |
| 01 | - | III | II | - | III | II | II | I | I |
| 02 | - | III | III | - | III | II | II | II | I |
| 03 | - | - | III | - | III | II | II | II | I |
| ... | | | | | | | | | |
| 32 | - | III | II | - | III | III | III | II | II |
| 33 | - | III | II | - | III | III | III | III | II |

ENCODING METHOD, DECODING METHOD, ENCODING DEVICE, DECODING DEVICE, PROGRAM, AND RECORDING MEDIUM

TECHNICAL FIELD

The present invention relates to a technique of performing prediction analysis and coding of time-series signals. In particular, it relates to a coding method, a decoding method, an encoder, a decoder for prediction residuals, a program therefor, and a recording medium therefor.

BACKGROUND ART

When time-series signals, such as audio signals and video information, are transmitted on a communication channel or recorded on an information recording medium, it is effective in terms of transmission efficiency or recording efficiency to transmit or record the time-series signals after they are converted to compressed codes. In recent years, increasing use of broadband access and increasing capacity of storage devices have caused greater importance to lossless compression encoding methods that allow the original signal to be reproduced losslessly, rather than lossy compression encoding methods that place the highest priority on high compression rates (refer to non-patent literature 1, for example). In such circumstances, a predictive coding has been approved as an international standard of Moving Picture Experts Group (MPEG), which is named as MPEG-4 ALS (see Non-patent literature 2, for example).

FIG. 1 is a block diagram for illustrating a functional configuration of an encoder 2100 based on a conventional lossless compression encoding scheme. FIG. 2 is a block diagram for illustrating a functional configuration of a residual coding unit 2120 shown in FIG. 1. FIG. 3 is a block diagram for illustrating a functional configuration of a decoder 2200 based on the conventional lossless compression encoding scheme. FIG. 4 is a block diagram for illustrating a functional configuration of a residual decoding unit 2220 shown in FIG. 3. First, the conventional lossless compression encoding scheme will be described with reference to these drawings.

(Encoding Method)

Pulse code modulation (PCM) time-series signals x(n) that are sampled and quantized are input to a frame buffer 2111 in the encoder 2100 (the character n denotes an index representing a discrete time). The frame buffer 2111 buffers time-series signals x(n) (n=0, . . . , N−1, where the character N denotes a positive integer) in a predetermined time segment (referred to as a "frame" hereinafter). The one frame of time-series signals x(n) (n=0, . . . , N−1) buffered is fed into a linear prediction analyzer 2112 in a prediction coding unit 2110, and the linear prediction analyzer 2112 calculates first-order to M-th-order PARCOR coefficients k(m) (m=1, 2, . . . , M) by linear prediction analysis.

The linear prediction analysis is based on the assumption that a linear combination of a time-series signal x(n) at a time n and M time-series signals x(n−1), x(n−2), . . . , x(n−M) at times n−1, n−2, . . . , n−M preceding the time n weighted with coefficients α(m) (m=1, . . . , M) represents a prediction residual e(n) (the character M denotes a "prediction order", the coefficient α(m) is referred to also as a "linear prediction coefficient", and the prediction residual e(n) is referred to also as a "prediction error"). A linear prediction model based on the assumption is expressed by the following formula (1). In the linear prediction analysis, for the input one frame of time-series signals x(n) (n=0, . . . , N−1), the linear prediction coefficients α(m) (m=1, . . . , M) that minimize the energy corresponding to the prediction residuals e(n) (n=0, . . . , N−1) for the one frame or other coefficients that can be converted into the linear prediction coefficients α(m), such as PARCOR coefficients k(m) (m=1, . . . , M), are calculated.

$$e(n) = x(n) + \alpha(1) \cdot x(n-1) + \alpha(2) \cdot x(n-2) + \ldots + \alpha(M) \cdot x(n-M) \quad (1)$$

Specific examples of the linear prediction analysis include sequential methods, such as the Levinson-Durbin method and the Burg method, and methods of solving, for each prediction order, the simultaneous equations whose solutions are linear prediction coefficients that minimize the prediction residuals, such as the autocorrelation method and the covariance method.

A linear finite impulse response (FIR) filter expressed by the following formula for estimating a time-series signal y(n) at a time n from M time-series signals x(n−1), x(n−2), . . . , x(n−M) at times n−1, n−2, . . . , n−M preceding the time n is referred to as a "linear prediction filter".

$$Y(n) = -\{\alpha(1) \cdot x(n-1) + \alpha(2) \cdot x(n-2) + \ldots + \alpha(M) \cdot x(n-M)\} \quad (2)$$

The calculated PARCOR coefficients k(m) (m=1, . . . , M) are fed into a quantizer 2113. The quantizer 2113 quantizes the M PARCOR coefficients k(m) (m=1, . . . , M) to generate M quantized PARCOR coefficients i(m) (m=1, . . . , M) and outputs the quantized PARCOR coefficients i(m). For example, to generate a 4-bit quantized PARCOR coefficient i(m) from the PARCOR coefficient k(m), the possible range of the PARCOR coefficient k(m) is divided into 16 sub-ranges, and each of the 4-bit values "0000" to "1111" is assigned to a different one of the 16 sub-ranges. Then, the 4-bit value assigned to the sub-range corresponding to the input PARCOR coefficient k(m) is output as the quantized PARCOR coefficient i(m). The M quantized PARCOR coefficients i(m) (m=1, . . . , M) are fed into a coefficient coding unit 2114, and the coefficient coding unit 2114 generates a coefficient code $C_k$ corresponding to the M quantized PARCOR coefficients i(m) (m=1, . . . , M). The coefficient coding unit 2114 may generate the coefficient code $C_k$ by performing variable length coding of the M quantized PARCOR coefficients i(m) and combining the resulting M codes or by performing variable length coding of a bit sequence composed of the M quantized PARCOR coefficients i(m) (m=1, . . . , M), for example. Alternatively, the coefficient code $C_k$ may be the bit sequence composed of the M quantized PARCOR coefficients i(m) (m=1, . . . , M). In this case, the coefficient coding unit 2114 can be omitted, and the quantizer 2113 can output the coefficient code $C_k$. The quantized PARCOR coefficients i(m) (m=1, . . . , M) are also fed into a linear prediction coefficient converter 2115. Using these coefficients, the linear prediction coefficient converter 2115 calculates the linear prediction coefficients α(m) (m=1, 2, . . . , M). In general, the linear prediction coefficient converter 2115 determines M PARCOR coefficients k'(m) (m=1, . . . , M) by inverse quantization of the M quantized PARCOR coefficients i(m) (m=1, . . . , M) and then determines the M linear prediction coefficients α(m) (m=1, . . . , M) from the M PARCOR coefficients k'(m) (m=1, . . . , M). The inverse quantization of the quantized PARCOR coefficient i(m) is to determine a predetermined value k'(m) of the PARCOR coefficient k(m) in the sub-range for the quantized PARCOR coefficient i(m). For example, if the quantized PARCOR coefficient i(m) is the quantized value of the PARCOR coefficient k(m) within η1≤k(m)<η2 the PARCOR coefficient k'(m) generated by inverse quantization of the quantized PARCOR coefficient i(m) is the average of η1 and η2, for example.

Using the one frame of time-series signals x(n) (n=0, ..., N−1) and the linear prediction coefficients α(m) (m=1, ..., M), a linear prediction unit 2016 generates the linear prediction values y(n) (n=1, ..., N−1) with the linear prediction filter. A subtractor 2117 calculates the prediction residuals e(n) by subtracting the linear prediction values y(n) from the time-series signals x(n), respectively (a prediction filter processing).

The calculated prediction residuals e(n) are values represented by integers in a predetermined range. For example, suppose that the input time-series signals x(n) are expressed in integers with a finite number of bits, and the linear prediction values y(n) are output values of a linear prediction filter with integer filter coefficients formed by rounding off or otherwise eliminating the fractional parts of the linear prediction coefficients. Then, each prediction residual e(n), which is obtained by subtracting the linear prediction value y(n) from the time-series signal x(n), is expressed in an integer form of a finite number of bits (or represented by an integer in a predetermined range). If the time-series signal x(n) or the linear prediction value y(n) is not expressed in an integer form, the prediction residual e(n) may be a value obtained by subtracting the linear prediction value y(n) from the time-series signal x(n) and converting the difference into an integer expression of a finite number of bits. The residual coding unit 2120 performs Golomb-Rice coding of the prediction residuals e(n) represented by integers. For example, in the Golomb-Rice coding, a Rice parameter calculator 2121 first generates a Rice parameter s, which is an integer, using the input one frame of prediction residuals e(n) (n=0, ..., N−1). The Rice parameter s is a value that minimizes the total code amount of the codes corresponding to the one frame of prediction residuals e(n) (n=0, ..., N−1), for example. In other words, the value of the Rice parameter s is associated with the magnitude of the input prediction residuals e(n). The Rice parameter s may be generated for each frame or each sub-frame, which is a time segment formed by dividing one frame.

Then, the prediction residuals e(n) and the Rice parameter s are input to a separating unit 2122a in a Golomb-Rice coding unit 2122. The separating unit 2122a performs a predetermined division using these values to calculate the integer quotients q(n) and information sub(n) that indicates the remainders. Essentially, the division is a calculation that divides the prediction residual e(n) by $2^s$. However, in order to separately handle positive and negative prediction residuals e(n) or reduce the code length, for example, the calculation that simply divides the prediction residual e(n) by $2^s$ may be slightly modified. If the divisor is a power of 2, and the dividend is an integer expressed by a binary number, the division is a process of eliminating a lower-order bit of the dividend; higher-order bits represent the quotient, and the remaining lower-order bits represent the remainder.

Then, an Alpha coding unit 2122b performs alpha coding (which is variable length coding and referred to also as unary coding) of the quotient q(n) to generate information prefix(n) (a variable length code). The generated information prefix(n) and the information sub(n) are input to a combining unit 2122c. The combining unit 2122c outputs a bit combination value prefix(n)|sub(n) of the information prefix(n) and the information sub(n), the bit combination value being a residual code $C_e$ corresponding to the prediction residual e(n) at a discrete time n. The residual coding unit 2120 also outputs a complementary code $C_c$ that indicates the Rice parameter s along with the residual code $C_e$. When the Rice parameter s is generated for each frame, the information that indicates that sub-frame separation is not applied and the Rice parameter s are output as the complementary code $C_c$. When the Rice parameter s is generated for each sub-frame, the Rice parameter s generated for the first sub-frame, difference codes $C_d$ obtained by performing Golomb-Rice coding of the differences between the Rice parameters s generated for adjacent sub-frames, and flag information indicating that the Rice parameter s is generated in each sub-frame are output as the complementary code $C_c$.

The coefficient code $C_k$ generated by the prediction coding unit 2110, and the residual code $C_e$ and the complementary code $C_c$ generated by the residual coding unit 2120 are fed into a combining unit 2130, and the combining unit 2130 combines the codes to generate a code $C_g$.

(Decoding Method)

The code $C_g$ input to the decoder 2200 is separated by a separator 2210 into the coefficient code $C_k$, the residual code $C_e$ and the complementary code $C_c$. The coefficient code $C_k$ is input to a prediction decoding unit 2230, and the residual code $C_e$ and the complementary code $C_c$ are input to the residual decoding unit 2220.

The residual decoding unit 2220 extracts the Rice parameter s from the input complementary code $C_c$. For example, when the complementary code $C_c$ includes the flag information, the Rice parameters s for respective sub-frames are obtained by reproducing Rice parameters s for the second and following sub-frames in a Rice parameter reproducing unit 2222. Alternatively, when the complementary code $C_c$ includes the information that indicates that the sub-frame separation is not applied, the Rice parameter s included in the complementary code $C_c$ is the Rice parameter s for the frame. Besides, a Golomb-Rice decoding unit 2221 in the residual decoding unit 2220 separates the input residual code $C_e$ into the information prefix(n) and the information sub(n). An alpha decoding unit 2221c decodes the separated information prefix(n) to generate the quotient q(n). Note that decoding of a variable length code is referred to as variable length decoding. The information sub(n), the quotient q(n) and the Rice parameter s are input to a combining unit 2221b, and the combining unit 2221b reproduces the prediction residual e(n) using these values.

The coefficient code $C_k$ input to the prediction decoding unit 2230 is fed into a coefficient decoding unit 2231. The coefficient decoding unit 2231 decodes the coefficient code $C_k$ to generate the quantized PARCOR coefficients i(m) (m=1, ..., M) and outputs the generated quantized PARCOR coefficients i(m) (m=1, ..., M). The quantized PARCOR coefficients i(m) (m=1, ..., M) are fed into a linear prediction coefficient converter 2232. The linear prediction coefficient converter 2232 uses the quantized PARCOR coefficients i(m) (m=1, ..., M) to calculate respective linear prediction coefficients α(m) (m=1, ..., M) of the linear prediction filter of the prediction order M. A linear prediction unit 2233 generates linear prediction values y(n) (n=0, ..., N−1) by applying the linear prediction filter having the calculated linear prediction coefficients α(m) (m=1, ..., M) and up to one frame of time-series signals x(n) (n=0, ..., N−1) previously output from an adder 2234. The adder 2234 sums the linear prediction values y(n) and the prediction residuals e(n) reproduced by the residual decoding unit 2220 to generate the time-series signals x(n) (an inverse prediction filtering processing). The process of generating the time-series signals x(n) (n=0, ..., N−1) from the prediction residuals e(n) (n=0, ..., N−1) is referred to as prediction synthesis, and the filter used for the process is referred to as a prediction synthesis filter. The prediction synthesis corresponding to the linear prediction analysis (short-term prediction analysis) is referred to as linear prediction synthesis (short-term prediction synthesis).

The synthesis filter corresponding to the linear prediction filter is expressed by the following formula, for example:

$$x(n)=e(n)-\{\alpha(1)\cdot x(n-1)+\alpha(2)\cdot x(n-2)+\ldots+\alpha(M)\cdot x(n-M)\}$$

where $\alpha(1)$ to $\alpha(M)$ are coefficients of the synthesis filter in this example.

Although the coding method and the decoding method based on the linear prediction analysis are described above, there are the coding method and the decoding method based on the long-term prediction analysis, a combination of the short-term prediction analysis and the long-term prediction analysis or a multi-channel prediction analysis, which is a prediction analysis using an inter-channel correlation. The long-term prediction analysis is based on a property that the amplitude characteristics of time-series signals are repeated at a fundamental period. In the long-term prediction analysis, a long-term prediction model expressed by the following formula is defined.

$$e(n)=x(n)+\rho(-\text{tap})\cdot x(n-\tau+\text{tap})+\ldots+\rho(\text{tap})\cdot x(n-\tau-\text{tap}) \quad (3)$$

This model is based on an assumption that the prediction residual $e(n)$ is represented by a linear combination of a time-series signal $x(n)$ at a time n and time-series signals $x(n-\tau-j)$ at a time $n-\tau-j$ preceding the time n by $\tau+j$ weighted with coefficients $\rho(j)$ (referred to as a "gain") ($\tau$ denotes a fundamental period (a delay value), and $j=-\text{tap},\ldots,\text{tap}$ (tap is 0 or 1 in many cases)). Then, the gains $\rho(j)$ ($j=-\text{tap},\ldots,\text{tap}$) and the delay values $\tau$ that minimize the energy corresponding to the one frame of prediction residuals $e(n)$ are calculated for the input one frame of time-series signals $x(n)$ ($n=0,\ldots, N-1$). A linear FIR filter expressed by the following formula is referred to as a "long-term prediction filter".

$$y(n)=-\{\rho(-\text{tap})\cdot x(n-\tau+\text{tap})+\ldots+\rho(\text{tap})\cdot x(n-\tau-\text{tap})\} \quad (4)$$

The prediction synthesis corresponding to the long-term prediction analysis is referred to as long-term prediction synthesis. The synthesis filter corresponding to the long-term prediction filter is expressed by the following formula, for example:

$$x(n)=e(n)-\{\rho(-\text{tap})\cdot x(n-\tau+\text{tap})+\ldots+\rho(\text{tap})\cdot x(n-\tau-\text{tap})\}$$

where $\rho(-\text{tap})$ to $\rho(\text{tap})$ are coefficients of the synthesis filter in this example.

RELATED ART LITERATURE

Non-Patent Literature

Non-patent literature 1: Mat Hans and Ronald W. Schafer, "Lossless Compression of Digital Audio", IEEE SIGNAL PROCESSING MAGAZINE, July 2001, pp. 21-32

Non-patent literature 2: ISO/IEC 14496-3 AMENDMENT 2: Audio Lossless Coding (ALS), new audio profiles and BSAC extensions

SUMMARY OF THE INVENTION

Problem to be Solved by the Invention

As described above, according to the conventional encoding method, at least a part of the side information, such as the Rice parameter, used in encoding prediction residuals is not subjected to compression encoding and is output as a code as it is. However, if the side information is encoded based on the statistical property of the side information, the encoding compressibility can be improved.

As a modification of the Golomb-Rice coding, a method that involves encodings the quotients by other methods than the Alpha coding is possible (not known in the prior art). In this case, the side information has to further include information representing a quotient code table index that identifies the quotient code table used for encoding of the quotients. In this case also, if the side information is encoded based on the statistical property of the side information, the encoding compressibility can be improved. In this modification of the Golomb-Rice coding, the encoding compressibility may be more significantly improved by using a parameter other than the Rice parameter than using the Rice parameter (not known in the prior art). The parameters that identify the divisor used in calculation of the quotients described above are collectively referred to as a "separation parameter".

Means to Solve the Problems

In encoding according to the present invention, a prediction analysis of time-series signals is performed to generate prediction residuals expressed by integers, an integer separation parameter corresponding to the magnitude of the prediction residual is set for each certain time segment, and a side information code table corresponding to an index representing the prediction effectiveness of the time-series signals is selected from a set of side information code tables including a side information code table used for variable length coding of side information used for encoding of the prediction residuals. The prediction analysis includes a linear prediction (short-term prediction) between adjacent samples and/or a long-term prediction between samples separated by several samples. The average code amount of the code corresponding to the side information can be reduced by using the side information code table selected in this way for encoding the side information.

Effects of the Invention

According to the present invention, the encoding compressibility of prediction residuals can be improved.

BRIEF DESCRIPTION OF THE DRAWINGS

FIG. 12A is a table showing combinations of a separation parameter s and a quotient code table index h for different quotient code tables T1[h, s];

FIG. 12B is a table showing a relationship between the frequency of selection of each quotient code table T1[h, s] shown in FIG. 12A and the combination of the separation parameter s and the quotient code table index h;

FIG. 13A is a table showing combinations of a separation parameter s and a quotient code table index h for different quotient code tables T2[h, s];

FIG. 13B is a table showing a relationship between the frequency of selection of each quotient code table T2[h, s] shown in FIG. 13A and the combination of the separation parameter s and the quotient code table index h;

FIG. 14A shows an example of the quotient code table T1[h, s] shown in FIG. 12A;

FIG. 14B shows an example of the quotient code table T2[h, s] shown in FIG. 13A;

FIG. 15A shows an example of a side information code table Tc[1];

FIG. 15B shows an example of a side information code table Tc[2];

FIG. 25A is a table showing combinations of the separation parameter s and the quotient code table index h for different quotient code tables T1[h, s];

FIG. 25B is a table showing a relationship between the frequency of selection of each quotient code table shown in FIG. 25A and the combination of the separation parameter s and the quotient code table index h;

FIG. 26A is a table showing combinations of the separation parameter s and the quotient code table index h for different quotient code tables T2[h, s];

FIG. 26B is a table showing a relationship between the frequency of selection of each quotient code table shown in FIG. 26A and the combination of the separation parameter s and the quotient code table index h;

FIG. 27A is a table showing combinations of the separation parameter s and the quotient code table index h for different quotient code tables T1[h, s];

FIG. 27B is a table showing a relationship between the frequency of selection of each quotient code table shown in FIG. 27A and the combination of the separation parameter s and the quotient code table index h;

FIG. 27C is a table showing combinations of the separation parameter s and the quotient code table index h for different quotient code tables T2[h, s];

FIG. 27D is a table showing a relationship between the frequency of selection of each quotient code table shown in FIG. 27C and the combination of the separation parameter s and the quotient code table index h;

FIG. 27E is a diagram for illustrating another example of the code tables;

FIG. 27F is a diagram for illustrating another example of the code tables;

FIG. 28A is a table showing combinations of the separation parameter s (upper or lower) and the quotient code table index h for different quotient code tables T2[h, s];

FIG. 28B is a table showing a relationship between the frequency of selection of each quotient code table shown in FIG. 28A and the combination of the separation parameter s (upper or lower) and the quotient code table index h;

FIG. 31A is a table showing a relationship between the frequency of selection of each quotient code table in a set T1 suitable for a prediction gain pg and the combination of an integrated parameter S, which is an integration of separation parameters $s_i$ for each frame, and the quotient code table index h;

FIG. 31B is a table showing a relationship between the frequency of selection of each quotient code table in a set T2 suitable for the prediction gain pg and the combination of the integrated parameter S, which is an integration of separation parameters $s_i$ for each frame, and the quotient code table index h;

FIG. 36A is a table showing a relationship between the frequency of selection of each quotient code table in a set T1 suitable for a prediction gain pg selected for each sub-frame of a frame by a code table selector 522d in the residual coding unit and the combination of the separation parameter s and an integrated index H, which is an integration of quotient code table indices $h_i$ for the frame;

FIG. 36B is a table showing a relationship between the frequency of selection of each quotient code table in a set T2 suitable for the prediction gain pg selected for each sub-frame of a frame by the code table selector 522d in the residual coding unit and the combination of the separation parameter s and the integrated index H, which is an integration of quotient code table indices $h_i$ for the frame;

FIG. 39 is a table showing a relationship between the frequency of selection of the quotient code table selected for each frame and the combination of the integrated parameter S, which is an integration of the separation parameters $s_i$ for the frame, and the integrated index H, which is an integration of the quotient code table indices $h_i$ for the frame;

DETAILED DESCRIPTION OF THE EMBODIMENTS

Figure 1:
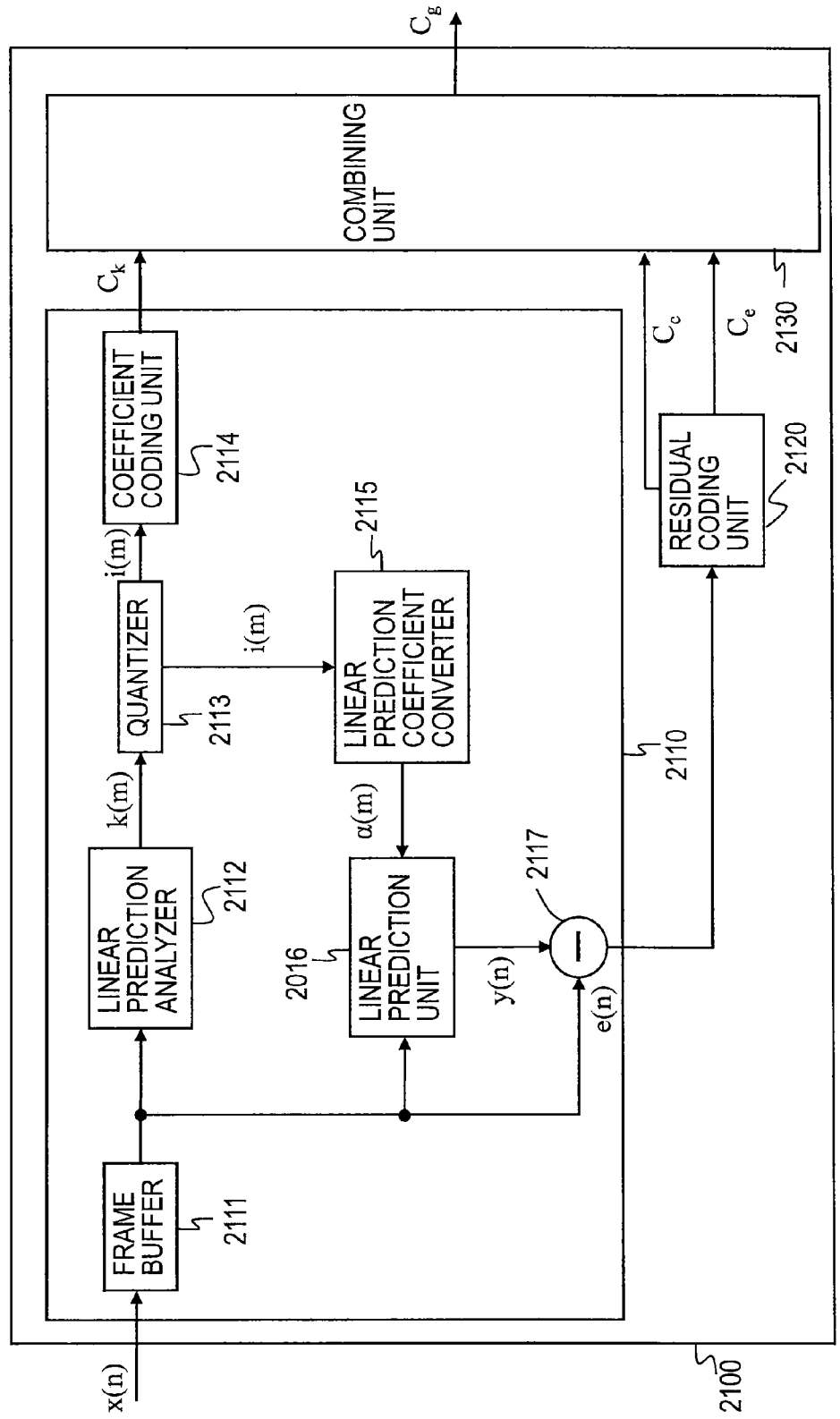
FIG. 1 is a block diagram for illustrating a functional configuration of an encoder based on a conventional lossless compression encoding scheme.
Figure 2:
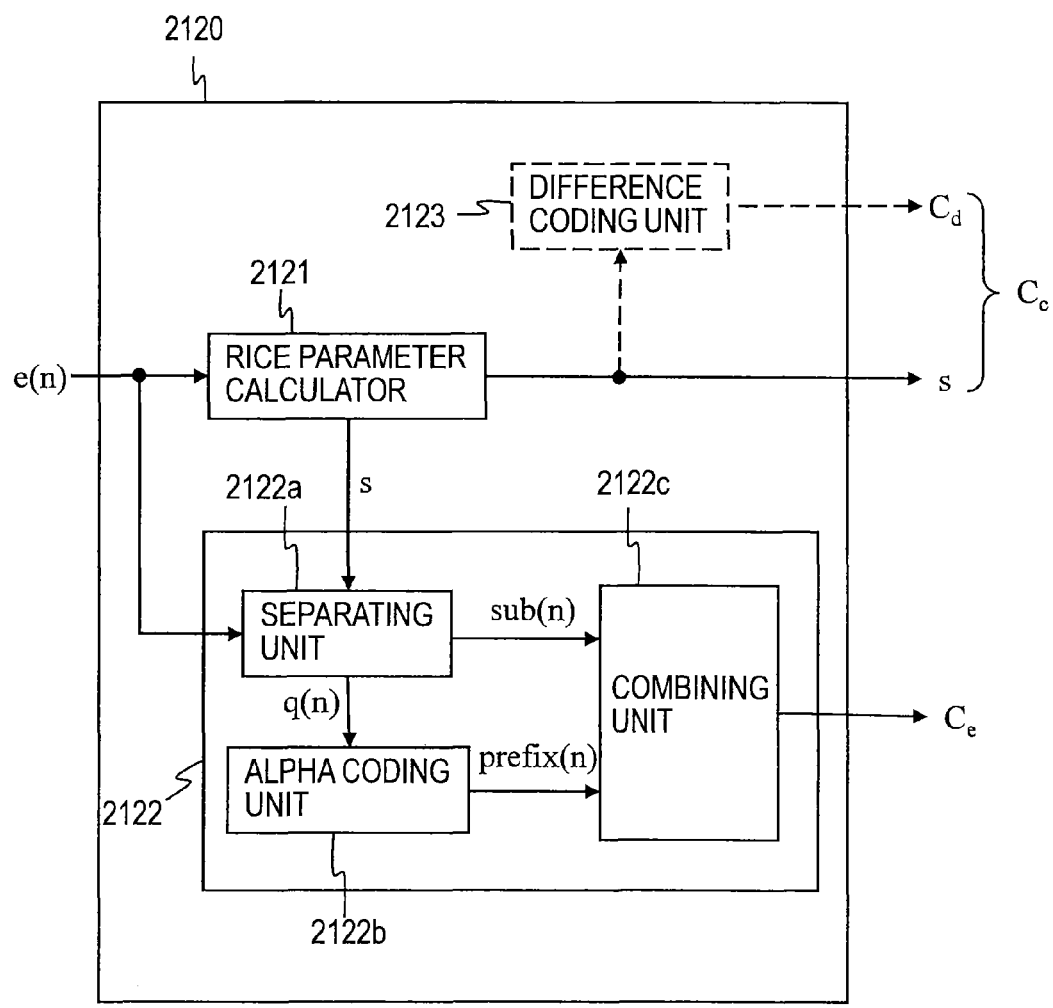
FIG. 2 is a block diagram for illustrating a functional configuration of a residual coding unit shown in FIG. 1.
Figure 3:
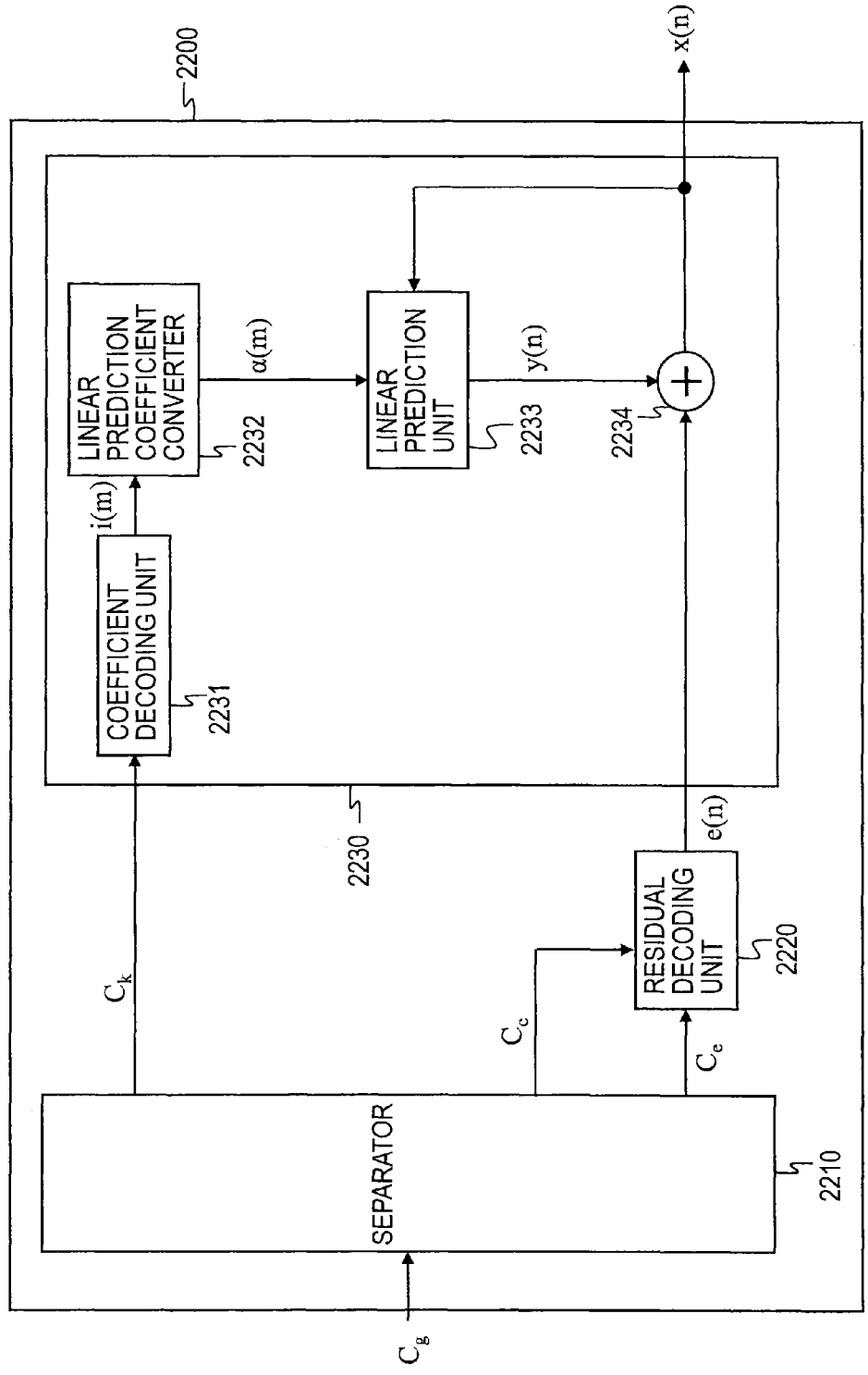
FIG. 3 is a block diagram for illustrating a functional configuration of a decoder based on the conventional lossless compression encoding scheme.
Figure 4:
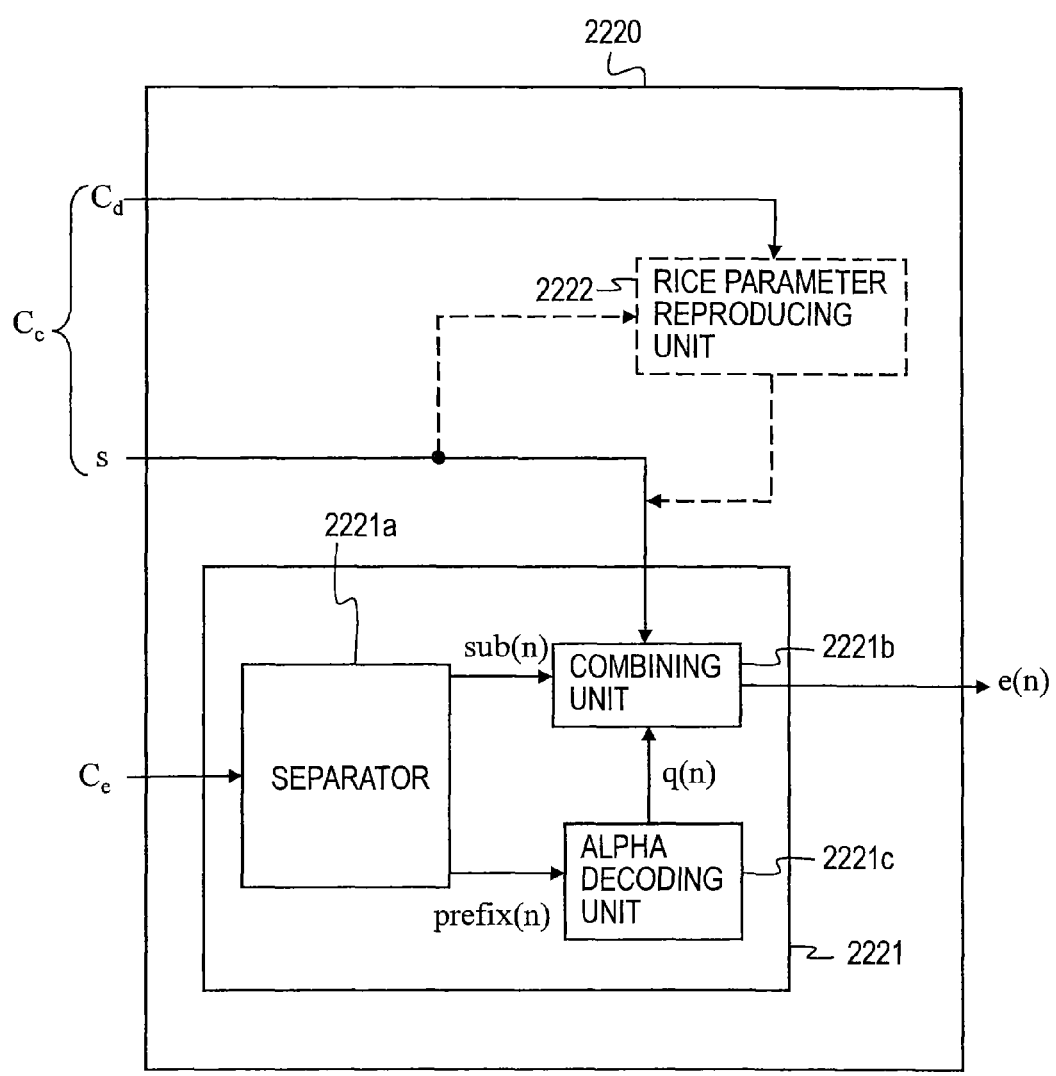
FIG. 4 is a block diagram for illustrating a functional configuration of a residual decoding unit shown in FIG. 3.

A principle will be first described, and then specific embodiments will be described.

[Principle]

When the prediction residuals e(n) (n=0, . . . , N−1) are obtained by prediction analysis, such as linear prediction analysis, a long-term prediction analysis and a multi-channel prediction analysis, of time-series signals x(n) (n=0, . . . , N−1), such as acoustic signals, video information, biological signals and seismic signals, the magnitude of the prediction residuals e(n) is biased to a certain extent. The examples of the "magnitude" corresponding to the prediction residuals e(n) are the amplitude, the absolute value or the energy corresponding to the prediction residuals. The present embodiments take advantage of this property for variable length coding of side information, which is information corresponding to a separation parameter s and/or a quotient code table index h. A principle of this process will be described below.

(Bias of Distribution of Frequency of Separation Parameters)

The present embodiments are based on the assumption that prediction residuals e(n) (n=0, . . . , N−1) expressed by integers resulting from prediction analysis of time-series signals x(n) (n=0, . . . , N−1) are coded by the Golomb-Rice coding or a modification thereof. More specifically, according to the present embodiments, prediction analysis of time-series signals x(n) (n=0, . . . , N−1) is performed to generate prediction residuals e(n) (n=0, . . . , N−1) expressed by integers. An integer separation parameter corresponding to the magnitude of the prediction residuals e(n) is set for each certain time segment. Then, a residual code corresponding to the prediction residuals e(n) that includes first information and second information is generated, the first information identifying integer quotients q(n) obtained by dividing the prediction residuals e(n) or integers equal to or greater than 0 corresponding to monotonically increasing function values of the prediction residuals e(n) by the separation parameter set for the time segment to which the prediction residuals e(n) belong or a mapped value of the separation parameter, respectively, and the second information identifying the remainders of the division. The second information is a concept that includes null. That is, the second information can be null for a particular remainder.

The quotients q(n) decrease and are biased toward 0 as the divisor increases, and extend over a wider range depending on the magnitude of the dividends as the divisor decreases. To the contrary, the remainders for the quotients q(n) are more significantly biased to smaller values as the divisor decreases, and are less significantly biased and extend over a wider range as the divisor increases. That is, as the divisor increases, the amount of the first information that identifies the quotients q(n) tends to decrease, but the amount of the second information that identifies the remainders tends to increase. To reduce the code amount of the residual code corresponding to the prediction residuals e(n), an appropriate divisor has to be used depending on the magnitude of the prediction residuals e(n). In other words, an appropriate separation parameter has to be used depending on the magnitude of the prediction residuals e(n). Such a separation parameter depends on the magnitude of the prediction residuals e(n). Since the magnitude of the prediction residuals e(n) is biased, the frequency distribution of the separation parameters are also biased (Property 1).

This property will be described with regard to a case where the separation parameter is a Rice parameter of the Golomb-Rice coding.

In the Golomb-Rice coding, for example, a residual code corresponding to the prediction residuals e(n) is generated as described below. In the description below, prefix(n) denotes the first information obtained by variable length coding of the quotient q(n), sub(n) denotes the second information that identifies the remainder, the character s denotes the separation parameter (Rice parameter in this example), and floor(x) denotes a maximum integer equal to or smaller than x.

If the separation parameter s>0, the quotient q(n) is generated as follows.

$$q(n)=\text{floor}(e(n)/2^{s-1}) \text{ (for } e(n) \geq 0) \quad (5)$$

$$q(n)=\text{floor}\{(-e(n)-1)/2^{s-1}\} \text{ (for } e(n) < 0) \quad (6)$$

If the separation parameter s=0, the quotient q(n) is generated as follows.

$$q(n)=2 \cdot e(n) \text{ (for } e(n) \geq 0) \quad (7)$$

$$q(n)=-2 \cdot e(n)-1 \text{ (for } e(n) < 0) \quad (8)$$

If the separation parameter s>0, the second information sub(n) that identifies the remainder is determined as follows.

$$\text{sub}(n)=e(n)-2^{s-1} \cdot q(n)+2^{s-1} \text{ (for } e(n) \geq 0) \quad (9)$$

$$\text{sub}(n)=(-e(n)-1)-2^{s-1} \cdot q(n) \text{ (for } e(n)<0) \quad (10)$$

If the separation parameter s=0, the second information sub(n) that identifies the remainder is null (sub(n)=null).

The separation parameter s is an integer that minimizes the total code amount of the code corresponding to the prediction residuals e(n) in a certain time segment. For example, an integer that minimizes the total code amount of the code corresponding to the prediction residuals e(n) in each frame may be the separation parameter s for the frame, or an integer that minimizes the total code amount of the code corresponding to the prediction residuals e(n) in each sub-frame may be the separation parameter s for the sub-frame. In the following, there will be described a case where an integer that minimizes the total code amount of the code corresponding to the prediction residuals e(n) in each frame is the separation parameter s for the frame.

The formulas (5) to (8) can be generalized as follows to express the quotient q(n). In the formula, the expression $|*|$ denotes the absolute value of "*".

$$q(n) = \text{floor}\{(2 \cdot |e(n)| - z) 2^s\} \quad (z = 0 \text{ or } 1 \text{ or } 2) \quad (11)$$

In the case of the Golomb-Rice coding, prefix(n) is an Alpha code of the quotient q(n), and the code length of the Alpha code is expressed as follows based on the formula (11).

$$\text{floor}\{(2 \cdot |e(n)| - z) 2^s\} + 1 \quad (12)$$

In the case of the Golomb-Rice coding, the second information sub(n) that identifies the remainder of the formulas (9) and (10) is expressed by s bits. Therefore, the code length C(s, e(n), N) of the Golomb-Rice code for one frame (N samples) is expressed as follows:

$$C(s, e(n), N) = \sum_{n=0}^{N-1} [\text{floor}\{(2 \cdot |e(n)| - z) / 2^s\} + 1 + s] \quad (13)$$

where $\text{floor}\{(2 \cdot |e(n)| - z) 2^s\} = \{(2 \cdot |e(n)| - z) / 2^s\}$, and the formula (13) can be approximated as follows.

$$C(s, e(n), N) = 2^{-s}(2 \cdot D - z \cdot N) + (1 + s) \cdot N \quad (14)$$

$$D = \sum_{n=0}^{N-1} |e(n)|$$

The value s that makes the partial differential of the formula (14) with respect to s equal to 0 is determined as follows. The value s minimizes the total code amount of the code corresponding to the prediction residuals e(n) (n=0, ..., N−1) in one frame.

$$s = \log_2\{\ln 2 \cdot (2 \cdot D/N - z)\} \quad (15)$$

If D/N is sufficiently greater than z, this formula can be approximated as follows.

$$s = \log_2\{\ln 2 \cdot (2 \cdot D/N)\} \quad (16)$$

The value s provided by the formula (16) is a continuous value that is not always an integer, and thus, the value s provided by the formula (16) is quantized to an integer, and the integer is regarded as the separation parameter s.

As can be seen from the formula (16), the separation parameter s depends on the magnitude of the prediction residuals e(n), and the value of the separation parameter s corresponds to a weakly monotonically increasing function value of the magnitude of the prediction residuals e(n). The frequency distribution of the separation parameters s is biased.

Figure 5A:
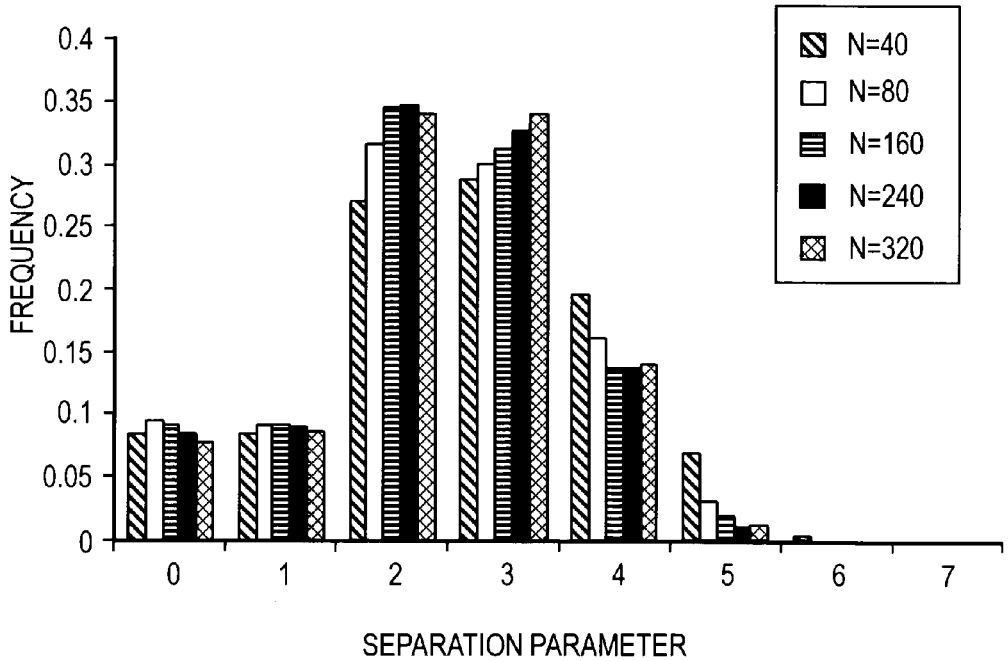
FIG. 5A shows exemplary frequency distributions of separation parameters (Rice parameters) in the Golomb-Rice coding.

FIG. 5A shows exemplary frequency distributions of the separation parameters (Rice parameters) in the Golomb-Rice coding. In FIG. 5A, the abscissa indicates the separation parameter s, and the ordinate indicates the frequency of separation parameter s when N=40, 80, 160, 240 and 320. The frequency of the separation parameter in each case indicated on the ordinate is normalized to 1. FIG. 5A shows frequency distributions of separation parameters s calculated when the dividends that are the prediction residuals e(n) obtained by linear prediction analysis of acoustic signals or integers equal to or greater than 0 that monotonically increase with the magnitude of the prediction residuals e(n) are integers equal to or greater than 0 and smaller than $2^8$. If each of the dividends is an integer equal to or greater than 0 and smaller than $2^8$ (expressed by 8 bits), and each of the divisor is $2^s$, each of the separation parameters s assumes an integer value equal to or greater than 0 and equal to or smaller than 7. As shown in FIG. 5A, the frequency distribution of the separation parameters s are biased.

(Relationship Between Prediction Gain and Frequency Distribution of Separation Parameters)

There is a correlation between the frequency distribution of the separation parameters s and a prediction gain pg.

The prediction gain pg is a ratio of the energy corresponding to the time-series signals x(n) to the energy corresponding to the prediction residuals e(n) obtained by prediction analysis of the time-series signals x(n) (the prediction gain pg=the energy corresponding to the time-series signals x(n)/the energy corresponding to the prediction residuals e(n)). For example, the prediction gain pg is the ratio of the energy corresponding to the time-series signals x(n) in a certain time segment to the energy corresponding to the prediction residuals e(n) in the time segment. The energy E(0) corresponding to the time-series signals x(n) in one frame (n=0, ..., N−1) is expressed by the following formula.

$$E(0) = \sum_{n=0}^{N-1} \{x(n)\}^2 \quad (17)$$

The energy E(M) corresponding to the prediction residuals e(n) for the one frame (n=0, ..., N−1) obtained by M-th-order linear prediction analysis of the one frame of time-series signals x(n) (n=0, ..., N−1) is expressed by the following formula using first-order to M-th-order PARCOR coefficients k(m) (m=1, 2, ..., M).

$$E(M) = E(0) \prod_{m=1}^{M} \{1 - k(m)^2\} \quad (18)$$

Thus, the prediction gain pg for the M-th-order linear prediction analysis of the one frame of time-series signals x(n) (n=0, ..., N−1) is expressed by the following formula.

$$pg = E(0)/E(M) = \frac{1}{\prod_{m=1}^{M} \{1 - k(m)^2\}} \quad (19)$$

As can be seen from the definition of the prediction gain pg described above, the prediction gain pg is an indicator of the effectiveness of the prediction analysis (an index representing the effectiveness of the prediction of the time-series signals x(n)). If the prediction analysis works effectively, the ratio of the energy corresponding to the prediction residuals e(n) to the energy corresponding to the time-series signals x(n) is small, and therefore, the prediction gain pg, which is the inverse of the ratio, is high. On the other hand, if the prediction analysis does not work effectively, the ratio of the energy corresponding to the prediction residuals e(n) to the energy corresponding to the time-series signals x(n) is large, and therefore, the prediction gain pg, which is the inverse of the ratio, is low.

In general, prediction analysis cannot be effectively performed for time-series signals x(n) that have low autocorrelation, such as noise. If the input time-series signals x(n) have low magnitude, the time-series signals x(n) are likely to be signals having low autocorrelation, such as noise. Prediction analysis cannot be effectively performed for such time-series signals x(n), and the prediction gain pg is likely to be low. In this case, since the time-series signals x(n) have low magnitude, the prediction residuals e(n) also have low magnitude, and the prediction gains pg tend to be widely distributed.

To the contrary, if the input time-series signals x(n) have high magnitude, the time-series signals x(n) are likely to be signals having high autocorrelation, such as audio signals. Prediction analysis can be effectively performed for such time-series signals x(n), and the prediction gain pg is likely to be high. In this case, since the time-series signals x(n) have high magnitude, the prediction residuals e(n) also have high magnitude, and the prediction gains pg tend to be narrowly distributed.

That is, as the prediction gain pg increases, the prediction residuals e(n) have larger magnitude and are more narrowly distributed. On the other hand, as the prediction gain pg decreases, the prediction residuals e(n) have smaller magnitude and are more widely distributed. Since each of the separation parameters s depends on the magnitude of the prediction residuals e(n), the separation parameters s become greater and more narrowly distributed as the prediction gain pg increases, and become smaller and more widely distributed as the prediction gain pg decreases. In short, there is a correlation between the prediction gain pg and the frequency distribution of the separation parameters s (Property 2).

Furthermore, the prediction gain pg is correlated with a coefficient (a linear prediction coefficient or a gain) of a prediction filter, such as a liner prediction filter and a long-term prediction filter, or a coefficient that can be converted to that coefficient (the PARCOR coefficient, for example) (see formulas (1) to (4)). Thus, there is a correlation between a coefficient of the prediction filter or a coefficient that can be converted to the coefficient of the prediction filter and the frequency distribution of the separation parameters s (Property 3). In general, the separation parameters s become greater and are more narrowly distributed as the coefficient of the prediction filter or the coefficient that can be converted to the coefficient of the prediction filter become greater, and become smaller and are more widely distributed as the coefficient of the prediction filter or the coefficient that can be converted to the coefficient of the prediction filter becomes smaller.

Figure 6A:
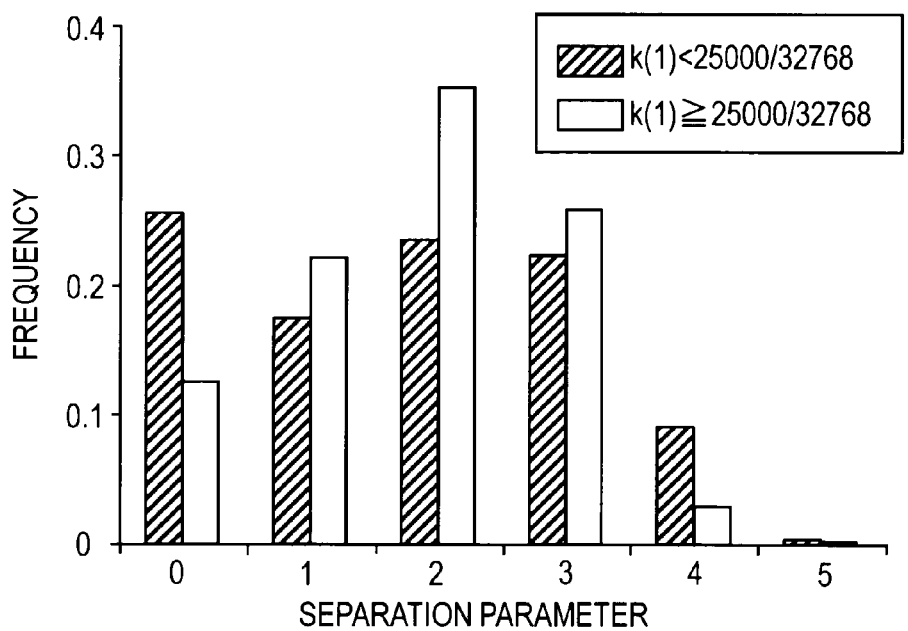
FIG. 6A shows exemplary frequency distributions of the separation parameters (Rice parameters) in the Golomb-Rice coding.

FIG. 6A shows exemplary frequency distributions of the separation parameters (Rice parameters) s in the Golomb-Rice coding. In FIG. 6A, the abscissa indicates the separation parameter s, and the ordinate indicates the frequency of separation parameter s when the first-order PARCOR coefficient k(1)≥25000/32768 and k(1)<25000/32768. The frequency of the separation parameter s in each case indicated on the ordinate is normalized to 1. FIG. 6A shows frequency distributions of separation parameters s calculated when the dividends that are the prediction residuals e(n) obtained by linear prediction analysis of acoustic signals or integers equal to or greater than 0 that monotonically increase with the absolute values of the prediction residuals e(n) are integer equals to or greater than 0 and smaller than $2^8$.

As shown in FIG. 6A, the separation parameters s become greater and are more narrowly distributed as the first-order PARCOR coefficient k(1) becomes greater (the prediction gain pg becomes higher), and become smaller and are more widely distributed as the first-order PARCOR coefficient k(1) becomes smaller (the prediction gain pg becomes smaller).

There is a method that uses different types of coding methods based on different types of prediction analyses for different frames or sub-frames and selects one of the resulting codes that has the lowest code amount as the final code. In this case, there is a correlation between the type of the prediction analysis corresponding to the final code and the prediction gain pg, and there is a correlation between the type of the prediction analysis and the frequency distribution of the separation parameters s (Property 4).

For example, suppose that a scheme 1 that encodes first prediction residuals $e_S(n)$ generated only the linear prediction analysis (short-term prediction analysis) and a scheme 2 that performs encodes second prediction residuals $e_L(n)$ generated by long-term prediction analysis of the first prediction residuals $e_S(n)$ generated by linear prediction analysis (short-term prediction analysis) are used, and either of the resulting codes that has a smaller final code amount is selected.

The scheme 1 involves only the linear prediction analysis (short-term prediction analysis), and therefore, the resulting code includes a coefficient code corresponding to coefficients, such as PARCOR coefficients, related to the linear prediction analysis (short-term prediction analysis), a residual code corresponding to the prediction residuals, a complementary code corresponding to the side information, and a code indicating the type of the prediction analysis. The scheme 2 involves the linear prediction analysis (short-term prediction analysis) and the long-term prediction analysis, the resulting code includes a code corresponding to the gains and the delay values related to the long-term prediction analysis in addition to the codes listed above. However, if the prediction analysis can be performed effectively, the code amount of the residual code can be smaller in the scheme 2 than in the scheme 1. Therefore, if the prediction analysis can be performed effectively, the total code amount may be smaller in the scheme 2 than in the scheme 1. In other words, if the prediction effectiveness of the time-series signals x(n) is high, the total code amount can be smaller in the scheme 2 than in the scheme 1. If the prediction effectiveness of the time-series signals x(n) is low, the total code amount is larger in the scheme 2 than in the scheme 1.

The scheme 1 is selected when the effectiveness of the long-term prediction analysis is low although the linear prediction analysis (short-term prediction analysis) is effective. The scheme 2 is selected when the effectiveness of both the linear prediction analysis (short-term prediction analysis) and the long-term prediction analysis is high. The prediction gain that is calculated by performing both the linear prediction analysis (short-term prediction analysis) and the long-term prediction analysis are performed, which is the prediction gain in a wider sense, tends to be higher in the case where the scheme 2 is selected than in the case where the scheme 1 is selected.

When the prediction gain in a wider sense is high, the input time-series signals x(n) are likely to be active audio signals. In this case, the amplitude of the input time-series signals x(n) is also large, and accordingly, the prediction residuals e(n) tend to have larger amplitude and be narrowly distributed. When the prediction gain pg in a wider sense is low, the input time-series signals x(n) are likely not to include active audio signals or be non-active speech signals (corresponding to voice without vibration of the vocal cord). In this case, the amplitude of the input time-series signals x(n) is also small, and accordingly, the prediction residuals e(n) tend to have smaller amplitudes and be widely distributed.

Since each of the separation parameters s depends on the magnitude of the prediction residuals e(n), the frequency distribution of the separation parameters s are correlated with the scheme selected, that is, the type of the prediction analysis selected. For example, as described above, when the scheme 2 is selected, the prediction residuals e(n) tend to be greater and more narrowly distributed than when the scheme 1 is selected. Therefore, the separation parameter s tends to be greater and more narrowly distributed when the scheme 2 is selected than when the scheme 1 is selected.

Figure 6B:
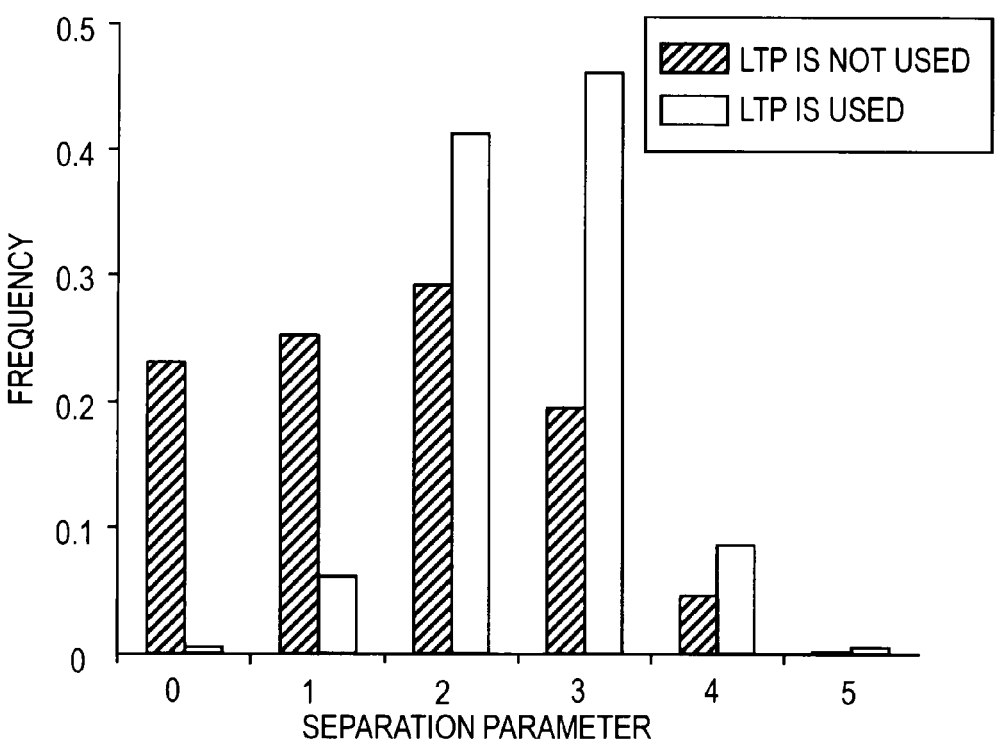
FIG. 6B shows exemplary frequency distributions of the separation parameters (Rice parameters) in the Golomb-Rice coding.

FIG. 6B shows exemplary frequency distributions of the separation parameters (Rice parameters) s in the Golomb-Rice coding. In FIG. 6B, the abscissa indicates the separation parameter s, and the ordinate indicates the frequency of separation parameter s in a case of using the scheme 1 that encodes the first prediction residuals $e_S(n)$ generated by linear prediction analysis (LTP is not used) and a case of using the scheme 2 that encodes the second prediction residuals $e_L(n)$ generated by long-term prediction analysis of the first prediction residuals $e_S(n)$ generated by linear prediction analysis (LTP is used). The frequency of the separation parameter s in each case indicated on the ordinate is normalized to 1. FIG. 6B shows frequency distributions of separation parameters s calculated when the dividends that are the prediction residuals e(n) obtained by linear prediction analysis of acoustic signals or integers equal to or greater than 0 that monotonically increase with the absolute values of the prediction residuals e(n) are integers equal to or greater than 0 and smaller than $2^8$.

As shown in FIG. 6B, the separation parameters s tend to be great and narrowly distributed when the prediction analysis in which "LTP is used" is applied, and tend to be small and widely distributed when the prediction analysis in which "LTP is not used" is applied.

A relationship similar to the relationships between the prediction gain and the frequency distribution of the separation parameters s described above holds between the prediction gain and the frequency distribution of respective portions of the bits representing the separation parameters s. Such a relationship holds between the prediction gain and the frequency distribution of the information formed by integrating each portion that is included in bits representing each of the separation parameters s for a plurality of time segments (frames or sub-frames, for example).

Figures 7A, 7B:
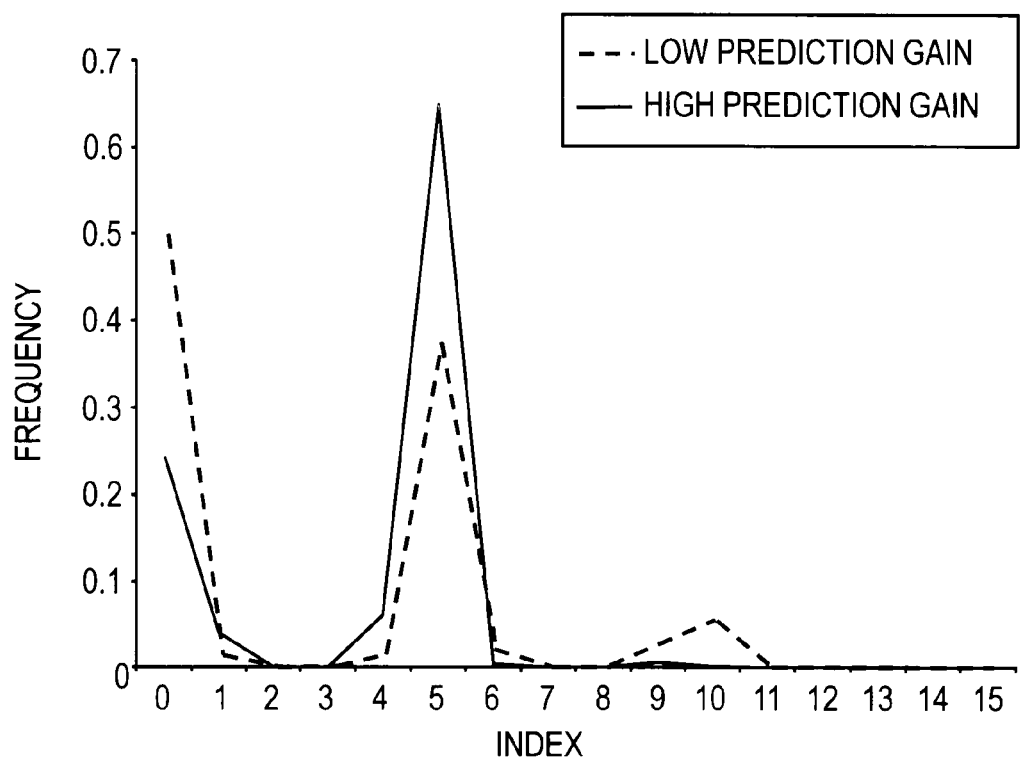
FIG. 7A shows a table that defines indices 0 to 15 that correspond to combinations of s(0) and s(1) for each frame, s(0) representing the two higher order bits of the separation parameter s for a first half sub-frame of the frame, and s(1) representing the same for a second half sub-frame of the frame.
FIG. 7B is a graph showing exemplary frequency distributions of the indices 0 to 15 defined in FIG. 7A.

FIG. 7A shows a table that defines indices 0 to 15 that correspond to combinations of s(0) and s(1), s(0) representing the two higher order bits of the separation parameter s for a first half sub-frame of a frame, and s(1) representing the same for a second half sub-frame of the frame. FIG. 7B is a graph showing exemplary frequency distributions of the indices 0 to 15 defined in FIG. 7A. In FIG. 7B, the abscissa indicates the indices 0 to 15 defined in FIG. 7A, and the ordinate indicates the frequency of combinations of s(0) and s(1) when the prediction gain pg is low and where the prediction gain pg is high. The frequency indicated on the ordinate is normalized to 1.

As shown in FIG. 7B, the combinations of s(0) and s(1) are greater in amplitude and more narrowly distributed in the case where the prediction gain pg is high than in the case where the prediction gain pg is low.

(Relationship Between Prediction Gain and Frequency Distribution of Quotient Code Table Indices)

In the Golomb-Rice coding, Alpha coding of the quotients q(n) calculated as described above (the quotients q(n) illustrated by the formulas (5) to (8), for example) is performed to generate the information prefix(n), which is a part of the code corresponding to the prediction residuals e(n). The code length of the Alpha code corresponding to each of the quotients q(n) calculated in the Golomb-Rice coding (the quotients q(n) illustrated by the formulas (5) to (8), for example) (the bit length including a stop bit) will be referred to as a Rice tail hereinafter. That is, q(n)+1 will be referred to as a Rice tail.

Figure 5B:
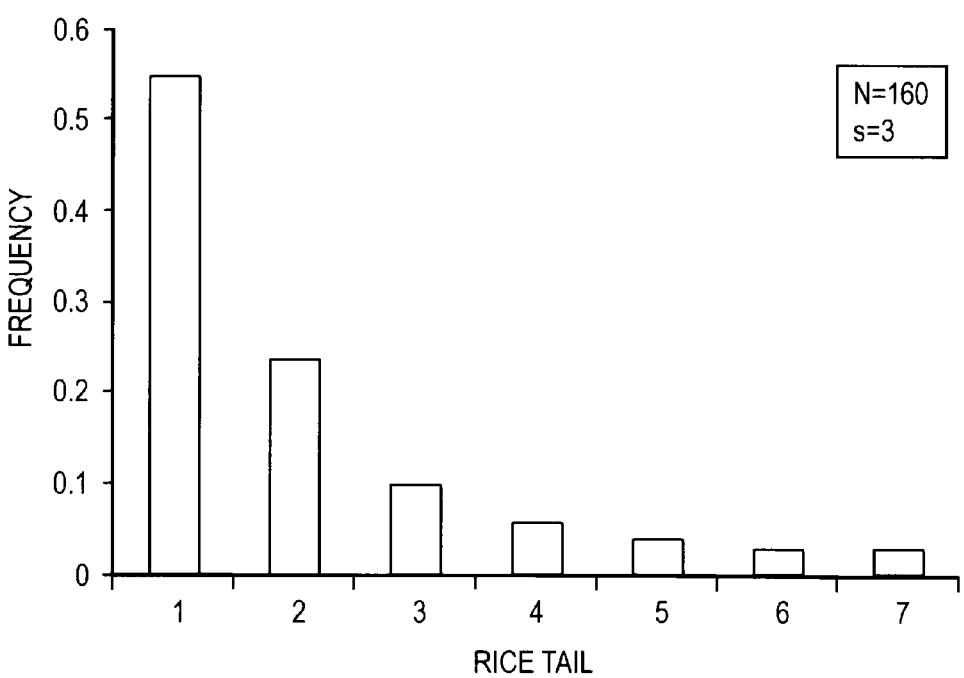
FIG. 5B shows an exemplary frequency distribution of the Rice tail.

FIG. 5B shows an exemplary frequency distribution of the Rice tails. In FIG. 5B, the abscissa indicates the Rice tail, and the ordinate indicates the frequency of the Rice tail in a case where the separation parameter s is 3. The frequency of the Rice tails indicated on the ordinate is normalized to 1.

In the Golomb-Rice coding, Alpha coding of the quotients q(n) is performed. If the integer quotients q(n) follow the Laplace distribution, Alpha coding is the optimal variable length coding method for the quotients q(n). However, if the distribution of the quotients q(n) is not the Laplace distribution, other variable length coding methods may improve the encoding compressibility. Thus, according to the embodiments, a plurality of quotient code tables for variable length coding of the quotients q(n) are prepared, and a quotient code table that minimizes the code amount is selected from among them for encoding of the quotients q(n).

Since there is a correlation among the quotients q(n), the magnitude of the prediction residuals e(n) and the separation parameter s, there is a correlation among the frequency distribution of the quotient code table indices h that identifies the quotient code tables selected for encoding of the quotients q(n), the magnitude of the prediction residuals e(n) and the separation parameter s. In addition, as described above, there is a correlation among the prediction gain pg, the magnitude of the prediction residuals e(n) and the separation parameter s, and therefore, there is a correlation between the prediction gain pg and the frequency distribution of the quotient code table indices h. More specifically, the separation parameter s is set for each discrete time segment, such as a frame, and one separation parameter s corresponds to one discrete time segment, as described above; while, each of the prediction residuals e(n) corresponds to each discrete time n. Accordingly, the frequency distribution of the quotients q(n) is more similar to the Laplace distribution as the distribution of the prediction residuals e(n) becomes narrower, and is less similar to the Laplace distribution as the distribution of the prediction residuals e(n) becomes wider. In addition, the distribution of the prediction residuals e(n) tends to be narrower as the prediction gain pg increases. Therefore, the frequency distribution of the quotients q(n) is more similar to the Laplace distribution as the prediction gain pg increases, and is less similar to the Laplace distribution as the prediction gain pg decreases. Accordingly, a quotient code table more similar to the Alpha code table for Alpha coding is more likely to be selected as the prediction gain pg increases, and a quotient code table less similar to the Alpha code table is more likely to be selected as the prediction gain pg decreases. Thus, there is a correlation between the prediction gain pg and the frequency distribution of the quotient code table indices h (property 5).

As can be seen from Property 3 described above, there is a correlation between the coefficient of the prediction filter or the coefficient that can be converted to the coefficient of the prediction filter and the frequency distribution of the quotient code table indices h (Property 6). Furthermore, as can be seen from Property 4 described above, there is a correlation between the type of the prediction analysis and the frequency distribution of the quotient code table indices h (Property 7).

(Summary of Properties)

Properties 1 to 7 described above (not known in the prior art) can be summarized as follows.

[Property 1]

The frequency distribution of the separation parameters s is biased.

[Property 2]

There is a correlation between the prediction gain pg and the frequency distribution of the separation parameters s. The separation parameters s tend to be greater and more narrowly distributed as the prediction gain pg increases, and tend to be smaller and more widely distributed as the prediction gain pg decreases.

[Property 3]

There is a correlation between a coefficient of the prediction filter or a coefficient that can be converted to the coefficient of the prediction filter and the frequency distribution of the separation parameters s.

[Property 4]

There is a correlation between the type of the prediction analysis and the prediction gain pg, and there is a correlation between the type of the prediction analysis and the frequency distribution of the separation parameters s.

[Property 5]

There is a correlation between the prediction gain pg and the frequency distribution of the quotient code table indices h. A quotient code table more similar to the Alpha code table for Alpha coding is more likely to be selected as the prediction gain pg increases, and a quotient code table less similar to the Alpha code table is more likely to be selected as the prediction gain pg decreases.

[Property 6]

There is a correlation between a coefficient of the prediction filter or a coefficient that can be converted to the coefficient of the prediction filter and the frequency distribution of the quotient code table indices h.

[Property 7]

There is a correlation between the type of the prediction analysis and the frequency distribution of the quotient code table indices h.

Method According to Present Embodiments

According to the embodiments, variable length coding, based on any of Properties 1 to 7 described above, is performed for the side information to improve the encoding compressibility of the prediction residuals e(n).

In an encoding process according to the embodiments, prediction analysis of time-series signals x(n) (n=0, ..., N−1) is performed, prediction residuals e(n) (n=0, ..., N−1) expressed by integers are generated, an integer separation parameter s that depends on the magnitude of the prediction residuals e(n) is set for each certain time segment, and a side information code table suitable for a prediction gain pg is selected from among a set of side information code tables including a side information code table used for variable length coding of the side information. According to Properties 1, 2 and 5 described above, the encoding compressibility of the side information can be reduced by selecting a side information code table suitable for the prediction gain pg. In a decoding process according to the embodiments, a coefficient code that corresponds to coefficients of a prediction filter obtained by prediction analysis of the time-series signals x(n) (n=0, ..., N−1) or coefficients that can be converted to the coefficients of the prediction filter is decoded, and a side information code table suitable for the prediction gain is selected by using the coefficient of the prediction filter or the coefficient that can be converted to the coefficient of the prediction filter, from among a set of side information code tables, which are code tables used for decoding of a complementary code corresponding to side information. The coefficient code that corresponds to the coefficient of the prediction filter or the coefficient that can be converted to the coefficient the coefficient of the prediction filter is essentially included in the code obtained by prediction analysis of the time-series signals x(n) (n=0, ..., N−1) but not additional information for decoding of a code according to the embodiments.

The side information corresponds to the separation parameter s and/or the quotient code table index h. For example, the side information includes at least a part of the corresponding separation parameter s and/or the quotient code table index h. For example, the side information may be information including the separation parameter s and/or the quotient code table index h, information including a part of the separation parameter s and/or a part of the quotient code table index h, information including the separation parameters s and/or the quotient code table indices h for a plurality of sub-frames that constitutes a frame, or information including each portion that is included in the bits representing each of the separation parameters s and/or each portion that is included in the bits representing each of the quotient code table indices h for a plurality of sub-frames.

The quotient code table index h is an index that identifies a quotient code table, which is a code table used for variable length coding of integer quotients. The quotients are obtained by dividing the prediction residuals e(n) or integers equal to or greater than 0 that correspond to monotonically increasing function values of the magnitude of the prediction residuals e(n) by integers that depends on the separation parameter s set for the time segment to which the prediction residuals e(n) belong, respectively. The separation parameter s is an integer that corresponds to a weakly monotonically increasing (monotonically non-decreasing) function value of the magnitude of the prediction residuals e(n), and the divisor is an integer that corresponds to a monotonically increasing function value of the separation parameter s, for example. Alternatively, the separation parameter s may be an integer that corresponds to a monotonically non-increasing function value of the prediction residuals e(n), and the divisor may be an integer that corresponds to a monotonically decreasing function value of the separation parameter s. For example, the separation parameter s is an integer that weakly monotonically increases with the average amplitude of the prediction residuals e(n) in a certain time segment, and the divisor is an integer that monotonically increases with the separation parameter s. Alternatively, the separation parameter s is an integer that monotonically non-increases with the average amplitude of the prediction residuals e(n) in a certain time segment, and the divisor is an integer that monotonically increases as the separation parameter s decreases. More specifically, the separation parameter s is a Rice parameter in the Golomb-Rice coding, a mapped value thereof or an integer that minimizes the total code amount of the code corresponding to the prediction residuals e(n) in a predetermined time segment, and the divisor is 2 to the power of the separation parameter s or a value corresponding to the mapped value of the separation parameter s. The mapped value of the Rice parameter is the sum of the Rice parameter and a positive or negative integer constant, for example. If an encoding method other than the Alpha coding can be used for encoding the quotients q(n), the separation parameter s is preferably the sum of the Rice parameter and a negative integer constant (−1, for example). The concept "minimization of a value" includes not only minimizing the value in a strict sense but also making the value approximate to the minimum value and reducing the value to be equal to or smaller than, or to be smaller than, a predetermined threshold. The variable length coding may be the Alpha coding, the Delta coding, the Huffman coding, the Golomb-Rice coding, the Golomb coding or other entropy coding.

The index used for selecting the side information code table suitable for the prediction gain pg may be the prediction gain pg itself or the coefficient of the prediction filter obtained by prediction analysis of the time-series signals x(n) (n=0, . . . , N−1) or the coefficient that can be converted to the coefficient of the prediction filter. According to Properties 3 and 6, such an index can be used for selecting the side information code table suitable for the prediction gain pg. When the coefficient of the prediction filter or the coefficient that can be converted to the coefficient of the prediction filter is used as the index, the coefficient of the prediction filter or the coefficient that can be converted to the coefficient of the prediction filter may be used for determination processing, such as a threshold determination, or a quantized value of the coefficient of the prediction filter or the coefficient that can be converted to the coefficient of the prediction filter may be used for the determination processing. Information used for estimating the prediction gain pg may be used for selecting the side information code table. That is, the side information code table may be selected based on a determination criterion for determining information corresponding to the prediction gain pg or the information used for estimating the prediction gain pg (a determination criterion for determining information corresponding to the prediction gain pg or the information used for estimating the prediction gain pg).

Different side information code tables may be selected for different types of prediction analysis. That is, the side information code table depending on a type of the selected prediction analysis scheme may be selected based on the type of the prediction analysis as an index. According to Properties 4 and 7, the side information code table suitable for the prediction gain pg can be selected based on the type of the prediction analysis as an index. In this case information that indicates the type of the prediction analysis has to be added to the code as additional information. In the decoding processing, the type of the prediction analysis is identified based on the additional information, and a side information code table depending on the information indicating the type of the prediction analysis is selected from among different side information code tables.

When the side information corresponds to at least the separation parameter s, and the side information code table is a code table in which the side information and the code assigned to the side information are associated with each other, the amplitude of the separation parameter s that corresponds to the side information associated with a code having the shortest code length in a first side information code table is equal to or smaller than the amplitude of the separation parameter s that corresponds to the side information associated with a code having the shortest code length in a second side information code table, where the first side information code table is the side information code table selected when the prediction gain pg is a first value, and the second side information code table is the side information code table selected when the prediction gain pg is a second value greater than the first value. This is based on Property 2: the separation parameters s tend to be greater and more narrowly distributed as the prediction gain pg increases, and tend to be smaller and more widely distributed as the prediction gain pg decreases.

When the side information corresponds to at least the quotient code table index h, the quotient code table identified by the quotient code table index h corresponding to the side information associated with the code having the shortest code length in the second side information code table is more similar to the Alpha code table used for Alpha coding than the quotient code table identified by the quotient code table index h corresponding to the side information associated with the code having the shortest code length in the first side information code table. This is based on Property 5: a quotient code table more similar to the Alpha code table for Alpha coding is more likely to be selected as the prediction gain pg increases, and a quotient code table less similar to the Alpha code table is more likely to be selected as the prediction gain pg decreases. The Alpha code table and the quotient code table are code tables in which quotients and codes assigned to the quotients are associated with each other, respectively. The quotient code table is more similar to the Alpha code table as the total sum of (bu(k)−bx(k))(fu(k)−fx(k)) with respect to k expressed by the following formula decreases:

$$E=\Sigma_k(bu(k)-bx(k))(fu(k)-fx(k)) \quad (20)$$

where the bit length of the code associated with a quotient k in the Alpha code table is represented by bu(k), the bit length of the code associated with the quotient k in a certain quotient code table is represented by bx(k), $fu(k)=0.5^{bu(k)}$, and $fx(k)=0.5^{bx(k)}$.

In the encoding processing, the quotient code table suitable for the prediction gain may be selected from a set of quotient code tables. In this case, the side information corresponds to the quotient code table index that identifies the quotient code table suitable for the prediction gain. The index used for selecting the quotient code table suitable for the prediction gain pg may be the prediction gain pg itself or the coefficient of the prediction filter obtained by prediction analysis of the time-series signals x(n) (n=0, . . . , N−1) or the coefficient that can be converted to the coefficient of the prediction filter. That is, the quotient code table may be selected based on a determination criterion for determining information corresponding to the prediction gain pg or information used for estimating the prediction gain pg. According to Property 6, the quotient code table suitable for the prediction gain pg can be selected based on such an index. Different quotient code tables may be selected for different types of prediction analysis. According to Property 7 described above, the quotient code table suitable for the prediction gain pg can be selected based on the type of the prediction gain as an index. When different quotient code tables are selected for different types of prediction analysis in the encoding processing, information that indicates the type of the prediction analysis has to be added to the code as additional information. In the decoding processing, the type of the prediction analysis is identified based on the additional information, and a quotient code table depending on the information that indicates the type of the prediction analysis from among different quotient code tables.

The side information may be generated for each time segment, such as a frame and a sub-frame, or generated for each set of a plurality of time segments. For example, the side information may correspond to integrated information of the separation parameters s set for a plurality of time segments. Alternatively, the quotient code table may be selected for each time segment, and the side information may correspond to integrated information of the quotient code table indices that identify the quotient code tables selected for a plurality of time segments. Alternatively, the side information may include information formed by integrating each portion that is included in bits representing each of the separation parameters set for a plurality of time segments. Alternatively, the side information may include information formed by integrating each portion that is included in bits representing each of the quotient code table indices for a plurality of time segments.

First Embodiment

Next, a first embodiment of the present invention will be described.

(Configuration)

Figure 8:
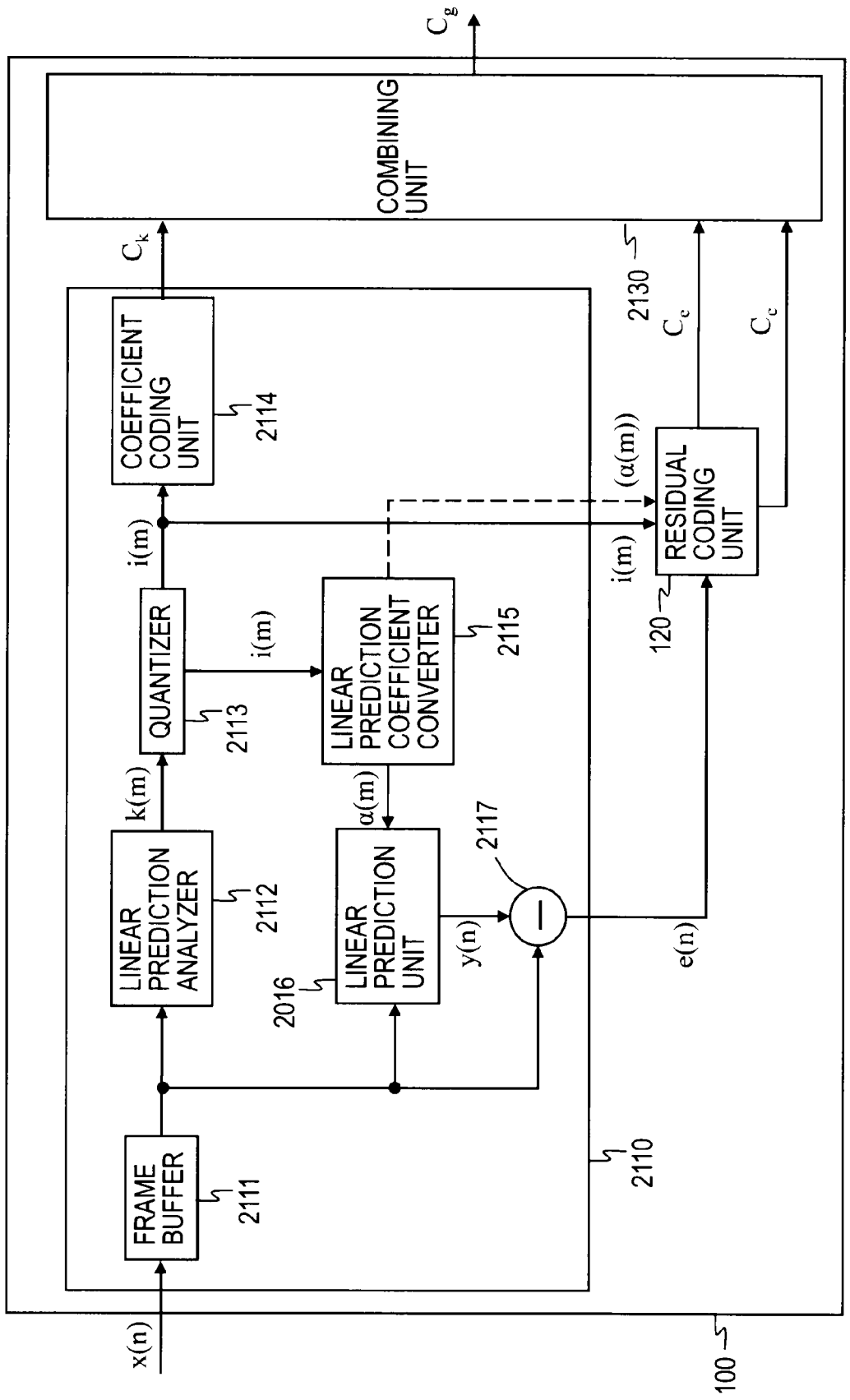
FIG. 8 is a block diagram for illustrating a functional configuration of an encoder according to a first embodiment.
Figure 9:
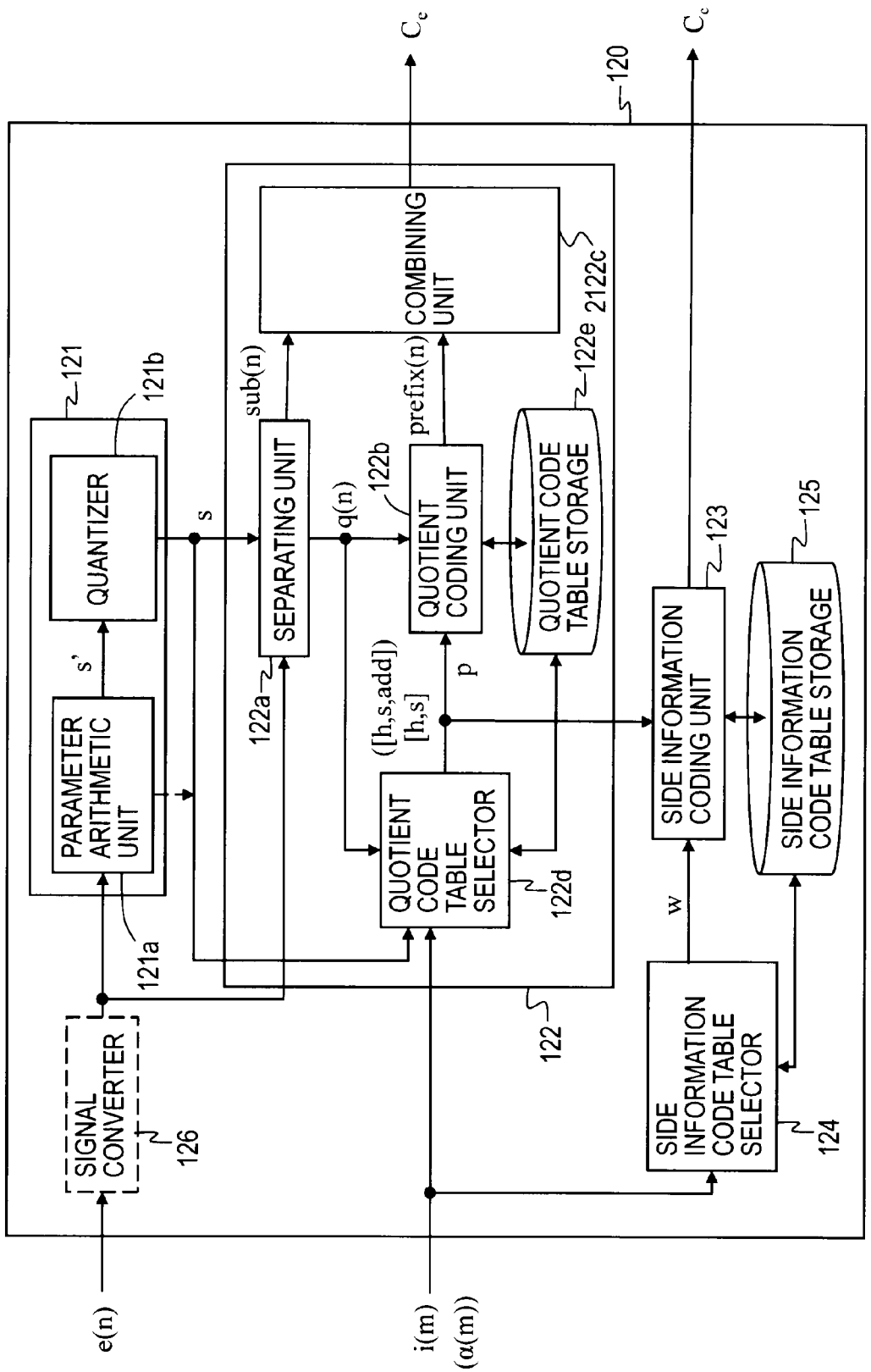
FIG. 9 is a block diagram for illustrating a functional configuration of a residual coding unit shown in FIG. 8.
Figure 10:
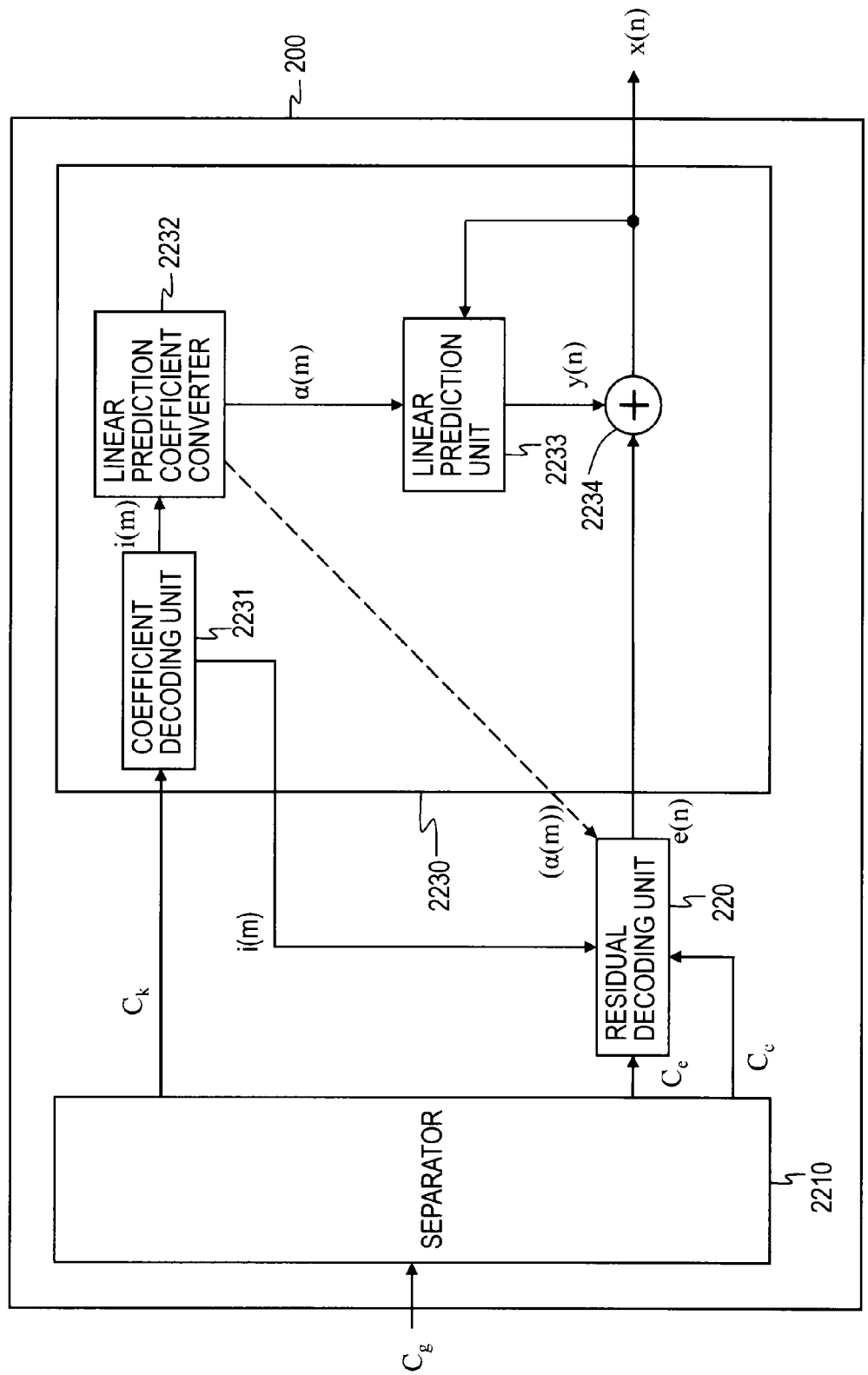
FIG. 10 is a block diagram for illustrating a functional configuration of a decoder according to the first embodiment.
Figure 11:
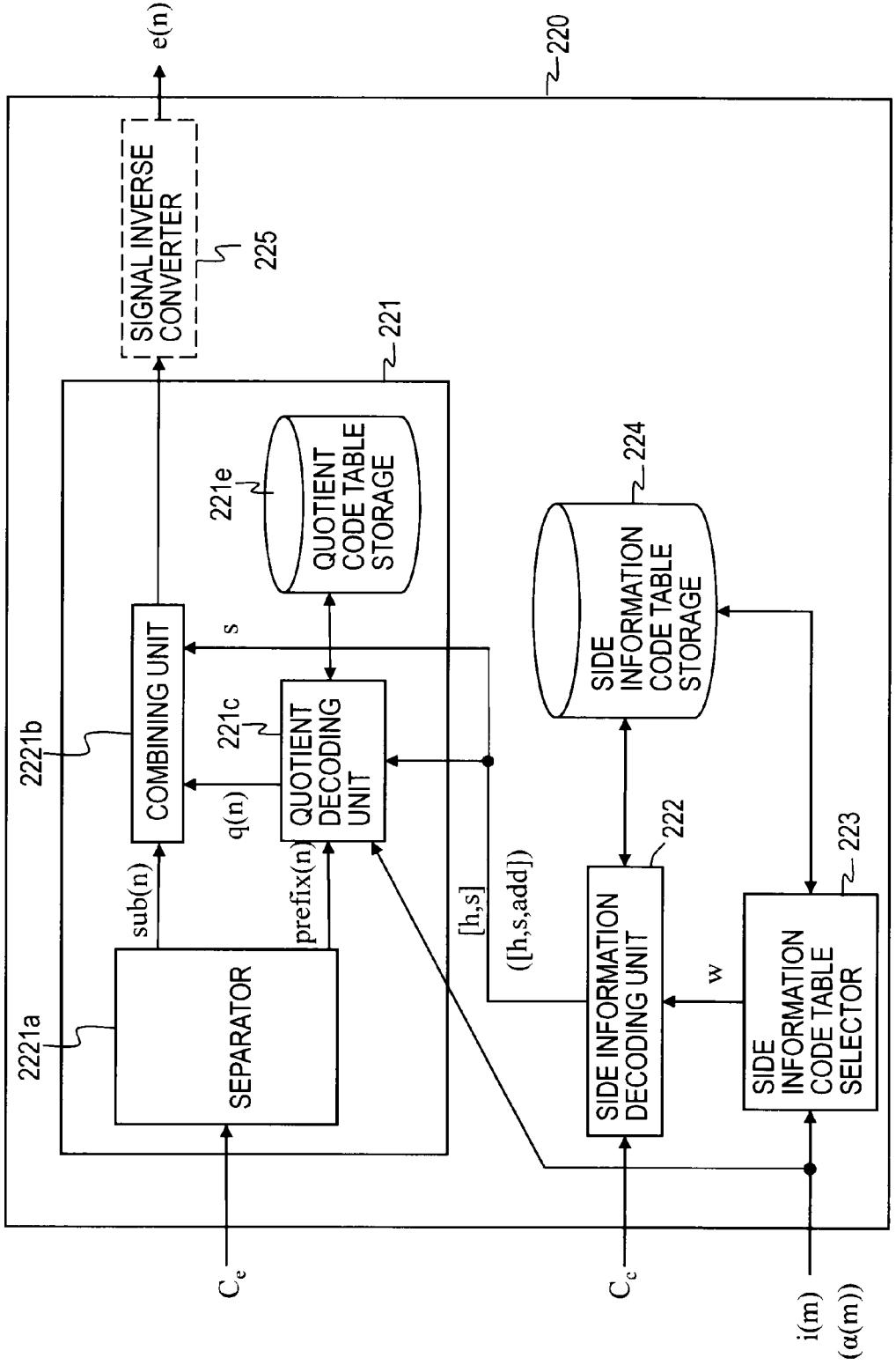
FIG. 11 is a block diagram for illustrating a functional configuration of a residual decoding unit shown in FIG. 10.

FIG. 8 is a block diagram for illustrating a functional configuration of an encoder 100 according to the first embodiment, and FIG. 9 is a block diagram for illustrating a functional configuration of a residual coding unit 120 shown in FIG. 8. FIG. 10 is a block diagram for illustrating a functional configuration of a decoder 200 according to the first embodiment, and FIG. 11 is a block diagram for illustrating a functional configuration of a residual decoding unit 220 shown in FIG. 10. In these drawings, the same components as those shown in FIGS. 1 to 4 are denoted by the same reference numerals as those in FIGS. 1 to 4, and descriptions thereof will be omitted.

As shown in FIG. 8, the encoder 100 according to this embodiment has a prediction coding unit 2110, the residual coding unit 120, and a combining unit 2130. As shown in FIG. 9, the residual coding unit 120 has a separation parameter setting unit 121, a coding unit 122, a side information coding unit 123, a side information code table selector 124, and a side information code table storage 125. The separation parameter setting unit 121 has a parameter arithmetic unit 121*a* and a quantizer 121*b*, and the coding unit 122 has a separating unit 122*a*, a combining unit 2122*c*, a quotient coding unit 122*b*, a quotient code table selector 122*d*, and a quotient code table storage 122*e*.

As shown in FIG. 10, the decoder 200 according to this embodiment has a separator 2210, the residual decoding unit 220, and a prediction decoding unit 2230. As shown in FIG. 11, the residual decoding unit 220 has a decoding unit 221, a side information decoding unit 222, a side information code table selector 223, and a side information code table storage 224. The decoding unit 221 has a separator 2221*a*, a combining unit 2221*b*, a quotient decoding unit 221*c*, and a quotient code table storage 221*e*.

The encoder 100 and the decoder 200 according to this embodiment are a particular apparatus formed by a well-known computer or a dedicated computer that has a central processing unit (CPU), a random-access memory (RAM) and a read-only memory (ROM), for example, and is loaded with a predetermined program, which is executed by the CPU. A frame buffer 2111 and the quotient code table storages 122*e* and 221*e* are memories, such as a RAM, a cache memory and a register, and the other processing units are each implemented by the CPU executing a predetermined program. At least a part of these processing units may be formed by an electronic circuit, such as an integrated circuit. As required, the encoder 100 or the decoder 200 may additionally have a temporary memory that stores data that is output from the processing units and can be read out when the processing units perform another processing. Such implementations of the processing units apply to the other embodiments described below and modifications thereof.

(Preprocessing)

FIG. 12A is a table showing combinations of the separation parameter s and the quotient code table index h for different quotient code tables T1[h, s] stored in the quotient code table storage 122*e* of the residual coding unit 120 and the quotient code table storage 221*e* of the residual decoding unit 220. FIG. 12B is a table showing a relationship between the frequency of selection of each quotient code table T1[h, s] shown in FIG. 12A and the combination of the separation parameter s and the quotient code table index h. FIG. 13A is a table showing combinations of the separation parameter s and the quotient code table index h for different quotient code tables T2[h, s] stored in the quotient code table storage 122*e* of the residual coding unit 120 and the quotient code table storage 221*e* of the residual decoding unit 220. FIG. 13B is a table showing a relationship between the frequency of selection of each quotient code table T2[h, s] shown in FIG. 13A and the combination of the separation parameter s and the quotient code table index h. In FIGS. 12B and 13B, the character "I" indicates the highest selection frequency, the character "II" indicates the moderate selection frequency, and the character "III" indicates the lowest selection frequency. FIG. 14A shows an example of the quotient code table T1[h, s] shown in FIG. 12A. FIG. 14B shows and example of the quotient code table T2[h, s] shown in FIG. 13A. In these quotient code tables, an input value, which is to be encoded, a code corresponding to the input value, and the bit length of the code are associated with each other. FIG. 15A shows an example of a side information code table Tc[1] stored in the side information code table storage 125 of the residual coding unit 120 and the side information code table storage 224 of the residual decoding unit 220. FIG. 15B shows an example of a side information code table Tc[2] stored in the side information code table storage 125 of the residual coding unit 120 and the side information code table storage 224 of the residual decoding unit 220. In these side information code tables, an input value, which is to be encoded, and a code corresponding to the input value are associated with each other. A preprocessing according to this embodiment will be described below with reference to these drawings.

[Quotient Code Table]

According to this embodiment, as a preprocessing for the encoding process and the decoding process, a plurality of sets of quotient code tables are set for different prediction gains pg. Each set of quotient code tables includes a plurality of quotient code tables for encoding of the quotients q(n). Each set of quotient code tables corresponds to a prediction gain within a certain range. In the encoding process and the decoding process according to this embodiment, a quotient code table used for encoding of the quotients q(n) is selected from a set of quotient code tables corresponding to the prediction gain pg for the time-series signals x(n). In the example of this embodiment, a set T1 of quotient code tables corresponding to the prediction gain pg that is lower than a predetermined threshold th (FIG. 12A) and a set T2 of quotient code tables corresponding to the prediction gain pg that is equal to or higher than the threshold th (FIG. 13A) are set.

Each quotient code table T1[h, s] that belongs to the set T1 of quotient code tables and each quotient code table T2[h, s] that belongs to the set T2 of quotient code tables are stored in the quotient code table storage 122*e* of the residual coding unit 120 (FIG. 9) and the quotient code table storage 221*e* of the residual decoding unit 220 (FIG. 11), respectively.

M(s) quotient code tables T1[h, s] are set for each separation parameter s (M(s) denotes an integer equal to or greater than 1), and a quotient code table index h for identifying the quotient code table T1[h, s] is assigned to each quotient code table T1[h, s]. Although different quotient code table indices h can be assigned to different quotient code tables T1[h, s], it is sufficient to assign one quotient code table index h to the quotient code tables T1[h, s] that have a common separation parameter s, because the quotient code table T1[h, s] is set for each separation parameter s according to this embodiment. Thus, according to this embodiment, each quotient code table T1[h, s] is identified based on the combination of the separation parameter s and the quotient code table index h. FIG. 12A shows a case where M(s)=5, in which five quotient code tables T1[h, s] (with quotient code table indices h=0 to 4) are set for each separation parameter s. Each quotient code table T1[h, s] is associated with a set of the separation parameter s and the quotient code table index h, and one quotient code table T1[h, s] is identified by specifying the set of the separation parameter s and the quotient code table index h. Note that the quotient code table T1[h, s] identified by the set of the separation parameter s and the quotient code table index h in the quotient code table storage 122e is the same as the quotient code table T1[h, s] identified by the set of the separation parameter s and the quotient code table index h in the quotient code table storage 221e. The above description holds true for each quotient code table T2[h, s] that belongs to the set T2 of quotient code tables (FIG. 13A).

According to this embodiment, the value of the quotient code table index h decreases as the corresponding quotient code tables T1[h, s] and T2[h, s] are more similar to the code table used for the same variable length coding as the Alpha coding and increases as the quotient code tables are less similar to the code table used for the same variable length coding as the Alpha coding. Note that the relationship between the magnitude of the quotient code table index h and the quotient code tables T1[h, s] and T2[h, s] described herein is only an example. For example, larger quotient code table indices h may be assigned to quotient code tables T1[h, s] and T2[h, s] that are more similar to the code table used for the same variable length coding as the Alpha coding. Alternatively, a quotient code table index h more similar to a particular value may be assigned to code tables T1[h, s] and T2[h, s] that are more similar to the code table used for the same variable length coding as the Alpha coding. In addition, according to this embodiment, the divisor described above becomes greater as the separation parameter s becomes greater.

An example of the quotient code tables T1[h, s] and T2[h, s] stored in the quotient code table storages 122e and 221e is a Huffman tables used for the Huffman coding, which may include a Huffman table used for the same coding as the Alpha coding. For example, the quotient code table T2[0, 2] shown in FIG. 14B is a Huffman table used for the same coding as the Alpha coding, and the quotient code table T1[1, 0] shown in FIG. 14A is a Huffman table used for the Huffman coding different from the Alpha coding.

[Side Information Code Table]

The encoder 100 according to this embodiment selects the optimal separation parameter s and the optimal quotient code table to encodes the prediction residuals e(n) (n=0, . . . , N−1). Thus, the encoder 100 needs to encode the side information [h, s] including the selected separation parameter s and the quotient code table index h that identify the selected quotient code table, and pass the resulting code to the decoder 200. The frequency distributions of the selected separation parameters s and the quotient code table indices h are biased as described above. In addition, the frequency distributions of the selected separation parameters s and the quotient code table indices h are correlated with the prediction gain pg (Properties 1 to 7). In this embodiment, the encoding compressibility is improved by performing variable length coding of the side information [h, s] using the side information code table suitable for the prediction gain pg based on these properties.

To this end, in the preprocessing according to this embodiment, a plurality of sets of side information code tables are set for different prediction gains pg and stored in the side information code table storage 125 of the residual coding unit 120 and the side information code table storage 224 of the residual decoding unit 220. Each side information code table corresponds to a prediction gain within a certain range. In the encoding process and the decoding process according to this embodiment described later, a side information code table suitable for the prediction gain pg for the time-series signals x(n) (n=0, . . . , N−1) is used to perform variable length coding of the side information [h, s]. In the example of this embodiment, a side information code table Tc[1] corresponding to the prediction gain pg that is lower than a predetermined threshold th (FIG. 15A) and a side information code table Tc[2] corresponding to the prediction gain pg that is equal to or higher than the threshold th (FIG. 15B) are set.

That is, as shown in FIGS. 12B and 13B, the frequency distribution of the side information [h, s] corresponding to the selected quotient code tables vary with the prediction gain pg. The frequency distribution is trained in advance, and the optimal side information code table Tc[1] for encoding of the side information [h, s] when the prediction gain pg is lower than the threshold th and the optimal side information code table Tc[2] for encoding of the side information [h, s] when the prediction gain pg is equal to or higher than the threshold th are set. In the example shown in FIG. 15, the side information [h, s] and the code assigned to the side information are in a one-to-one relationship.

The optimal side information code table for encoding of the side information [h, s] is a code table that assigns a code having a shorter code length to side information [h, s] that identifies a quotient code table T1[h, s] or T2[h, s] that is more frequently selected and assigns a code having a longer code length to side information [h, s] that identifies a quotient code table T1[h, s] or T2[h, s] that is less frequently selected. According to Properties 2 and 5 described above, the optimal side information code table for the prediction gain pg has the following two characteristics.

[Characteristic 1 of Side Information Code Table]

The side information code table selected when the prediction gain pg is a first value is referred to as a first side information code table, and the side information code table selected when the prediction gain pg is a second value that is greater than the first value is referred to as a second side information code table. Then, the amplitude of the separation parameter that corresponds to the side information associated with a code having the shortest code length in the first side information code table is equal to or smaller than the amplitude of the separation parameter that corresponds to the side information associated with a code having the shortest code length in the second side information code table.

For example, supposing that the side information code table Tc[1] shown in FIG. 15A is the first side information code table, and the side information code table Tc[2] shown in FIG. 15B is the second side information code table, the amplitude of the separation parameter s=0 corresponding to the side information [1, 0] associated with the code having the shortest code length in the side information code table Tc[1] is equal to or smaller than the amplitude of the separation parameter s=2 corresponding to the side information [0, 2] associated with the code having the shortest code length in the side information code table Tc[2].

[Characteristic 2 of Side Information Code Table]

The side information code table selected when the prediction gain pg is a first value is referred to as a first side information code table, and the side information code table selected when the prediction gain pg is a second value that is greater than the first value is referred to as a second side information code table. Then, the quotient code table identified by the quotient code table index corresponding to the side information associated with the code having the shortest code length in the second side information code table is more similar to the Alpha code table used for the Alpha coding than the quotient code table identified by the quotient code table index corresponding to the side information associated with the code having the shortest code length in the first side information code table.

For example, supposing that the side information code table Tc[1] shown in FIG. 15A is the first side information code table, and the side information code table Tc[2] shown in FIG. 15B is the second side information code table, the quotient code table T2[0, 2] (FIG. 14B) corresponding to the side information [0, 2] associated with the code having the shortest code length in the side information code table Tc[2] is more similar to the Alpha code table used for the Alpha coding than the quotient code table T1[1, 0] (FIG. 14A) corresponding to the side information [1, 0] associated with the code having the shortest code length in the side information code table Tc[1]. The degree of similarity between the quotient code table and the Alpha code table is defined by the formula (20) described above, for example.

(Encoding Method)

Figure 16:
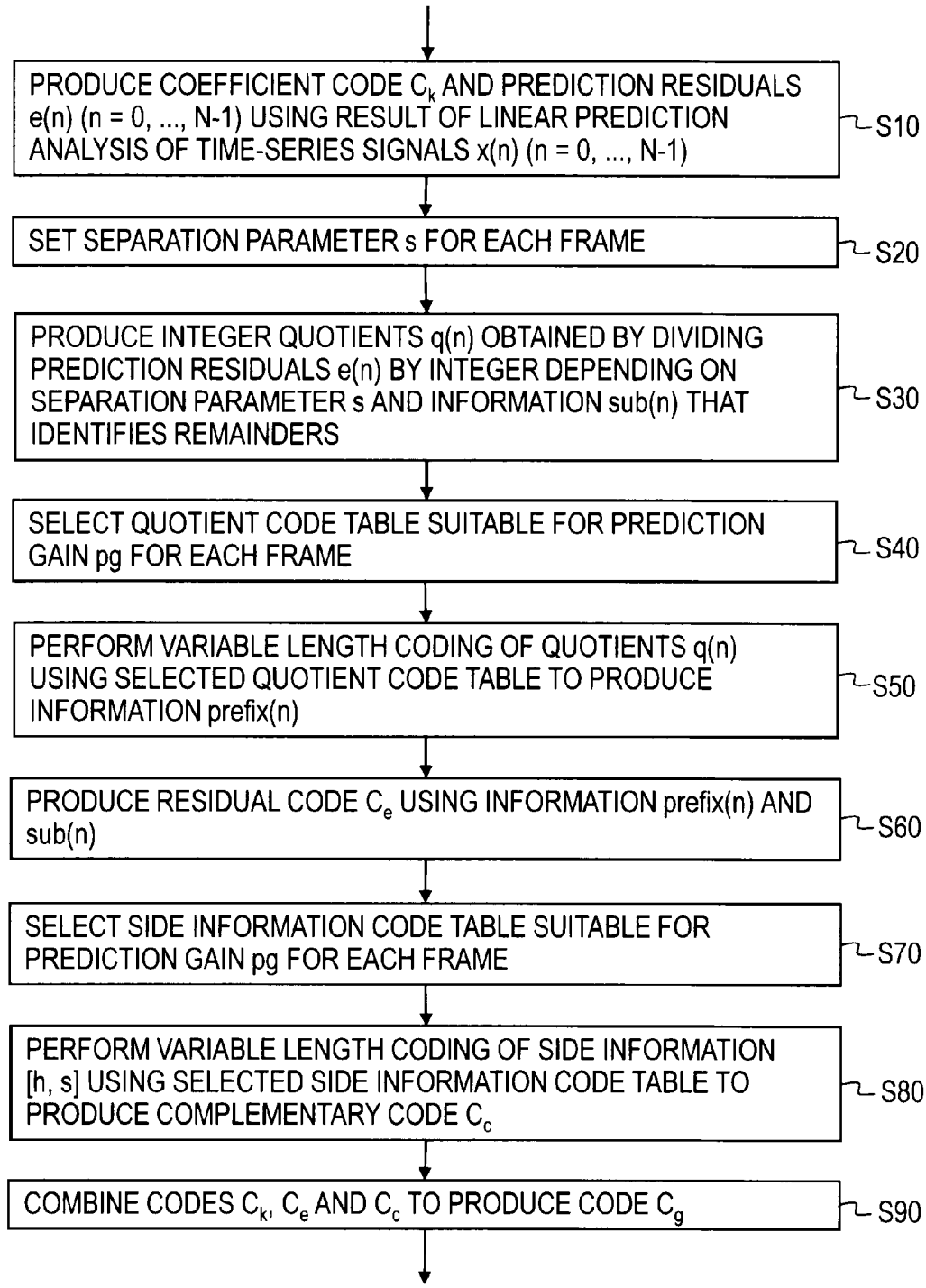
FIG. 16 is a flow chart for illustrating an encoding method according to a first embodiment.
Figure 17A:
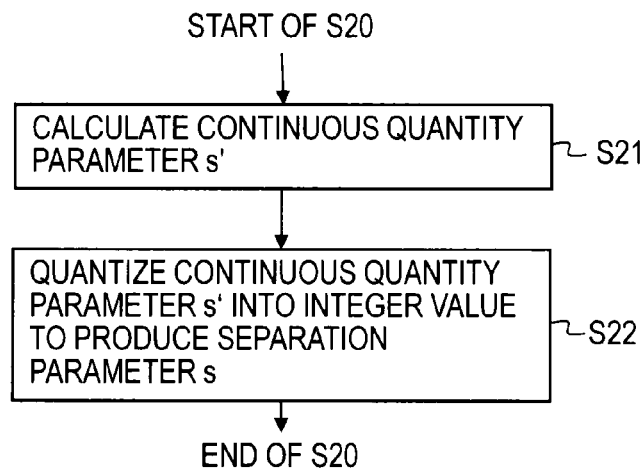
FIG. 17A is a flow chart for illustrating an example of step S20 in FIG. 16 in detail.
Figure 17B:
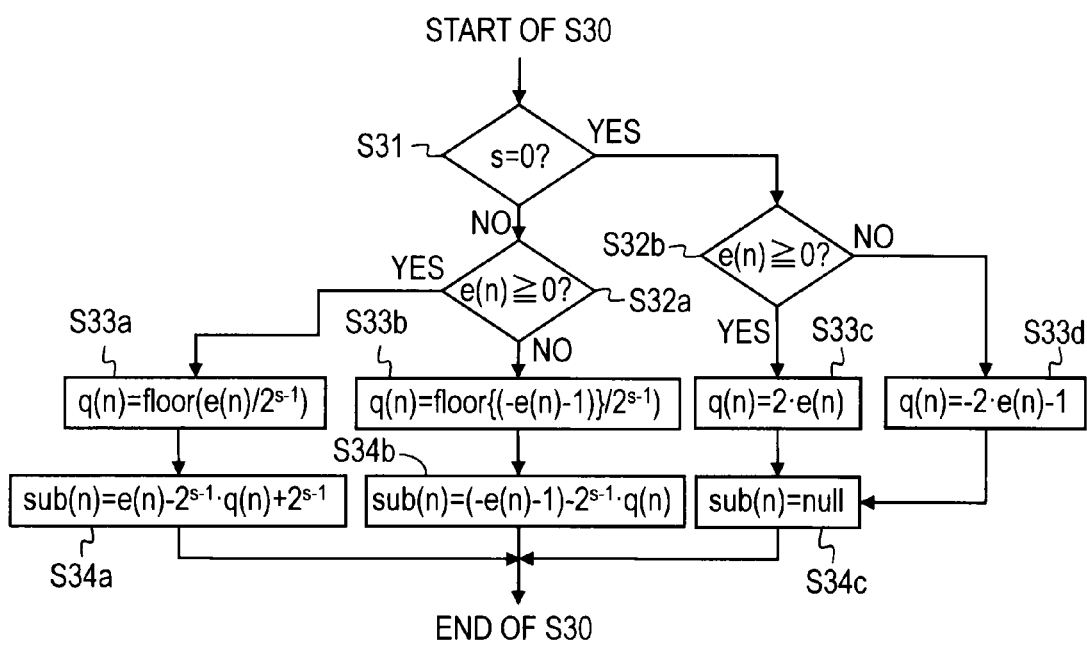
FIG. 17B is a flow chart for illustrating an example of step S30 in FIG. 16 in detail.
Figure 18A:
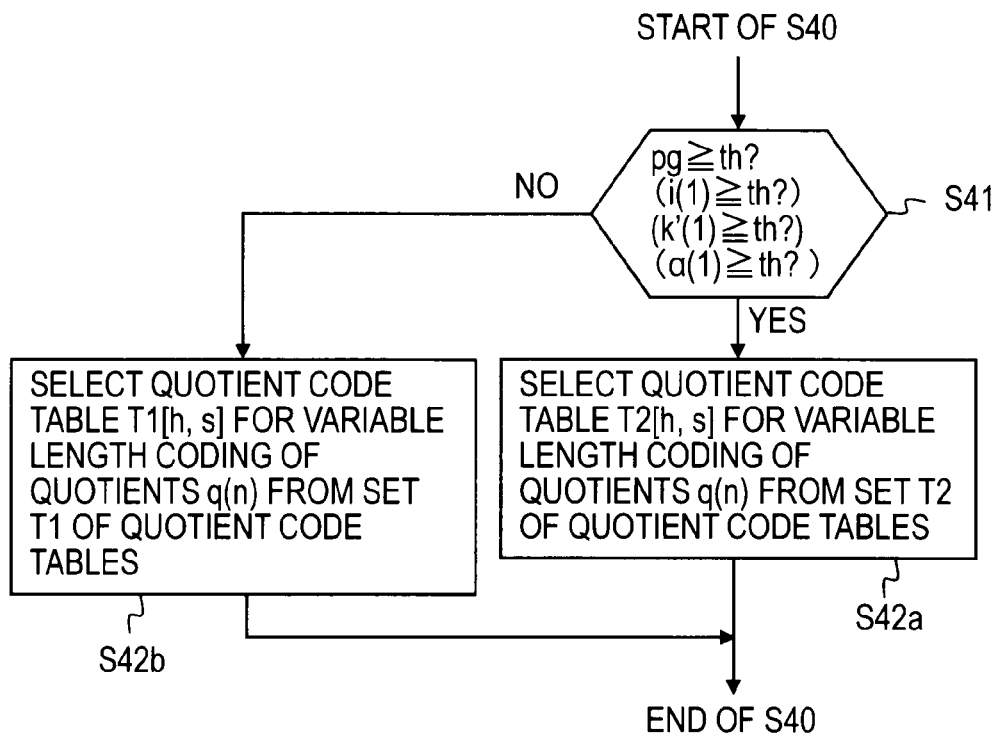
FIG. 18A is a flow chart for illustrating an example of step S40 in FIG. 16 in detail.
Figure 18B:
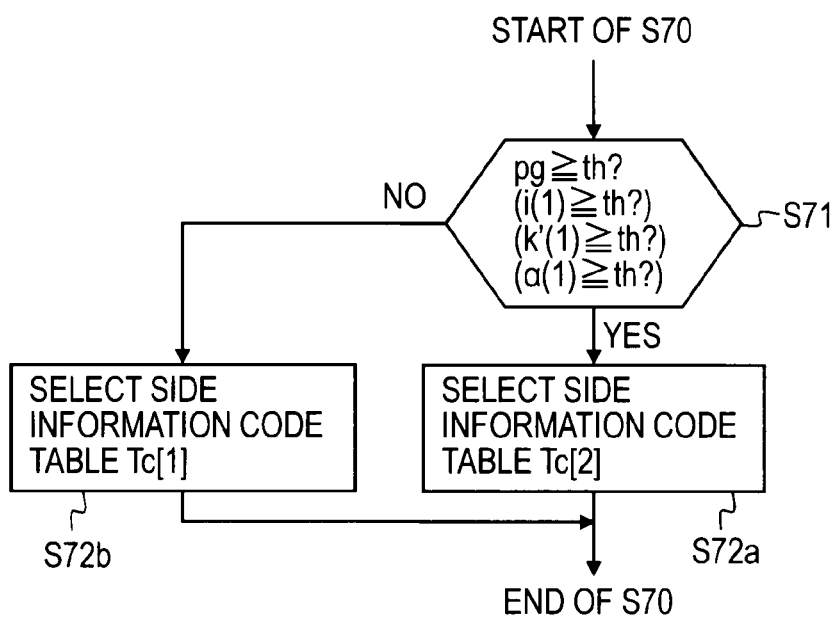
FIG. 18B is a flow chart for illustrating an example of step S70 in FIG. 16 in detail.

FIG. 16 is a flow chart for illustrating an encoding method according to the first embodiment. FIG. 17A is a flow chart for illustrating an example of step S20 in FIG. 16 in detail, and FIG. 17B is a flow chart for illustrating an example of step S30 in FIG. 16 in detail. FIG. 18A is a flow chart for illustrating an example of step S40 in FIG. 16 in detail, and FIG. 18B is a flow chart for illustrating an example of step S70 in FIG. 16 in detail. The encoding method according to this embodiment will be described below with reference to these drawings.

Quantized sampled time-series signals x(n) in the PCM format are input to the prediction coding unit 2110 of the encoder 100 (FIG. 8). These time-series signals x(n) may be linearly quantized signals (sometimes referred to also as "uniformly quantized signals") or nonlinearly quantized signals (sometimes referred to also as "nonuniformly quantized signals"), such as companded quantized signals (refer to ITU-T Recommendation G.711, "Pulse Code Modulation (PCM) of Voice Frequencies", for example). The time-series signals x(n) may not be signals in the PCM format or signals that are not quantized. The prediction coding unit 2110 performs linear prediction analysis of the time-series signals x(n) (n=0, . . . , N−1) on a frame basis as described above, generates the coefficient code $C_k$ corresponding to the quantized PARCOR coefficients i(m) (m=1, . . . , M) and the prediction residuals e(n) (n=0, . . . , N−1) based on the result of the linear prediction analysis, and outputs the generated coefficient code $C_k$ and prediction residuals e(n) (step S10). The prediction coding unit 2110 may be configured to perform direct linear prediction analysis of the input time-series signals x(n) (n=0, . . . , N−1) or to map the input nonlinearly quantized time-series signals x(n) (n=0, . . . , N−1) into linearly quantized signals or other nonlinearly quantized signals before performing linear prediction analysis.

The prediction residuals e(n) (n=0, . . . , N−1) output from the prediction coding unit 2110 are input to the residual coding unit 120. The prediction residuals e(n) input to the residual coding unit 120 are values expressed by integers, such as integers from $-(2^8-1)$ to $+(2^8-1)$.

In the residual coding unit 120 (FIG. 9), the input prediction residuals e(n) (n=0, . . . , N−1) are fed into the separation parameter setting unit 121, and the separation parameter setting unit 121 sets an integer separation parameter s that depends on the magnitude of the prediction residuals e(n) for each frame (step S20).

[Specific Example of Step S20]

In this embodiment, first, the parameter arithmetic unit 121a in the separation parameter setting unit 121 calculates a continuous quantity parameter s' that monotonically increases with the magnitude of the prediction residuals e(n) for each frame according to the following formula and outputs the continuous quantity parameter s' (step S21).

$$s' = \log_2\{\ln 2 \cdot (2 \cdot D / N)\} \quad (21)$$

$$D = \sum_{n=0}^{N-1} |e(n)|$$

The continuous quantity parameter s' is input to the quantizer 121b, and the quantizer 121b quantizes the continuous quantity parameter s' into an integer value to generate a separation parameter s and outputs the separation parameter s (step S22). The quantization may be a process of rounding off the fractional part of the continuous quantity parameter s to generate an integer separation parameter s or a process of mapping the continuous quantity parameter s' within s≤s'<s+1 to an integer separation parameter s, for example (this is the end of the description of [Specific Example of Step S20]).

Then, the prediction residuals e(n) (n=0, . . . , N−1) input to the residual coding unit 120 and the separation parameter s output from the separation parameter setting unit 121 are input to the separating unit 122a in the coding unit 122 (FIG. 9). The separation parameter s is set for the frame of the input prediction residuals e(n) (n=0, . . . , N−1). Using these values, the separating unit 122a generates an integer quotients q(n) obtained by dividing the prediction residuals e(n) or integers equal to or greater than 0 that monotonically increase with the absolute value of the prediction residuals e(n) by integers that depends on the separation parameter s, and information sub (n) that identifies the remainders of the division (step S30). The information sub(n) that identifies the remainders is a concept that includes null.

[Specific Example of Step S30]

As shown in FIG. 17B, the separating unit 122a first determines whether the input separation parameter s is equal to 0 or not (step S31). If the separation parameter s is not equal to 0, the separating unit 122a determines whether or not the input prediction residual e(n) is equal to or greater than 0 (step S32a). If it is determined that e(n)≥0, the integer quotient q(n) is generated according to the formula (5) described above (step S33a), and then, the information sub(n) that identifies the remainder is generated according to the formula (9) described above and output (step S34a). The value $2^{s-1}$ in the formula (5) corresponds to the "integer that depends on the separation parameter s (divisor)". If it is not determined in step S32a that e(n)≥0, the separating unit 122a generates the integer quotient q(n) according to the formula (6) described above (step S33b), generates the information sub(n) that identifies the remainder according to the formula (10) described above, and outputs the information sub(n) (step S34b). The value (−e(n)−1) in the formula (6) corresponds to the "integer equal to or greater than 0 that monotonically increases with the absolute value of the prediction residual e(n) (dividend)", and the value $2^{s-1}$ corresponds to the "integer that depends on the separation parameter s (divisor)".

If it is determined in step S31 that s=0, the separating unit 122a determines whether the input prediction residual e(n) is equal to or greater than 0 (step S32b). If it is determined that e(n)≥0, the separating unit 122a generates the quotient q(n) according to the formula (7) described above (step S33c), and outputs null as the information sub(n) (step S34c). The value 2·e(n) in the formula (7) q(n)=2·e(n)=2·e(n)/$2^s$ (s=0) corresponds to the "integer equal to or greater than 0 that monotonically increases with the absolute value of the prediction residual e(n) (dividend)", and the value $2^s$=1 (s=0) corresponds to the "integer that depends on the separation parameter s (divisor)".

If it is not determined in step S32b that e(n)≥0, the separating unit 122a generates the quotient q(n) according to the formula (8) described above (step S33d), and outputs null as the information sub(n) (step S34c). The value −2·e(n)−1 in the formula (8) q(n)=−2·e(n)−1=(−2·e(n)−1)/$2^s$ (s=0) corresponds to the "integer equal to or greater than 0 that monotonically increases with the absolute value of the prediction residual e(n) (dividend)", and the value $2^s$=1 (s=0) corresponds to the "integer that depends on the separation parameter s (divisor)" (this is the end of the description of [Specific Example of Step S30]).

Then, the quotients q(n) output from the separating unit 122a, the separation parameter s output from the separation parameter setting unit 121 and the quantized PARCOR coefficients i(m) (m=1, . . . , M) output from the quantizer 2113 are input to the quotient code table selector 122d. Using these pieces of information, the quotient code table selector 122d selects, for each frame, a quotient code table suitable for the prediction gain pg from the sets T1 and T2 of quotient code tables, which are code tables used for variable length coding of the quotients q(n), stored in the quotient code table storage 122e (step S40).

[Specific Example of Step S40]
((Example S40-1))

As shown in FIG. 18A, the quotient code table selector 122d first determines the prediction gain pg according to the formula (19) with the k(m) replaced with k'(m), using PARCOR coefficients k'(m) (m=1, . . . , M) obtained by inverse quantization of the input quantized PARCOR coefficients i(m) (m=1, . . . , M). The character M denotes the prediction order of the linear prediction analysis performed by the linear prediction analyzer 2112. If the prediction order M is not fixed, the quotient code table selector 122d uses the prediction order M output from the linear prediction analyzer 2112. The inverse quantization refers to a process of mapping a quantized value to a non-quantized value corresponding to the quantized value. For example, supposing that the quantized PARCOR coefficient i(m) is the quantized values of the PARCOR coefficient k(m) within η1≤k(m)<η2, the PARCOR coefficient k'(m) obtained by inverse quantization of the quantized PARCOR coefficient i(m) is the average of η1 and η2, for example. Then, the quotient code table selector 122d determines whether or not the prediction gain pg is equal to or greater than a predetermined threshold th (step S41).

If it is determined that pg≥th, the quotient code table selector 122d selects the quotient code table T2[h, s] from the set T2 of quotient code tables stored in the quotient code table storage 122e (step S42a). For example, the quotient code table selector 122d refers to the quotient code table storage 122e to determine the total number of bits of the code corresponding to the quotients q(n) (n=0, . . . , N−1) in one frame for each quotient code table T2[h, s] corresponding to the input separation parameter s, and selects a quotient code table T2[h, s] for which the total number of bits is the smallest. For example, if s=2 in the example shown in FIG. 13A, the quotient code table selector 122d determines the total number of bits of the code corresponding to the quotients q(n) (n=0, . . . , N−1) in one frame for each of the quotient code tables T2[0, 2], T2[1, 2], T2[2, 2], T2[3, 2] and T2[4, 2], and selects a code table for which the total number of bits is the smallest from the quotient code tables T2[0, 2], T2[1, 2], T2[2, 2], T2[3, 2] and T2[4, 2]. The quotient code table selector 122d outputs side information [h, s] that includes the quotient code table index h that identifies the quotient code table T2[h, s] selected for each frame and the input separation parameter s. The side information [h, s] may be information including only the quotient code table index h and the separation parameter s or information ([h, s, add]) including additional information add, such as a header, in addition to the quotient code table index h and the separation parameter s.

If it is determined that pg<th, the quotient code table selector 122d selects a quotient code table T1[h, s] from the set T1 of quotient code tables stored in the quotient code table storage 122e (step S42b). For example, the quotient code table selector 122d refers to the quotient code table storage 122e to determine the total number of bits of the codes corresponding to the quotients q(n) in one frame for each quotient code table T1[h, s] corresponding to the input separation parameter s, and select a quotient code table T1[h, s] for which the total number of bits is the smallest. For example, if s=2 in the example shown in FIG. 12A, the quotient code table selector 122d determines the total number of bits of the code corresponding to the quotients q(n) (n=0, . . . , N−1) in one frame for each of the quotient code tables T1[0, 2], T1[1, 2], T1[2, 2], T1[3, 2] and T1[4, 2], and selects a code table for which the total number of bits is the smallest from the quotient code tables T1[0, 2], T1[1, 2], T1[2, 2], T1[3, 2] and T1[4, 2]. The quotient code table selector 122d outputs side information [h, s] that includes the quotient code table index h that identifies the quotient code table T1[h, s] selected for each frame and the input separation parameter s. The side information [h, s] may be information including only the quotient code table index h and the separation parameter s or information ([h, s, add]) including additional information add, such as a header, in addition to the quotient code table index h and the separation parameter s.

((Example S40-2))

In the example S40-1, the prediction gain pg itself is used as the index to select a set of quotient code tables, and a quotient code table, which is suitable for the prediction gain, is selected from the set of quotient code tables. However, a coefficient of the prediction filter obtained by prediction analysis of the time-series signals x(n) (n=0, . . . , N−1) or a coefficient that can be converted to the coefficient of the prediction filter may be used as the index to select a set of quotient code tables, and a quotient code table, which is suitable for the prediction gain, may be selected from the set of quotient code tables.

In this case, the quotient code table selector 122d determines whether or not the input quantized PARCOR coefficient i(1) is equal to or greater than the predetermined threshold th (step S41), for example. If it is determined that i(1)≥th, the quotient code table selector 122d selects a quotient code table T2[h, s] from the set T2 of quotient code tables stored in the quotient code table storage 122e (step S42a). If it is determined that i(1)<th, the quotient code table selector 122d selects a quotient code table T1[h, s] from the set T1 of quotient code tables stored in the quotient code table storage 122e (step S42b). The example S40-2 is the same as the example S40-1 in the other respects.

As an alternative to the quantized PARCOR coefficient i(1), the PARCOR coefficient k'(1) obtained by inverse quantization of the quantized PARCOR coefficient i(1) or a linear prediction coefficient α(1) output from a linear prediction coefficient converter 2115 may be used as the index. That is, in step S41, it may be determined whether or not the PARCOR coefficient k'(1) obtained by inverse quantization of the quantized PARCOR coefficient i(1) or the linear prediction coefficient α(1) is equal to or greater than the threshold th, instead of determining whether or not the quantized PARCOR coefficient i(1) is equal to or greater than the predetermined threshold th. As a further alternative, a PARCOR coefficient of another order or the like may be used instead of the first-order quantized PARCOR coefficient i(1) or the like (this is the end of the description of [Specific Example of Step S40]).

Then, the quotient code table selector 122d passes a parameter p that identifies the set T1 or T2 to which the quotient code table T1[h, s] or T2[h, s] selected for each frame in step S40 belongs and the side information [h, s] corresponding to the selected quotient code table T1[h, s] or T2[h, s] to the quotient coding unit 122d. The quotient coding unit 122d further receives the quotients q(n) (n=0, . . . , N–1) for the frame output from the separating unit 122a. Using these pieces of information, the quotient coding unit 122d searches the quotient code table storage 122e to extract the quotient code table T1[h, s] or T2[h, s] corresponding to the parameter p and the side information [h, s]. Then, using the extracted quotient code table T1[h, s] or T2[h, s], the quotient coding unit 122d performs variable length coding of the quotients q(n) for the frame to generate the information prefix(n) (n=0, . . . , N–1), which is a code corresponding to the quotients q(n) (step S50).

The information prefix(n) output from the quotient coding unit 122b and the information sub(n) output from the separating unit 122a are input to the combining unit 2122c, and the combining unit 2122c generates a residual code $C_e$ corresponding to the prediction residuals e(n) from the information prefix(n) and sub(n) and outputs the residual code $C_e$ (step S60). For example, if the information sub(n) is not null, the combining unit 2122c performs a step of combining the information prefix(n) and sub(n) and outputting the resulting bit-connected value prefix(n)|sub(n) as the residual code $C_e$. If the information sub(n) is null, the combining unit 2122c performs a step of outputting the information prefix(n) as the residual code $C_e$. The combining unit 2122c may include additional information, such as a header, in the residual code $C_e$ in addition to the information prefix(n) and sub(n).

Then, the quantized PARCOR coefficients i(m) (m=1, . . . , M) output from the quantizer 2113 are input to the side information code table selector 124. Using the information, the side information code table selector 124 selects, for each frame, a side information code table suitable for the prediction gain pg (an index representing the prediction effectiveness of the time-series signals x(n)) from a set of side information code tables including the side information code tables Tc[1] and Tc[2] used for variable length coding of the side information [h, s], based on a determination criterion corresponding to the prediction effectiveness of the time-series signals x(n) (in other words, a determination criterion for determining information corresponding to the index representing the prediction effectiveness of the time-series signals x(n)), and outputs a parameter w that identifies the selected side information code table (step S70).

[Specific Example of Step S70]
((Example S70-1))

As shown in FIG. 18B, using the PARCOR coefficients k'(m) (m=1, . . . , M) obtained by inverse quantization of the input quantized PARCOR coefficients i(m) (m=1, . . . , M), the side information code table selector 124 determines the prediction gain pg according to the formula (19) with k(m) replaced with k'(m). The character M denotes the prediction order of the linear prediction analysis performed by the linear prediction analyzer 2112. If the prediction order M is not fixed, the quotient code table selector 122d uses the prediction order M output from the linear prediction analyzer 2112. The side information code table selector 124 may be configured to use the prediction gain pg determined by the quotient code table selector 122d, rather than determining the prediction gain pg according to the formula (19).

Then, the side information code table selector 124 determines whether or not the prediction gain pg is equal to or greater than the predetermined threshold th (step S71). If it is determined that pg≥th, the side information code table selector 124 selects the side information code table Tc[2] from a set of side information code tables including the side information code tables Tc[1] and Tc[2] stored in the side information code table storage 125 (step S72a). If it is determined that pg<th, the side information code table selector 124 selects a side information code table Tc[1] from a set of side information code tables including the side information code tables Tc[1] and Tc[2] stored in the side information code table storage 125 (step S72b). Then, the side information code table selector 124 outputs a parameter w that identifies the selected side information code table.

((Example S70-2))

In the example S70-1, the prediction gain pg itself is used as the index to select a side information code table suitable for the prediction gain. However, a coefficient of the prediction filter obtained by prediction analysis of the time-series signals x(n) or a coefficient that can be converted to the coefficient of the prediction filter may be used as the index to select a side information code table suitable for the prediction gain.

In this case, the side information code table selector 124 determines whether or not the input quantized PARCOR coefficient i(1) is equal to or greater than the predetermined threshold th (step S71). If it is determined that i(1)≥th, the side information code table selector 124 selects a side information code table Tc[2] from a set of side information code tables including the side information code tables Tc[1] and Tc[2] stored in the side information code table storage 125 (step S72a). If it is determined that i(1)<th, the side information code table selector 124 selects a side information code table Tc[1] from a set of side information code tables including the side information code tables Tc[1] and Tc[2] stored in the side information code table storage 125 (step S72b). Then, the side information code table selector 124 outputs a parameter w that identifies the selected side information code table.

As an alternative to the quantized PARCOR coefficient i(1), the PARCOR coefficient k'(1) obtained by inverse quantization of the quantized PARCOR coefficient i(1) or the linear prediction coefficient α(1) output from the linear prediction coefficient converter 2115 may be used as the index. That is, in step S71, it may be determined whether or not the PARCOR coefficient k'(1) obtained by inverse quantization of the quantized PARCOR coefficient i(1) or the linear prediction coefficient α(1) is equal to or greater than the threshold th, instead of determining whether or not the quantized PARCOR coefficient i(1) is equal to or greater than the threshold th. As a further alternative, a PARCOR coefficient of another order or the like may be used instead of the first-order quantized PARCOR coefficient i(1) or the like (this is the end of the description of [Specific Example of Step S70]).

Then, the side information [h, s] output from the quotient code table selector 122d and the parameter w output from the side information code table selector 124 are input to the side information coding unit 123. The side information coding unit 123 extracts the side information code table Tc[1] or Tc[2] identified by the parameter w from the side information code table storage 125. Then, using the extracted side information code table Tc[1] or Tc[2], the information coding unit 123 performs variable length coding of each piece of side information [h, s] to generate a complementary code $C_c$ corresponding to the side information [h, s] (step S80).

The coefficient code $C_k$ corresponding to the PARCOR coefficients, the residual code $C_e$ corresponding to the prediction residuals e(n) and the complementary code $C_c$ corresponding to the side information [h, s] generated as described above are input to the combining unit 2130 (FIG. 8), and the combining unit 2130 combines these codes to form a code $C_g$ and outputs the code $C_g$ (step S90).

(Decoding Method)

Figure 19:
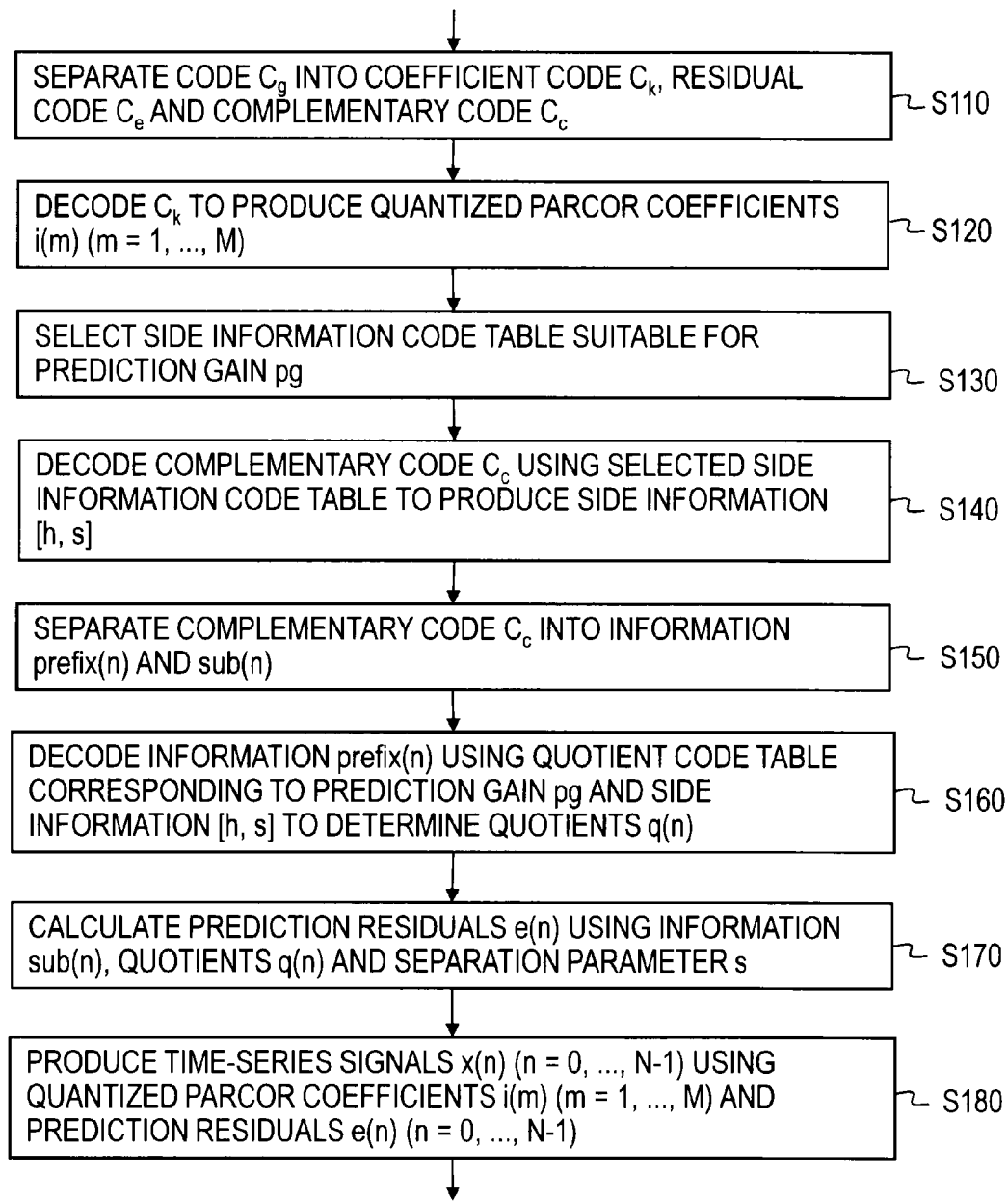
FIG. 19 is a flow chart for illustrating a decoding method according to the first embodiment.
Figure 20A:
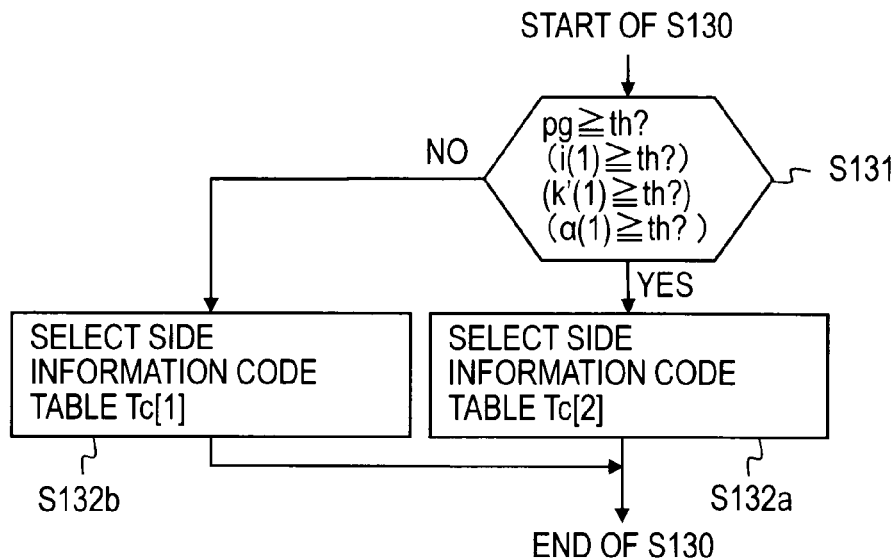
FIG. 20A is a flow chart for illustrating an example of step S130 in FIG. 19 in detail.
Figure 20B:
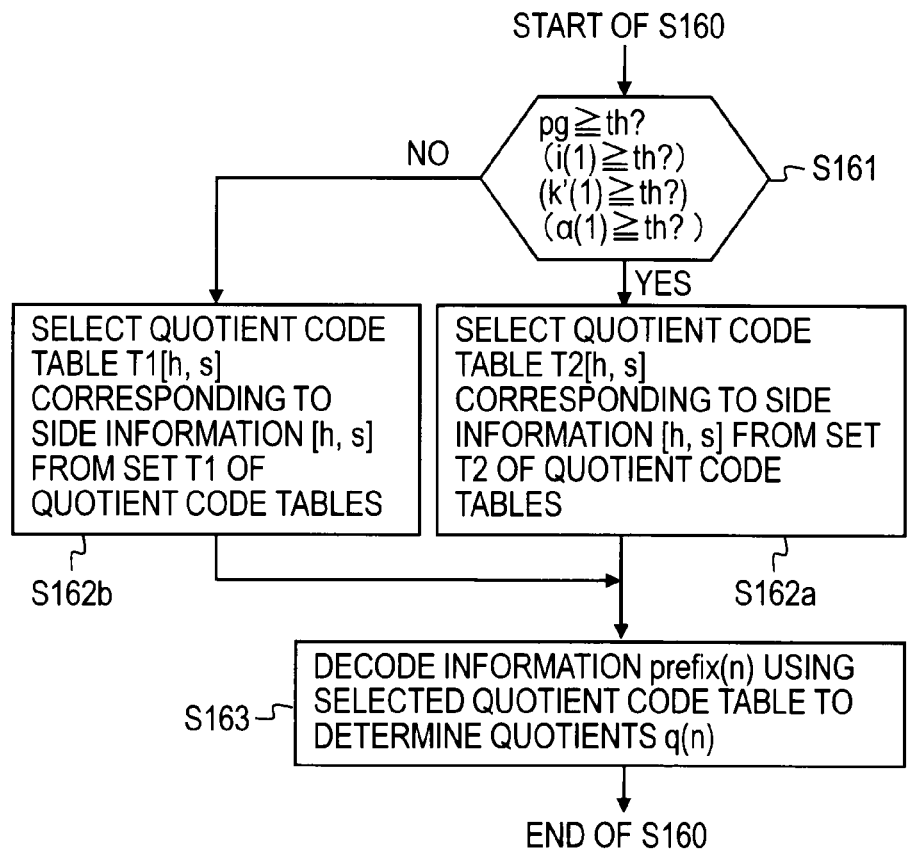
FIG. 20B is a flow chart for illustrating an example of step S160 in detail.
Figure 21:
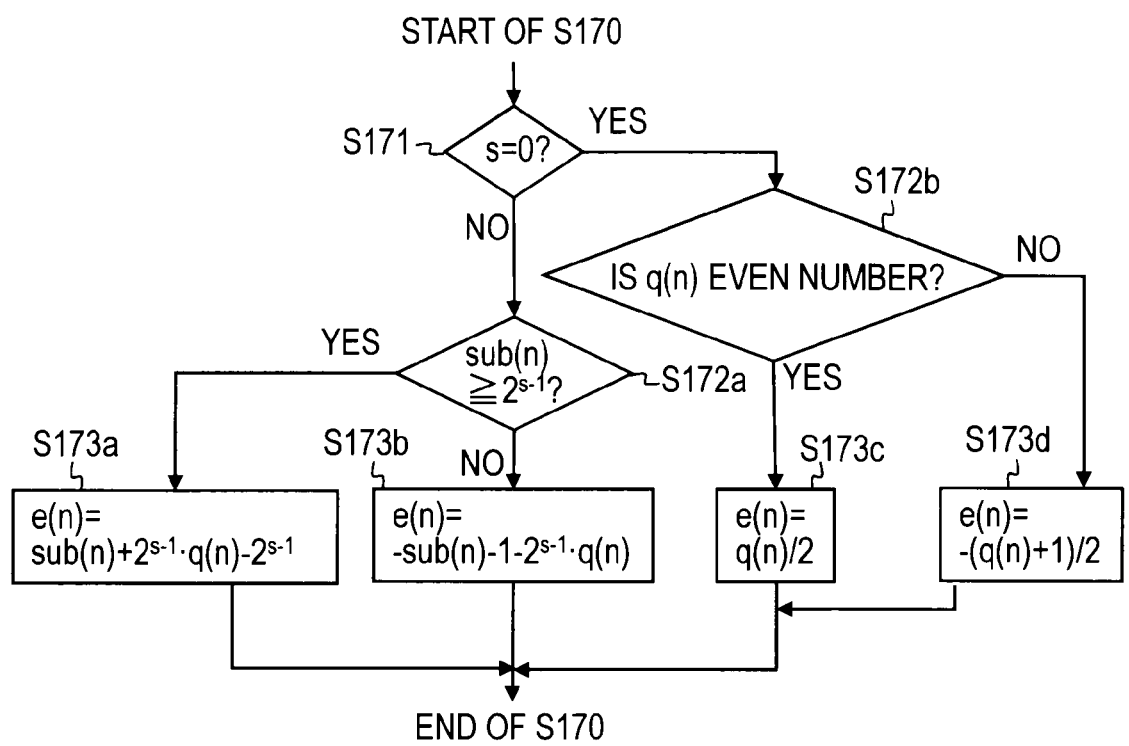
FIG. 21 is a flow chart for illustrating an example of step S170 in FIG. 19 in detail.

FIG. 19 is a flow chart for illustrating a decoding method according to the first embodiment. FIG. 20A is a flow chart for illustrating an example of step S130 in FIG. 19 in detail, and FIG. 20B is a flow chart for illustrating an example of step S160 in detail. FIG. 21 is a flow chart for illustrating an example of step S170 in FIG. 19 in detail. The decoding method according to this embodiment will be described below with reference to these drawings.

The separator 2210 in the decoder 200 (FIG. 10) separates the code $C_g$ input to the decoder 200 into the coefficient code $C_k$, the residual code $C_e$ corresponding to the prediction residuals e(n) and the complementary code $C_c$ corresponding to the side information [h, s] (step S110).

The coefficient code $C_k$ output from the separator 2210 is input to the prediction decoding unit 2230. A coefficient decoding unit 2231 in the prediction decoding unit 2230 decodes the coefficient code $C_k$ to generate the quantized PARCOR coefficients i(m) (m=1, . . . , M) (step S120).

The generated quantized PARCOR coefficients i(m) (m=1, . . . , M) are input to the side information code table selector 223 in the prediction decoding unit 220 (FIG. 11). Using the quantized PARCOR coefficients i(m) (m=1, . . . , M), the side information code table selector 223 selects a side information code table suitable for the prediction gain pg (an index representing the prediction effectiveness of the time-series signals x(n)) from a set of side information code tables including the side information code tables used for decoding of the complementary code $C_c$ corresponding to the side information [h, s], based on a determination criterion corresponding to the prediction effectiveness of the time-series signals x(n) (in other words, a determination criterion for determining information corresponding to the index representing the prediction effectiveness of the time-series signals x(n)), and outputs a parameter w that identifies the selected side information code table (step S130).

[Specific Example of Step S130]

((Example S130-1))

As shown in FIG. 20A, the side information code table selector 223 first determines the prediction gain pg according to the formula (19) with the k(m) replaced with k'(m), using the PARCOR coefficients k'(m) (m=1, . . . , M) obtained by inverse quantization of the input quantized PARCOR coefficients i(m) (m=1, . . . , M). If the prediction order M is not fixed, the side information code table selector 223 uses the highest order M of the input quantized PARCOR coefficients i(m) (m=1, . . . , M) as the prediction order M.

Then, the side information code table selector 223 determines whether or not the prediction gain pg is equal to or greater than a predetermined threshold th (step S131). If it is determined that pg≥th, the side information code table selector 223 selects the side information code table Tc[2] from a set of side information code tables including the side information code tables Tc[1] and Tc[2] stored in the side information code table storage 224 (step S132a). If it is determined that pg<th, the side information code table selector 223 selects the side information code table Tc[1] from a set of side information code tables including the side information code tables Tc[1] and Tc[2] stored in the side information code table storage 224 (step S132b). Then, the side information code table selector 223 outputs a parameter w that identifies the selected side information code table.

((Example S130-2))

In the example S130-1, the prediction gain pg itself is used as the index to select the side information code table suitable for the prediction gain. However, a coefficient of the prediction filter obtained by prediction analysis of the time-series signals x(n) (n=0, . . . , N−1) or a coefficient that can be converted to the coefficient of the prediction filter may be used as the index to select the side information code table suitable for the prediction gain.

In this case, the side information code table selector 223 determines whether or not the input quantized PARCOR coefficient i(1) is equal to or greater than the predetermined threshold th (step S131). If it is determined that i(1)≥th, the side information code table selector 223 selects the side information code table Tc[2] from a set of side information code tables including the side information code tables Tc[1] and Tc[2] stored in the side information code table storage 224 (step S132a). If it is determined that i(1)<th, the side information code table selector 223 selects the side information code table Tc[1] from a set of side information code tables including the side information code tables Tc[1] and Tc[2] stored in the side information code table storage 224 (step S132b). Then, the side information code table selector 223 outputs a parameter w that identifies the selected side information code table.

As an alternative to the quantized PARCOR coefficient i(1), the PARCOR coefficient k'(1) obtained by inverse quantization of the quantized PARCOR coefficient i(1) may be used as the index. As a further alternative, the quantized PARCOR coefficients i(m) (m=1, . . . , M) output from the coefficient decoding unit 2231 may be converted to linear prediction coefficients α(m) (m=1, . . . , M) by a linear prediction coefficient converter 2232, and the resulting linear prediction coefficient α(1) may be used as the index instead of the quantized PARCOR coefficient i(1). That is, in step S131, it may be determined whether or not the PARCOR coefficient k'(1) obtained by inverse quantization of the quantized PARCOR coefficient i(1) or the linear prediction coefficient α(1) is equal to or greater than the threshold th, instead of determining whether or not the quantized PARCOR coefficient i(1) is equal to or greater than the predetermined threshold th. As a further alternative, a quantized PARCOR coefficient of another order or the like may be used instead of the first-order quantized PARCOR coefficient i(1) or the like (this is the end of the description of [Specific Example of Step S130]).

Then, the complementary code $C_c$ corresponding to the side information [h, s] and the parameter w that identifies the side information code table selected in step S130 are input to the side information decoding unit 222. The side information decoding unit 222 extracts the side information code table Tc[1] or Tc[2] identified by the parameter w from the side information code table storage 224. Then, using the extracted side information code table Tc[1] or Tc[2], the side information decoding unit 222 decodes the complementary code $C_c$ corresponding to the side information [h, s] to generate the side information [h, s] including the set of the separation parameter s and the quotient code table index h (step S140).

The residual code $C_e$ corresponding to the prediction residuals e(n) is input to the separator 2221a in the residual decoding unit 220 (FIG. 11). The separator 2221a separates the input residual code $C_e$ into the information prefix(n) and sub(n) (step S150).

The side information [h, s] output from the side information decoding unit 222, the information prefix(n) output from the separator 2221a and the quantized PARCOR coefficients i(m) (m=1, ..., M) output from the coefficient decoding unit 2231 are input to the quotient decoding unit 221c. The quotient decoding unit 221c determines the quotients q(n) by decoding the information prefix(n) using the quotient code table for each frame corresponding to the prediction gain pg and the side information [h, s] identified by these pieces of information, and outputs the quotients q(n) (step S160).

[Specific Example of Step S160]

((Example S160-1))

As shown in FIG. 20B, using the PARCOR coefficients k'(m) (m=1, ..., M) obtained by inverse quantization of the input quantized PARCOR coefficients i(m) (m=1, ..., M), the quotient decoding unit 221c first determines the prediction gain pg according to the formula (19) with k(m) replaced with k'(m). The quotient decoding unit 221c may be configured to use the prediction gain pg determined by the side information code table selector 223, rather than determining the prediction gain pg according to the formula (19). Then, the quotient decoding unit 221c determines whether or not the prediction gain pg is equal to or greater than the predetermined threshold th (step S161). If it is determined that pg≥th, the quotient decoding unit 221c selects the quotient code table T2[h, s] corresponding to the side information [h, s] from the set T2 of quotient code tables stored in the quotient code table storage 221e (step S162a). If it is determined that pg<th, the quotient decoding unit 221c selects the quotient code table T1[h, s] corresponding to the side information [h, s] from the set T1 of quotient code tables stored in the quotient code table storage 221e (step S162b).

Then, the quotient decoding unit 221c decodes the information prefix(n) using the selected quotient code table to determine the quotients q(n) (step S163).

((Example S160-2))

In the example S160-1, the prediction gain pg itself is used as the index to select a set of quotient code tables, and a quotient code table suitable for the prediction gain is selected from the set of quotient code tables. However, a coefficient of the prediction filter obtained by prediction analysis of the time-series signals x(n) or a coefficient that can be converted to the coefficient of the prediction filter may be used as the index to select a set of quotient code tables, and a quotient code table suitable for the prediction gain pg may be selected from the set of quotient code tables.

In this case, the quotient decoding unit 221c determines whether or not the input quantized PARCOR coefficient i(1) is equal to or greater than the predetermined threshold th, for example (step S161). If it is determined that i(1)≥th, the quotient decoding unit 221c selects a quotient code table T2[h, s] corresponding to the side information [h, s] from the set T2 of quotient code tables stored in the quotient code table storage 221e (step S162a). If it is determined that i(1)<th, the quotient decoding unit 221c selects a quotient code table T1[h, s] corresponding to the side information [h, s] from the set T1 of quotient code tables stored in the quotient code table storage 221e (step S162b). Then, the quotient decoding unit 221c decodes the information prefix(n) using the selected quotient code table to determine the quotients q(n) (step S163).

As an alternative to the quantized PARCOR coefficient i(1), the PARCOR coefficient k'(1) obtained by inverse quantization of the quantized PARCOR coefficient i(1) may be used as the index. As a further alternative, the quantized PARCOR coefficients i(m) (m=1, ..., M) output from the coefficient decoding unit 2231 may be converted to linear prediction coefficients α(m) (m=1, ..., M) by the linear prediction coefficient converter 2232, and the resulting linear prediction coefficient α(1) may be used as the index instead of the quantized PARCOR coefficient i(1). That is, in step S161, it may be determined whether or not the PARCOR coefficient k'(1) obtained by inverse quantization of the quantized PARCOR coefficient i(1) or the linear prediction coefficient α(1) is equal to or greater than the threshold th, instead of determining whether or not the quantized PARCOR coefficient i(1) is equal to or greater than the predetermined threshold th. As a further alternative, a PARCOR coefficient of another order or the like may be used instead of the first-order quantized PARCOR coefficient i(1) or the like (this is the end of the description of [Specific Example of Step S160]).

Then, the quotients q(n) output from the quotient decoding unit 221c, the information sub(n) output from the separator 2221a and the separation parameter s included in the side information [h, s] output from the side information decoding unit 222 are input to the combining unit 2221b. The combining unit 2221b calculates the prediction residuals e(n) using these pieces of information and outputs the prediction residuals e(n) (step S170).

[Specific Example of Step S170]

As shown in FIG. 21, the combining unit 2221b first determines whether the input separation parameter s is equal to 0 or not (step S171). If the separation parameter s is not equal to 0, the combining unit 2221b determines whether or not the information sub(n) is equal to or greater than $2^{s-1}$ (step S172a). This determination is equivalent to determination of whether or not the prediction residual e(n) is equal to or greater than 0. If it is determined in step S172a that sub(n)≥$2^{s-1}$, the combining unit 2221b calculates the prediction residuals e(n) according to the following formula (step S173a).

$$e(n) = \text{sub}(n) + 2^{s-1} \cdot q(n) - 2^{s-1} \quad (22)$$

If it is determined in step S172a that sub(n)<$2^{s-1}$, the combining unit 2221b calculates the prediction residuals e(n) according to the following formula (step S173b).

$$e(n) = -\text{sub}(n) - 1 - 2^{s-1} \cdot q(n) \quad (23)$$

If it is determined in step S171 that s=0, the combining unit 2221b determines whether or not the information q(n) is an even number (step S172b). This determination is equivalent to determination of whether or not the prediction residual e(n) is equal to or greater than 0. If it is determined in step S172b that q(n) is an even number, the combining unit 2221b calculates the prediction residuals e(n) according to the following formula (step S173c).

$$e(n) = q(n)/2 \quad (24)$$

If it is determined in step S172b that q(n) is an odd number, the combining unit 2221b calculates the prediction residuals e(n) according to the following formula (step S173d).

$$e(n) = -(q(n)+1)/2 \quad (25)$$

The prediction residuals e(n) generated as described above are output from the combining unit 2221b (this is the end of the description of [Specific Example of Step S170]).

The quantized PARCOR coefficients i(m) (m=1, ..., M) output from the coefficient decoding unit 2231 are fed into the linear prediction coefficient converter 2232. Using these quantized PARCOR coefficients i(m), the linear prediction coefficient converter 2232 calculates linear prediction coefficients α(m) (m=1, . . . , M) of the linear prediction filter of the prediction order M. Using the calculated linear prediction coefficients α(m) (m=1, . . . , M) and the time-series signals x(n) (n=0, . . . , N−1) previously output from an adder 2234, a linear prediction unit 2233 generates linear prediction values y(n) (n=0, . . . , N−1) with the linear prediction filter. The adder 2234 sums the linear prediction values y(n) and the prediction residuals e(n) reproduced by the residual decoding unit 2220 to generate the time-series signals x(n) (n=0, . . . , N−1) (step S180).

Modification 1 of First Embodiment

Next, a modification 1 of the first embodiment will be described. According to this modification, in the encoder, the prediction residuals e(n) are mapped to integers e'(n) equal to or greater than 0 before setting and encoding of the separation parameter. In the decoder, the prediction residuals e(n) are reproduced by inverse conversion of the reproduced integers e'(n). Differences from the first embodiment will next be described and a description of commonalities with the first embodiment will be omitted.

(Configuration)

The modification 1 differs from the first embodiment in that the residual coding unit 120 in the encoder 100 further has a signal converter 126 (FIG. 9), and the residual decoding unit 220 in the decoder 200 further has a signal inverse converter 225 (FIG. 11).

(Preprocessing)

The preprocessing is the same as that in the first embodiment.

(Encoding Method)

Figure 22:
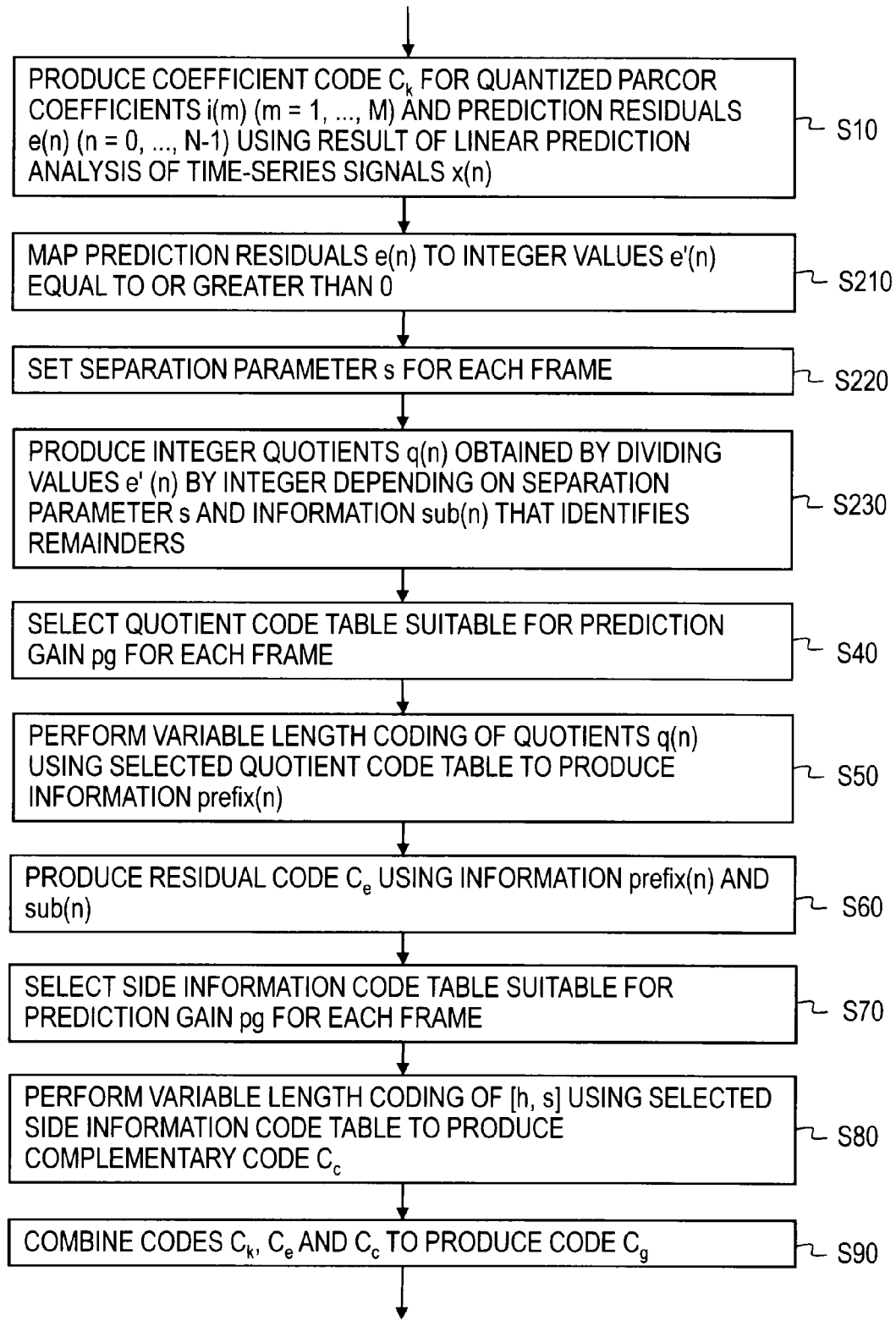
FIG. 22 is a flow chart for illustrating an encoding method according to a modification 1 of the first embodiment.
Figure 24A:
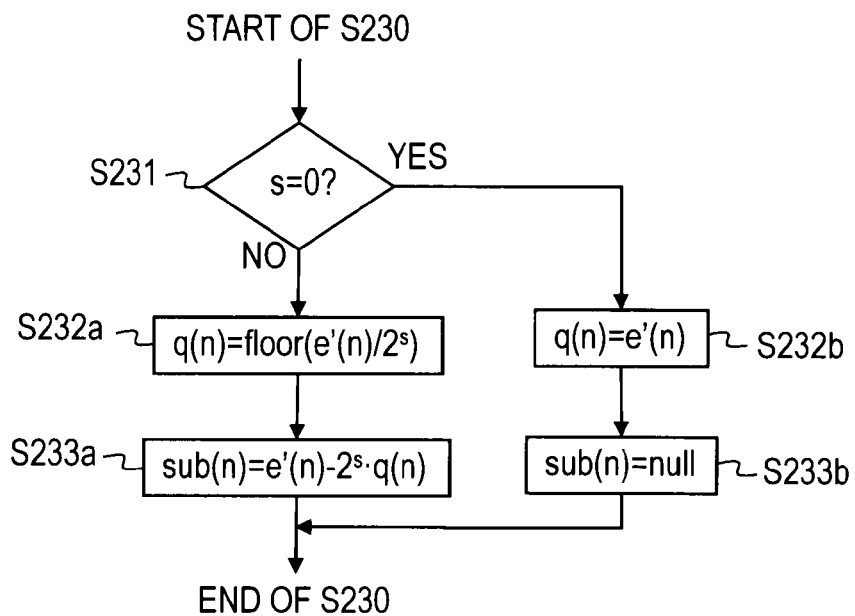
FIG. 24A is a flow chart for illustrating an example of step S230 in FIG. 22 in detail.

FIG. 22 is a flow chart for illustrating an encoding method according to the modification 1 of the first embodiment. FIG. 24A is a flow chart for illustrating an example of step S230 in FIG. 22 in detail. The encoding method according to this modification will be described below with reference to these drawings.

Step S10 described above is first performed, and the prediction residuals e(n) are input to the signal converter 126 in the residual coding unit 120 (FIG. 9). The signal converter 126 maps the input prediction residuals e(n) to integer values e'(n) equal to or greater than 0 (step S210). The values e'(n) are integers equal to or greater than 0 that monotonically increase with the absolute value of the prediction residuals e(n). The mapping is performed according to a predetermined rule. For example, the input prediction residuals e(n) that are equal to or greater than 0 are mapped to odd numbers while maintaining the order of the magnitude thereof, and the input prediction residuals e(n) that are smaller than 0 are mapped to even numbers while maintaining the order of the magnitude of the absolute value thereof.

The values e'(n) output from the signal converter 126 are fed into the separation parameter setting unit 121, and the separation parameter setting unit 121 sets an integer separation parameter s that depends on the absolute value of the values e'(n) for each frame (step S220). The processing in step S220 differs from the processing in step S20 only in that the prediction residuals e(n) are replaced with the values e'(n).

Then, the values e'(n) output from the signal converter 126 (which correspond to the "integers equal to or greater than 0 that monotonically increase with the absolute value of the prediction residuals e(n)") and the separation parameter s output from the separation parameter setting unit 121 are input to the separating unit 122a in an coding unit 322. The separation parameter s is set for the frame to which the prediction residuals e(n) corresponding to the input values e'(n) belong. Using these values, the separating unit 122a generates integer quotients q(n) obtained by dividing the values e'(n) by integers that depends on the separation parameter s and information sub(n) that identifies the remainders (step S230).

[Specific Example of Step S230]

As shown in FIG. 24A, the separating unit 122a first determines whether or not the input separation parameter s is equal to 0 (step S231). If the separation parameter s is not equal to 0, the separating unit 122a generates integer quotients q(n) according to the following formula (step S232a).

$$q(n)=\text{floor}(e'(n)2^s) \quad (26)$$

Then, the separating unit 122a generates information sub(n) that identifies the remainders according to the following formula and outputs the information sub(n) (step S233a).

$$\text{sub}(n)=e'(n)-2^s \cdot q(n) \quad (27)$$

The value $2^s$ in the formula (26) corresponds to the "integer that depends on the separation parameter s (divisor)".

If s=0, the separating unit 122a generates integer quotients q(n) according to the following formula (step S232b).

$$q(n)=e'(n) \quad (28)$$

Then, the separating unit 122a outputs null as the information sub(n) (step S333b). The value e'(n) in the formula (28) q(n)= e'(n)=e'(n)/$2^s$ (s=0) corresponds to the "integers equal to or greater than 0 that monotonically increase with the absolute value of the prediction residuals e(n) (dividend)", and the value $2^s$=1 (s=0) corresponds to the "integer that depends on the separation parameter s (divisor)" (this is the end of the description of [Specific Example of Step S230]).

Then, the processing in steps S40 to S90 described in the first embodiment is performed.

(Decoding Method)

Figure 23:
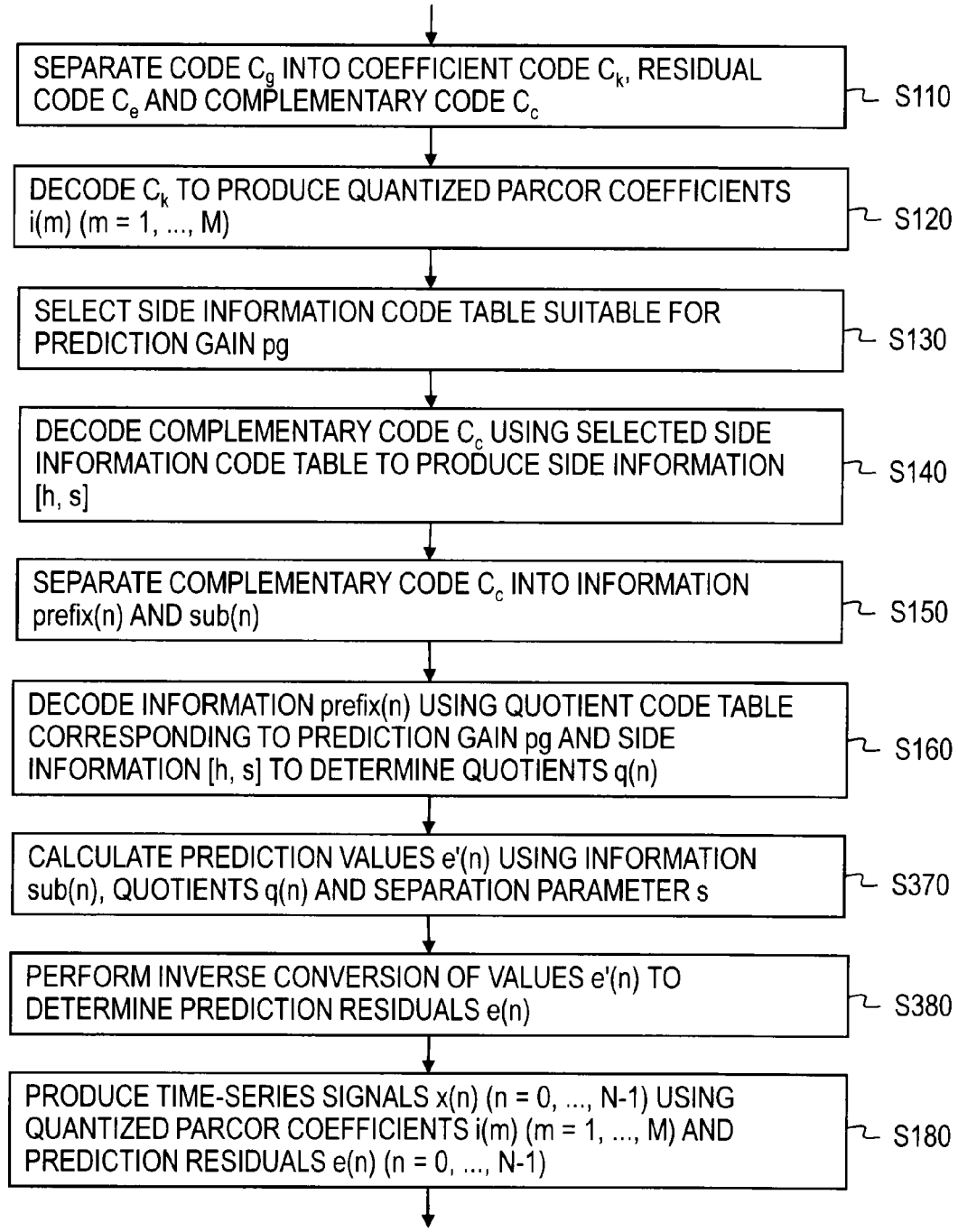
FIG. 23 is a flow chart for illustrating a decoding method according to the modification 1 of the first embodiment.
Figure 24B:
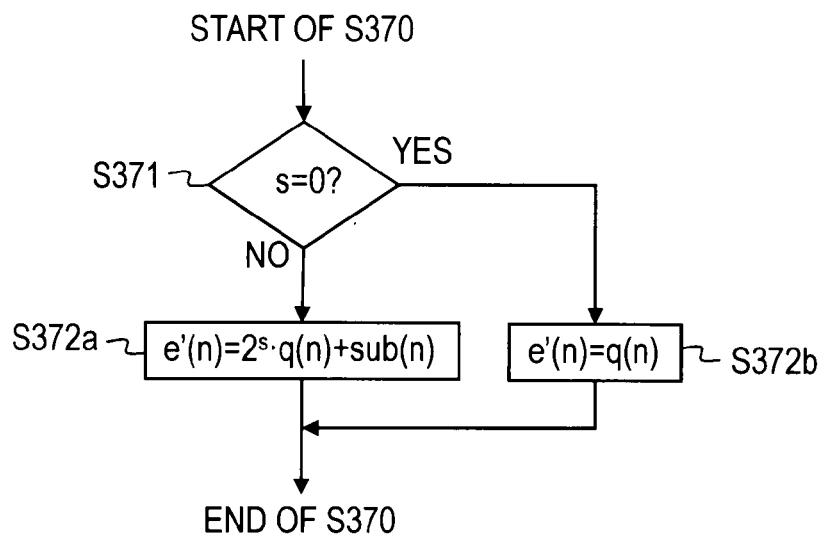
FIG. 24B is a flow chart for illustrating an example of step S370 in FIG. 23 in detail.

FIG. 23 is a flow chart for illustrating a decoding method according to the modification 1 of the first embodiment. FIG. 24B is a flow chart for illustrating an example of step S370 in FIG. 23 in detail. The decoding method according to this modification will be described below with reference to these drawings.

The processing in steps S110 to S160 described in the first embodiment is first performed, and then, the combining unit 2221b (FIG. 11) calculates the positive integer values e'(n) obtained by mapping of the prediction residuals e(n) by using the information sub(n), the quotients q(n) and the separation parameter s, and outputs the values e'(n) (step S370).

[Specific Example of Step S370]

As shown in FIG. 24B, the combining unit 2221b first determines whether or not the input separation parameter s is equal to 0 (step S371). If it is determined that the separation parameter s is not equal to 0, the combining unit 2221b calculates the values e'(n) according to the following formula (step S372a).

$$e'(n)=2^s \cdot q(n)+\text{sub}(n) \quad (29)$$

If it is determined that s=0, the combining unit 2221b calculates the values e'(n) according to the following formula (step S372b) (this is the end of the description of [Specific Example of Step S370]).

$$e'(n)=q(n) \quad (30)$$

The values e'(n) output from the combining unit 2221b are input to the signal inverse converter 225, and the signal inverse converter 225 performs inversion conversion of the values e'(n) to determine the prediction residuals e(n) and outputs the prediction residuals e(n) (step S380). The inverse conversion is the inverse conversion of the processing performed by the signal converter 126.

Then, the processing in step S180 described in the first embodiment is performed.

The formulas (5) and (9) with the values e(n) replaced with the values e'(n) may be used as alternatives to the formulas (26) and (27), and the formula (7) with the values e(n) replaced with the e'(n) may be used as an alternative to the formula (28). In this case, the formula (22) with the values e(n) replaced with the values e'(n) is used as an alternative to the formula (29), and the formula (24) with the values e(n) replaced with the values e'(n) is used as an alternative to the formula (30). The separating unit 122a may generate the integer quotients q(n) according to the formula (26) and generates the information sub(n) that identifies the remainders according to the formula (27) regardless of whether s is equal to 0 or not, and the combining unit 2221b may calculates the e'(n) according to the formula (29).

Modification 2 of First Embodiment

Next, a modification 2 of the first embodiment will be described. This modification relates to the combinations of the quotient code tables stored in the quotient code table storages 122e and 221e of the residual coding unit 120 and the residual decoding unit 220. Differences from the first embodiment will next be described mainly, and a description of commonalities with the first embodiment will be omitted.

FIGS. 25A, 26A, 27A and 27C are tables showing combinations of the separation parameter s and the quotient code table index h for different quotient code tables T1[h, s] or T2[h, s] stored in the quotient code table storages 122e and 221e. FIGS. 25B, 26B, 27B and 27D are tables showing relationships between the frequency of selection of each quotient code table shown in FIGS. 25A, 26A, 27A and 27C and the combination of the separation parameter s and the quotient code table index h. FIGS. 27E and 27F are diagrams for illustrating other examples of the code tables. FIG. 28A is a table showing combinations of the separation parameter s (upper or lower) and the quotient code table index h for different quotient code tables T2[h, s] stored in the quotient code table storages 122e and 221e. FIG. 28B is a table showing a relationship between the frequency of selection of each quotient code table shown in FIG. 28A and the combination of the separation parameter s (upper or lower) and the quotient code table index h.

According to the modification shown in FIGS. 25A and 25B, the quotient code table T1[h, s] and T2[h, s] are not set for all the combinations of the separation parameter s and the quotient code table index h within the setting range. In other words, the quotient code tables T1[h, s] and the T2[h, s] are not set for some combinations of the separation parameter s and the quotient code table index h. The symbol "-" in the tables denotes that the quotient code tables T1[h, s] and/or T2[h, s] are not set for the relevant combination of the separation parameter s and the quotient code table index h (the same holds true for the other drawings). FIGS. 25A and 25B shows no columns for the separation parameters s of 1 and 3, because the separation parameters s of 1 and 3 are intrinsically not generated in the example shown in FIGS. 25A and 25B. As in this example, all of the separation parameters s of integer values (such as 0, 1, 2, 3, 4, . . . , 7) may not be allowed within the set range, and only some of integer values (such as 0, 2, 4, 6) in the set range may be allowed. In such a case, the kinds of the side information [h, s} to be encoded by the side information coding unit 123 (FIG. 9) can be reduced, and accordingly, the code amount of the complementary code $C_c$ corresponding to the side information [h, s] can be reduced.

In the example shown in FIG. 27A, different quotient code tables T1[h, s] are not set for all different separation parameters s; instead, common quotient code tables T1[h, s] are set for all the separation parameters s. In the example shown in FIG. 27A, any of the five quotient code tables T1[0, A] to T1[4, A] is selected regardless of the value of the separation parameter s. In the example shown in FIG. 27C, one quotient code table T2[0, s] is set for each of the values of the separation parameter s of 0, 1, 2 and 3, and one quotient code table T2[0, E] is set for the other values of the separation parameter s.

As with the quotient code table T1[h, s] shown in FIG. 27A, common quotient code tables T1[h, A] and T2[h, A] may be set for all the separation parameters s. Similarly, as with the quotient code table T2[h, s] shown in FIG. 27C, one quotient code table T1[0, s] may be set for each of the values of the separation parameter s of 0, 1, 2 and 3, and one quotient code table T2[0, E] may be set for the other values of the separation parameter s.

As shown in FIGS. 27E and 27F, the quotient code table T1[0, A] or T2[0, A] depending to the prediction gain pg may be uniquely determined. In this case, the quotient code table selector 122d can compare the prediction gain pg, the PARCOR coefficient or the like with the threshold th and determine the quotient code table T1[0, A] or T2[0, A] used for encoding the quotients q(n) based only on the result of the comparison.

In the modification example shown in FIGS. 28A and 28B, for at least some values of the separation parameter s, different quotient code tables are set for the same value of the separation parameter s depending on the magnitude of the continuous quantity parameter s' corresponding to the separation parameter s. Thus, in this modification, different quotient code tables may be set for the same combination of the separation parameter s and the quotient code index h, depending on the magnitude of the continuous quantity parameter s' corresponding to the separation parameter s. This allows setting of a more optimal quotient code table and thus reduction of the code amount of the code corresponding to the quotients q(n) generated by the variable length coding.

In the example shown in FIG. 28A, for at least some of the separation parameter s, different code tables are set for the same separation parameter s, depending on whether the continuous quantity parameter s' corresponding to the separation parameter s is upper or lower. The expression "the continuous quantity parameter s' corresponding to the separation parameter s is upper" means that the continuous parameter s' belongs to the upper section of a predetermined range of the continuous quantity parameter s' quantized into the separation parameter s when the predetermined range is divided into two sections. The expression "the continuous quantity parameter s' corresponding to the separation parameter s is lower" means that the continuous parameter s' belongs to the lower section of the predetermined range of the continuous quantity parameter s' quantized into the separation parameter s when the predetermined range is divided into two sections. If the continuous quantity parameter s' within $s \leq s' < s+1$ is quantized into an integer separation parameter s, the continuous quantity parameter s' within $s \leq s' < s+0.5$ is the lower continuous quantity parameter s', and the continuous quantity parameter s' within $s+0.5 \leq s' < s+1$ is the upper continuous quantity parameter s', for example.

In the example shown in FIG. 28A, if the separation parameter s is 2, and the continuous quantity parameter s' corresponding to the separation parameter s is the lower continuous quantity parameter, quotient code tables T2[0, 2, L], T2[1, 2, L], T2[2, 2, L], T2[3, 2, L] and T2[4, 2, L] corresponding to the quotient code table indices h=0, 1, ..., 4 are set. If the separation parameter s is 2, and the continuous quantity parameter s' corresponding to the separation parameter s is the upper continuous quantity parameter, quotient code tables T2[0, 2, U], T2[1, 2, U], T2[2, 2, U], T2[3, 2, U] and T2[4, 2, U] corresponding to the quotient code table indices h=0, 1, ..., 4 are set. At least some of the quotient code tables, such as the quotient code tables T2[h, 2, L] and T2[h, 2, U], are different quotient code tables. As for the separation parameter s=1, quotient code tables T2[0, 1], T2[1, 1], T2[2, 1] and T2[3, 1] corresponding to the quotient code table indices h=0, 1, 2, 3 are set regardless of whether the continuous quantity parameter s' is upper or lower.

The quotient code tables T2[h, s, add] (add="L" or "U") set as described above are stored in the quotient code table storages 122e and 221e in association with the combinations of the quotient code table index h, the separation parameter s and the additional information add indicating whether the continuous quantity parameter s' is upper or lower, and the quotient code tables T2[h, s] are stored in the quotient code table storages 122e and 221e in association with the combinations of the quotient code table index h and the separation parameter s. The quotient code table T2[h, s, add] identified by the combination of a separation parameter s, a quotient code table index h and additional information add in the quotient code table storage 122e is the same as the quotient code table T2[h, s, add] identified by the combination of the separation parameter s, the quotient code table index h and the additional information add in the quotient code table storage 221e. The quotient code table T2[h, s] identified by the combination of a separation parameter s and a quotient code table index h in the quotient code table storage 122e is the same as the quotient code table T2[h, s] identified by the combination of the separation parameter s and the quotient code table index h in the quotient code table storage 221e. As in the first embodiment, the frequency distributions of the selected quotient code tables T2[h, s, add] and T2[h, s] (such as that shown in FIG. 28B) are trained in advance, and the side information code table Tc[2] used for encoding of the side information [h, s], which indicates combinations of the separation parameter s and the quotient code table index h, or the side information [h, s, add], which indicates combinations of the separation parameter s, the quotient code table index h and the additional information add indicating upper or lower, is stored in the side information code table storage 125 and 224. Although the quotient code tables T2[h, s, add] and T2[h, s] that belong to the set T2 are shown in FIGS. 28A and 28B and have been described above, the set T1 can also be configured in the same way. When such a quotient code table is used, the quotient code table selector 122d in the encoder 100 selects the quotient code table by further determining whether the continuous quantity parameter s' corresponding to the separation parameter s is upper or lower by using the continuous quantity parameter s' output from the parameter arithmetic unit 121a.

The modification 1 of the first embodiment and the modification 2 of the first embodiment may be combined with each other.

Second Embodiment

Next, a second embodiment of the present invention will be described. According to this embodiment, prediction residuals e(n) are obtained by prediction analysis of the time-series signals in each frame, which is a predetermined time segment, and a separation parameter $s_i$ (i=1, 2) is set for each of a plurality of sub-frames, which are time segments formed by dividing a frame. The side information corresponds to an integrated parameter S which is an integration of the separation parameters $s_i$ set for the plurality of sub-frames. Although an example in which each frame is divided into two sub-frames (i=1, 2) is shown in this embodiment, the present invention is not limited to this example. For example, each frame may be divided into three or more sub-frames (i=1, 2, ..., I (the character I denotes an integer equal to or greater than 3)). Differences from the first embodiment will next be described mainly, and a description of commonalities with the first embodiment will be omitted.

(Configuration)

Figure 29:
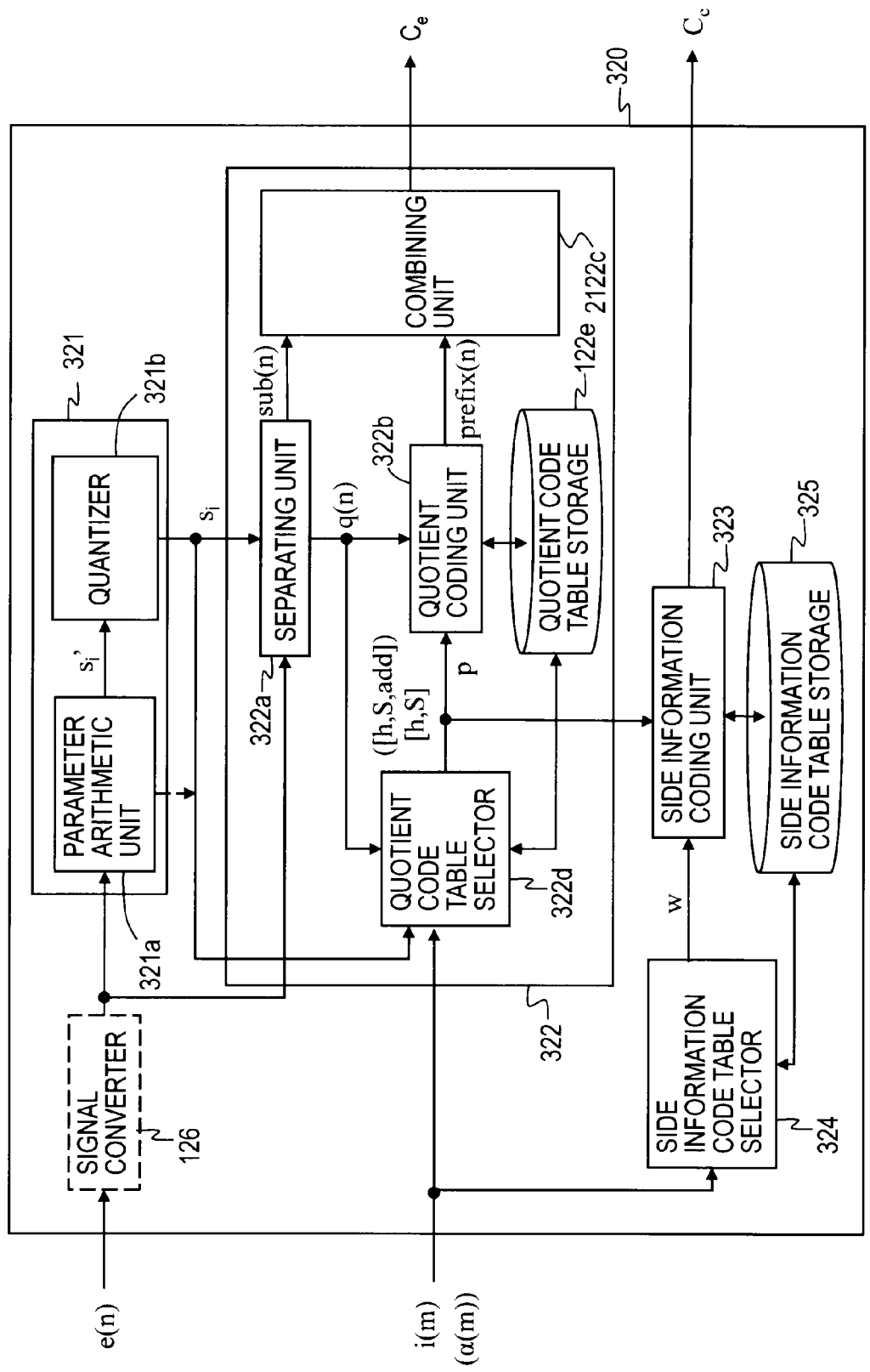
FIG. 29 is a block diagram for illustrating a functional configuration of a residual coding unit according to a second embodiment.
Figure 30:
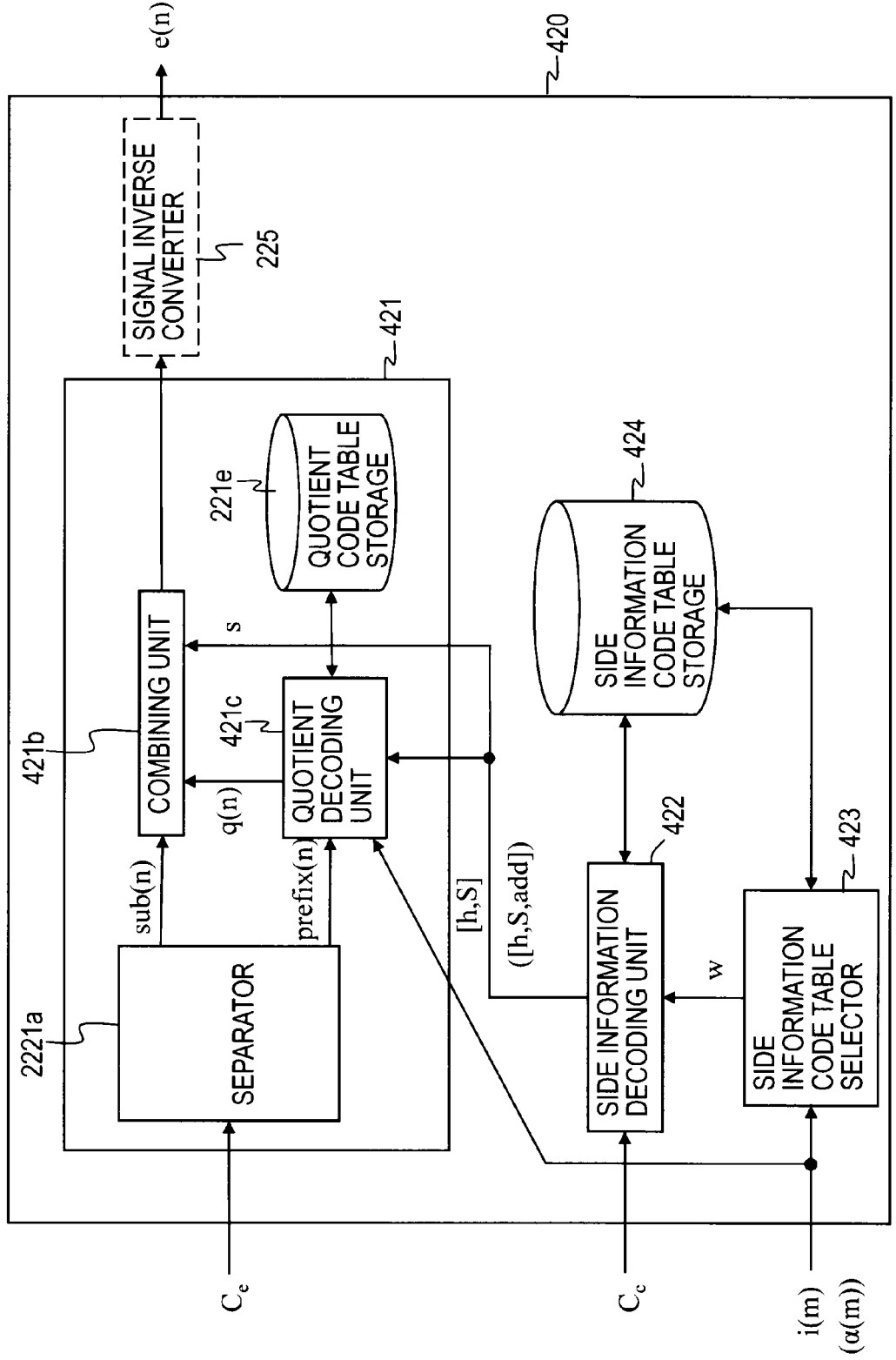
FIG. 30 is a block diagram for illustrating a functional configuration of a residual decoding unit according to the second embodiment.

FIG. 29 is a block diagram for illustrating a functional configuration of a residual coding unit 320 according to the second embodiment. FIG. 30 is a block diagram for illustrating a functional configuration of a residual decoding unit 420 according to the second embodiment. In these drawings, the same components as in the first embodiment are denoted by the same reference numerals as in the first embodiment, and descriptions thereof will be omitted.

The second embodiment differs from the first embodiment in that the residual coding unit 120 in the encoder 100 is replaced with the residual coding unit 320, and the residual decoding unit 220 in the decoder 200 is replaced with the residual decoding unit 420.

As shown in FIG. 29, the residual coding unit 320 has a separation parameter setting unit 321, an coding unit 322, a side information coding unit 323, a side information code table selector 324, and a side information code table storage 325. The separation parameter setting unit 321 has a parameter arithmetic unit 321a and a quantizer 321b. The coding unit 322 has a separating unit 322a, a combining unit 2122c, a quotient coding unit 322b, a code table selector 322d, and a code table storage 122e.

As shown in FIG. 30, the residual decoding unit 420 has a decoding unit 421, a side information decoding unit 422, a side information code table selector 423, and a side information code table storage 424. The decoding unit 421 has a separator 2221a, a combining unit 421b, a quotient decoding unit 421c, and a code table storage 221e.

(Preprocessing)

Next, a preprocessing according to this embodiment will be described.

[Quotient Code Table]

As in the first embodiment, according to this embodiment, as a preprocessing for the encoding process and the decoding process, a plurality of sets of quotient code tables are set for different prediction gains pg. The quotient code tables T1[h, s] that belong to the set T1 of quotient code tables and the quotient code tables T2[h, s] that belong to the set T2 of quotient code tables are stored in the quotient code table storage 122e in the residual coding unit 320 (FIG. 29) and the quotient code table storage 221e in the residual decoding unit 420 (FIG. 30). The separation parameter s corresponding to the quotient code tables T1[h, s] and T2[h, s] is a separation parameter $s_1$ for the first half sub-frame of each frame or a separation parameter $s_2$ for the second half sub-frame.

[Side Information Code Table]

According to this embodiment, information including combinations of the integrated parameter $S=s_1|s_2$, which is an integration of the separation parameters $s_i$ (i=1, 2) set for the sub-frames of a frame, and the quotient code table index h that identifies the encoding method selected for the frame is defined as side information [h, S].

On the criterion to minimize the total code amount for a frame, the frequency distribution of the quotient code tables selected for variable length coding of the quotients q(n) is biased, and the frequency distribution of the quotient code table indices h that identify the quotient code tables is biased. The frequency distribution of the separation parameters $s_i$ selected on the criterion to minimize the total code amount for a sub-frame is also biased. Therefore, the frequency distribution of the integrated parameters $S=s_1|s_2$, each of which is an integration of the separation parameters $s_i$ for the sub-frames of a frame, is also biased. In addition, the frequency distribution of the separation parameters $s_i$ and the quotient code table indices h selected are correlated with the prediction gain pg (Properties 1 to 7).

FIG. 31A is a table showing a relationship between the frequency of selection of each quotient code table in the set T1 suitable for the prediction gain pg selected for each frame by the code table selector 322d in the residual coding unit 320 and the combination of the integrated parameter S, which is an integration of the separation parameters $s_i$ for the frame, and the quotient code table index h, and FIG. 31B is a table showing a relationship between the frequency of selection of each quotient code table in the set T2 suitable for the prediction gain pg selected for each frame by the code table selector 322d in the residual coding unit 320 and the combination of the integrated parameter S, which is an integration of the separation parameters $s_i$ for the frame, and the quotient code table index h. In FIGS. 31, S=01 means that the separation parameter $s_1$ for the first half sub-frame is 0, and the separation parameter $s_2$ for the second half sub-frame is 1. In FIG. 31A, the frequency of selection of the quotient code table T1[h, $s_1$] (or T1[h, $s_2$]) for each frame is shown in each field identified by the quotient code table index h and the integrated parameter $S=s_1|s_2$. In FIG. 31B, the frequency of selection of the quotient code table T2[h, $s_1$] (or T2[h, $s_2$]) for each frame is shown in each field identified by the quotient code table index h and the integrated parameter $S=s_1|s_2$. The frequency is indicated in the same way as in the first embodiment.

As shown in FIGS. 31A and 31B, the frequency distribution of the quotient code table indices h and the frequency distribution of the integrated parameters $S=s_1|s_2$ are biased and correlated with the prediction gain pg. According to this embodiment, based on these characteristics, variable length coding of the side information [h, S] is performed by using the side information code table suitable for the prediction gain pg, thereby improving the encoding compressibility.

To this end, in the preprocessing according to this embodiment, the frequency distribution of the quotient code table indices h and the frequency distribution of the integrated parameters $S=s_1|s_2$ suitable for the prediction gain pg (FIGS. 31A and 31B) are trained in advance. Then, based on the trained frequency distributions, a plurality of sets of side information code tables suitable for the prediction gain pg are set and stored in the side information code table storage 325 in the residual coding unit 320 and the side information code table storage 424 in the residual decoding unit 420. Each side information code table corresponds to a prediction gain within a certain range. In the encoding process according to this embodiment described later, variable length coding of the side information [h, S] is performed by using a side information code table suitable for the prediction gain pg corresponding to the time-series signals x(n) (n=0, . . . , N−1). The configuration and characteristics of the side information code table are the same as those in the first embodiment except that the side information [h, s] is replaced with the side information [h, S].

(Encoding Method)

Next, an encoding method according to the second embodiment will be described.

Figure 32:
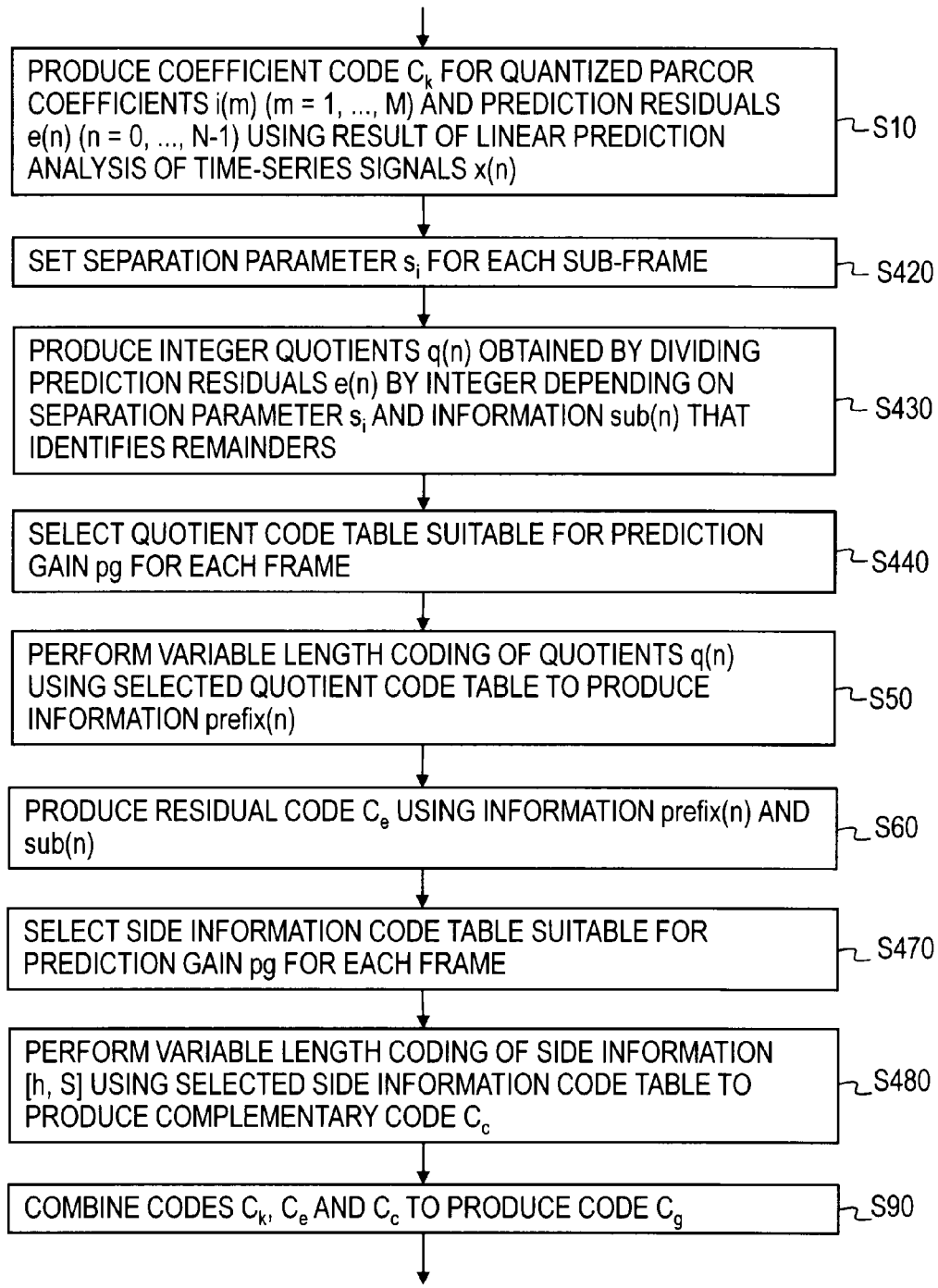
FIG. 32 is a flow chart for illustrating an encoding method according to the second embodiment.

FIG. 32 is a flow chart for illustrating the encoding method according to the second embodiment. The encoding method according to this embodiment will be described below with reference to the drawing.

The processing in step S10 described in the first embodiment is performed, and then, the prediction residuals e(n) input to the residual coding unit 320 (FIG. 29) are fed into the separation parameter setting unit 321. The separation parameter setting unit 321 sets an integer separation parameter $s_i$ (i=1, 2) that depends on the absolute values of the prediction residuals e(n) for each sub-frame (step S420). This processing can be performed by performing the processing in step S20 described in the first embodiment, which is performed for each frame, for each sub-frame. More specifically, for example, the parameter arithmetic unit 321a calculates a continuous quantity parameter $s_i'$ for each sub-frame according to a formula obtained by replacing N in the formula (21) with the number of sampled sub-frames, and the quantizer 321b quantizes the calculated continuous quantity parameter $s_i'$ into an integer value, which is the separation parameter $s_i$ for the sub-frame.

Then, the prediction residuals e(n) input to the residual coding unit 320 and the separation parameter $s_i$ for each sub-frame output from the separation parameter setting unit 321 are input to the separating unit 322a in the coding unit 322. The separation parameter $s_i$ is set for the sub-frame of the input prediction residuals e(n). Using these values, the separating unit 322a generates integer quotients q(n) by dividing the prediction residuals e(n) or integers equal to or greater than 0 that monotonically increase with the absolute value of the prediction residuals e(n) by integers that depend on the separation parameters $s_i$, and information sub(n) that identifies the remainders (step S430). Details of step S430 are the same as the exemplary details of step S30 described above, for example.

Then, the quotients q(n) output from the separating unit 322a, the separation parameter $s_1$ (or $s_2$) output from the separation parameter setting unit 321 and the quantized PARCOR coefficients i(m) (m=1, . . . , M) output from the quantizer 2113 are input to the code table selector 322d. Using these pieces of information, the quotient code table selector 322d selects, for each frame, a quotient code table suitable for the prediction gain pg from the sets T1 and T2 of quotient code tables used for variable length coding of the quotients q(n) stored in the quotient code table storage 322e (step S440). According to this embodiment, the separation parameter $s_i$ is set for each sub-frame, whereas the quotient code table is selected for each frame. Details of step S440 are the same as details of step S40 according to the first embodiment except that the separation parameter $s_1$ (or $s_2$) set for each sub-frame is used instead of the separation parameter s set for each frame.

Then, the processing in steps S50 and S60 described in the first embodiment is performed, and then, the quantized PARCOR coefficients i(m) (m=1, . . . , M) output from the quantizer 2113 are input to the side information code table selector 324. Using this information, the side information code table selector 324 selects, for each frame, a side information code table suitable for the prediction gain pg from a set of side information code tables including the side information code tables used for variable length coding of the side information [h, S] based on a determination criterion corresponding to the prediction effectiveness of the time-series signals x(n) (in other words, a determination criterion for determining information corresponding to the index representing the prediction effectiveness of the time-series signals x(n)), and outputs a parameter w that identifies the selected side information code table (step S470). Details of this processing are the same as those of step S70 in the first embodiment described above except that the side information [h, S] is used instead of the side information [h, s].

Then, the side information [h, S] output from the quotient code table selector 322d and the parameter w output from the side information code table selector 324 are input to the side information coding unit 323. The side information coding unit 323 extracts the side information code table identified by the parameter w from the side information code table storage 325. Then, using the extracted side information code table, the information coding unit 323 performs variable length coding of each piece of side information [h, S] to generate a complementary code $C_c$ corresponding to the side information [h, S] (step S480).

Then, the processing in step S90 described in the first embodiment is performed.

(Decoding Method)

Figure 33:
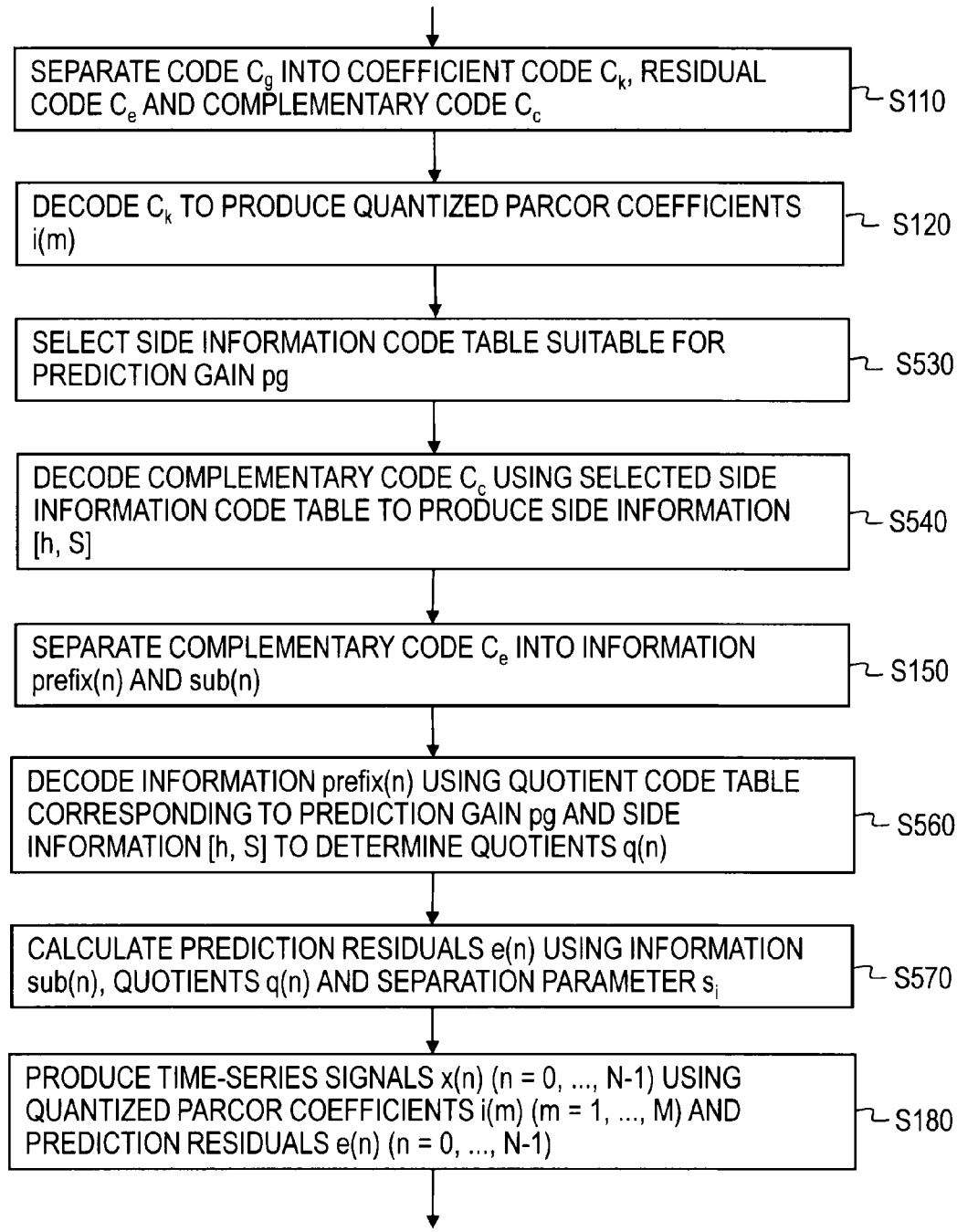
FIG. 33 is a flow chart for illustrating a decoding method according to the second embodiment.

FIG. 33 is a flow chart for illustrating a decoding method according to the second embodiment. The decoding method according to this embodiment will be described below with reference to this drawing.

The processing in steps S110 and S120 described in the first embodiment is first performed. The quantized PARCOR coefficients i(m) (m=1, ..., M) generated in step S120 are input to the side information code table selector 423 in the prediction decoding unit 420 (FIG. 30). Using the quantized PARCOR coefficients i(m) (m=1, ..., M), the side information code table selector 423 selects a side information code table suitable for the prediction gain pg from a set of side information code tables including the side information code tables used for decoding of the complementary code $C_c$ corresponding to the side information [h, S] based on a determination criterion corresponding to the prediction effectiveness of the time-series signals x(n) (in other words, a determination criterion for determining information corresponding to the index representing the prediction effectiveness of the time-series signals x(n)), and outputs a parameter w that identifies the selected side information code table (step S530). Details of this processing are the same as those of step S130 in the first embodiment described above except that the side information [h, S] is used instead of the side information [h, s].

Then, the complementary code $C_c$ corresponding to the side information [h, S] and the parameter w that identifies the side information code table selected in step S530 are input to the side information decoding unit 422. The side information decoding unit 422 extracts the side information code table identified by the parameter w from the side information code table storage 424. Then, using the extracted side information code table, the side information decoding unit 422 decodes the complementary code $C_c$ corresponding to the side information [h, S] to generate the side information [h, S] including the set of the integrated parameter S and the quotient code table index h (step S540).

Then, the processing in step S150 described in the first embodiment is performed. Then, the side information [h, S] output from the side information decoding unit 422, the information prefix(n) output from the separator 2221a and the quantized PARCOR coefficients i(m) (m=1, ..., M) output from the coefficient decoding unit 2231 are input to the quotient decoding unit 421c. The quotient decoding unit 421c decodes the information prefix(n) to generate the quotients by using the quotient code table corresponding to the prediction gain pg and the side information [h, S] identified by these input information, and outputs the quotients q(n) (step S560).

Then, the quotients q(n) output from the quotient decoding unit 421c, the information sub(n) output from the separator 2221a and the separation parameter $s_i$ included in the side information [h, S] output from the side information decoding unit 422 are input to the combining unit 2221b. The combining unit 2221b calculates the prediction residuals e(n) for each sub-frame using these pieces of information and outputs the prediction residuals e(n) (step S570). Details of step S570 are the same as those of step S170 in the first embodiment described above except that the separation parameter $s_i$ is used instead of the separation parameter s, and the processing is performed for each sub-frame instead of for each frame.

Then, the processing in step S180 described in the first embodiment is performed.

Modifications of Second Embodiment

The modification 1 of the first embodiment may be applied to the second embodiment. That is, the residual coding unit 320 may further have a signal converter 126, and the residual decoding unit 420 may further have a signal inverse converter 225. In this case, the prediction residuals e(n) can be mapped to integers e'(n) equal to or greater than 0 before the setting and encoding of the separation parameters described in this embodiment, and the prediction residuals e(n) can be reproduced by inverse conversion of the integers e'(n) reproduced by the decoding process described in this embodiment.

The modification 2 of the first embodiment can also be applied to the second embodiment. That is, the modification 2 of the first embodiment can be applied to this embodiment by replacing the separation parameter s of the quotient code table with the integrated parameter S. Furthermore, both the modifications 1 and 2 of the first embodiment can be applied to the second embodiment at the same time.

Third Embodiment

Next, a third embodiment of the present invention will be described. According to this embodiment, prediction residuals e(n) are obtained by prediction analysis of the time-series signals in each frame, which is a predetermined time segment, a quotient code table used for variable length coding of the quotients q(n) is selected for each of a plurality of sub-frames, which are time segments formed by dividing a frame, and the quotient code table set for the sub-frame to which the prediction residuals e(n) corresponding to the quotients q(n) belong is used to perform variable length coding of the quotients q(n). Information including combinations of the separation parameter s and an integrated index H, which is an integration of the indices $h_i$ (i=1, 2) that identify the quotient code tables selected for the sub-frames of a frame, is defined as side information [H, s]. Although an example in which each frame is divided into two sub-frames (i=1, 2) is shown in this embodiment, the present invention is not limited to this example. For example, each frame may be divided into three or more sub-frames (i=1, 2, ..., I (the character I denotes an integer equal to or greater than 3)). Differences from the first embodiment will next be described and a description of commonalities with the first embodiment will be omitted.

(Configuration)

Figure 34:
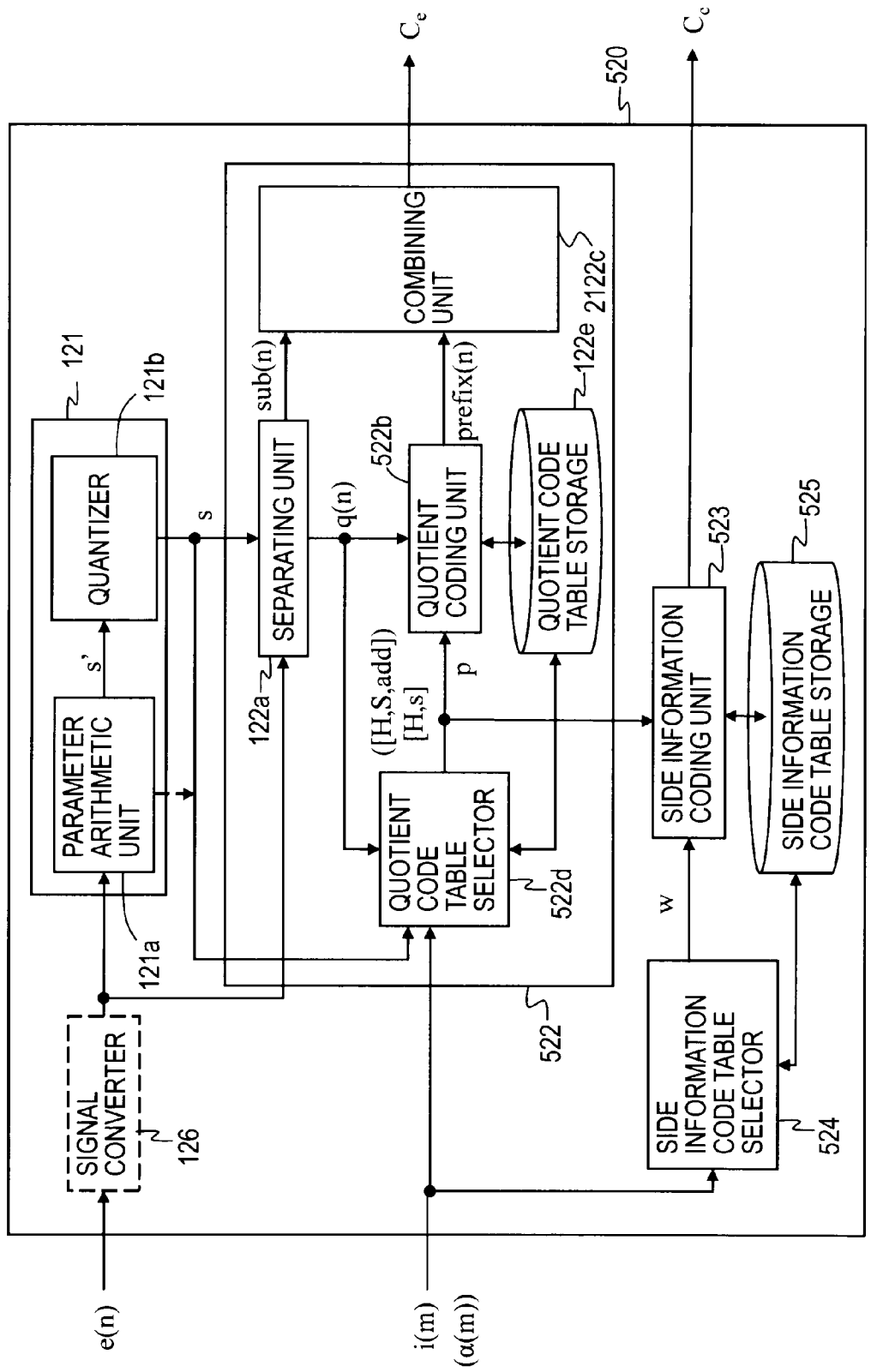
FIG. 34 is a block diagram for illustrating a functional configuration of a residual coding unit according to a third embodiment.
Figure 35:
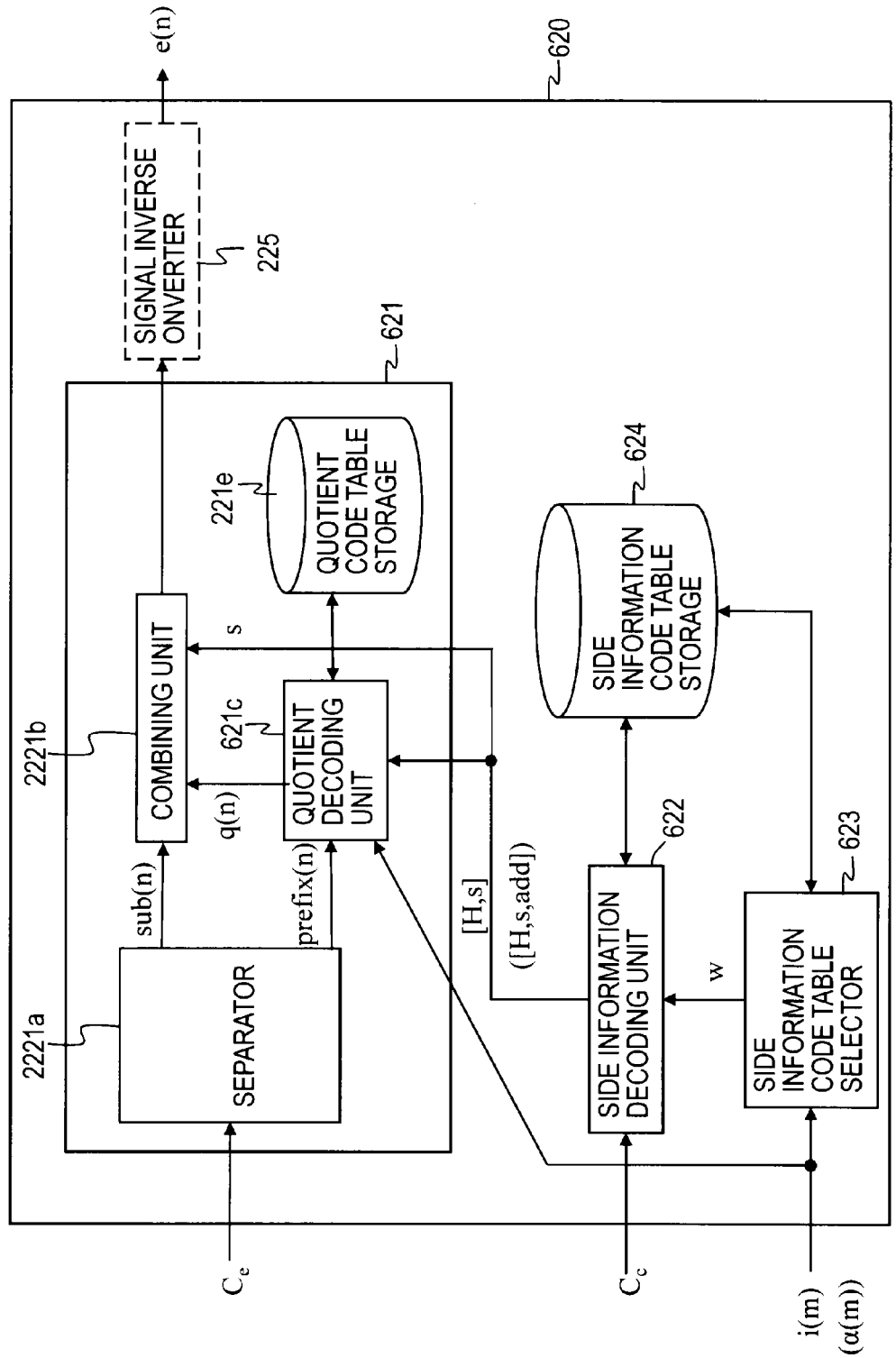
FIG. 35 is a block diagram for illustrating a functional configuration of a residual decoding unit according to the third embodiment.

FIG. 34 is a block diagram for illustrating a functional configuration of a residual coding unit 520 according to the third embodiment. FIG. 35 is a block diagram for illustrating a functional configuration of a residual decoding unit 620 according to the third embodiment. In these drawings, the same components as in the first embodiment are denoted by the same reference numerals as in the first embodiment, and descriptions thereof will be omitted.

The third embodiment differs in configuration from the first embodiment in that the residual coding unit 120 in the encoder 100 is replaced with the residual coding unit 520, and the residual decoding unit 220 in the decoder 200 is replaced with the residual decoding unit 620.

As shown in FIG. 34, the residual coding unit 520 has a separation parameter setting unit 121, an coding unit 522, a side information coding unit 523, a side information code table selector 524, and a side information code table storage 525. The coding unit 522 has a separating unit 122a, a combining unit 2122c, a quotient coding unit 522b, a code table selector 522d, and a code table storage 122e.

As shown in FIG. 35, the residual decoding unit 620 has a decoding unit 621, a side information decoding unit 622, a side information code table selector 623, and a side information code table storage 624. The decoding unit 621 has a separator 2221a, a combining unit 2221b, a quotient decoding unit 621c, and a code table storage 221e.

(Preprocessing)

Next, a preprocessing according to this embodiment will be described.

[Quotient Code Table]

As in the first embodiment, according to this embodiment, as a preprocessing for the encoding process and the decoding process, a plurality of sets of quotient code tables are set for different prediction gains pg. The quotient code tables T1[h, s] that belong to the set T1 of quotient code tables and the quotient code tables T2[h, s] that belong to the set T2 of quotient code tables are stored in the quotient code table storage 122e in the residual coding unit 520 (FIG. 34) and the quotient code table storage 221e in the residual decoding unit 620 (FIG. 35).

[Side Information Code Table]

According to this embodiment, information including the integrated index $H = h_1 | h_2$, which is an integration of the quotient code table indices $h_i$ (i=1, 2) that identify the quotient code tables selected for the sub-frames of a frame, and the separation parameter s set for the frame is defined as side information [H, s].

On the criterion to minimize the total code amount for a frame, the frequency distribution of the quotient code tables selected for variable length coding of the quotients q(n) is biased, and the frequency distribution of integrated indices H, each of which is an integration of the quotient code table indices $h_i$ that identify the quotient code tables, is biased. The frequency distribution of the separation parameters s selected on the criterion to minimize the total code amount for the sub-frames is also biased. In addition, the frequency distribution of the separation parameters s and the quotient code table indices $h_i$ selected are correlated with the prediction gain pg (Properties 1 to 7).

FIG. 36A is a table showing a relationship between the frequency of selection of each quotient code table in the set T1 suitable for the prediction gain pg selected for each sub-frame of a frame by the code table selector 522d in the residual coding unit 520 and the combination of the separation parameter s and the integrated index H, which is an integration of the quotient code table indices $h_i$ for the frame, and FIG. 36B is a table showing a relationship between the frequency of selection of each quotient code table in the set T2 suitable for the prediction gain pg selected for each sub-frame of a frame by the code table selector 522d in the residual coding unit 520 and the combination of the separation parameter s and the integrated index H, which is an integration of the quotient code table indices $h_i$ for the frame. In FIG. 36, H=01 means that the quotient code table index $h_1$ for the first half sub-frame is 0, and the quotient code table index $h_2$ for the other sub-frame is 1. In FIG. 36A, the frequency that the quotient code table T1[$h_1$, s] is selected for the first half sub-frame, and the quotient code table T1[$h_2$, s] is selected for the second half sub-frame is shown in each field identified by the integrated index H and the separation parameter s. In FIG. 36B, the frequency that the quotient code table T2[$h_1$, s] is selected for the first half sub-frame, and the quotient code table T2[$h_2$, s] is selected for the second half sub-frame is shown in each field identified by the integrated index H and the separation parameter s. The frequency is indicated in the same way as in the first embodiment.

As shown in FIGS. 36A and 36B, the frequency distribution of the integrated indices H and the frequency distribution of the separation parameters s are biased and correlated with the prediction gain pg. According to this embodiment, based on these characteristics, variable length coding of the side information [H, s] is performed by using the side information code table suitable for the prediction gain pg, thereby improving the encoding compressibility.

To this end, in the preprocessing according to this embodiment, the frequency distribution of the integrated indices H suitable for the prediction gain pg and the frequency distribution of the separation parameters s (FIGS. 36A and 36B) are trained in advance. Then, based on the trained frequency distributions, a plurality of sets of side information code tables suitable for the prediction gain pg are set and stored in the side information code table storage 525 in the residual coding unit 520 and the side information code table storage 624 in the residual decoding unit 620. Each side information code table corresponds to a prediction gain within a certain range. In the encoding process according to this embodiment described later, variable length coding of the side information [H, s] is performed using a side information code table suitable for the prediction gain pg for the time-series signals x(n) (n=0, . . . , N−1). The configuration and characteristics of the side information code table are the same as those in the first embodiment except that the side information [H, s] is used instead of the side information [h, s].

(Encoding Method)

Figure 37:
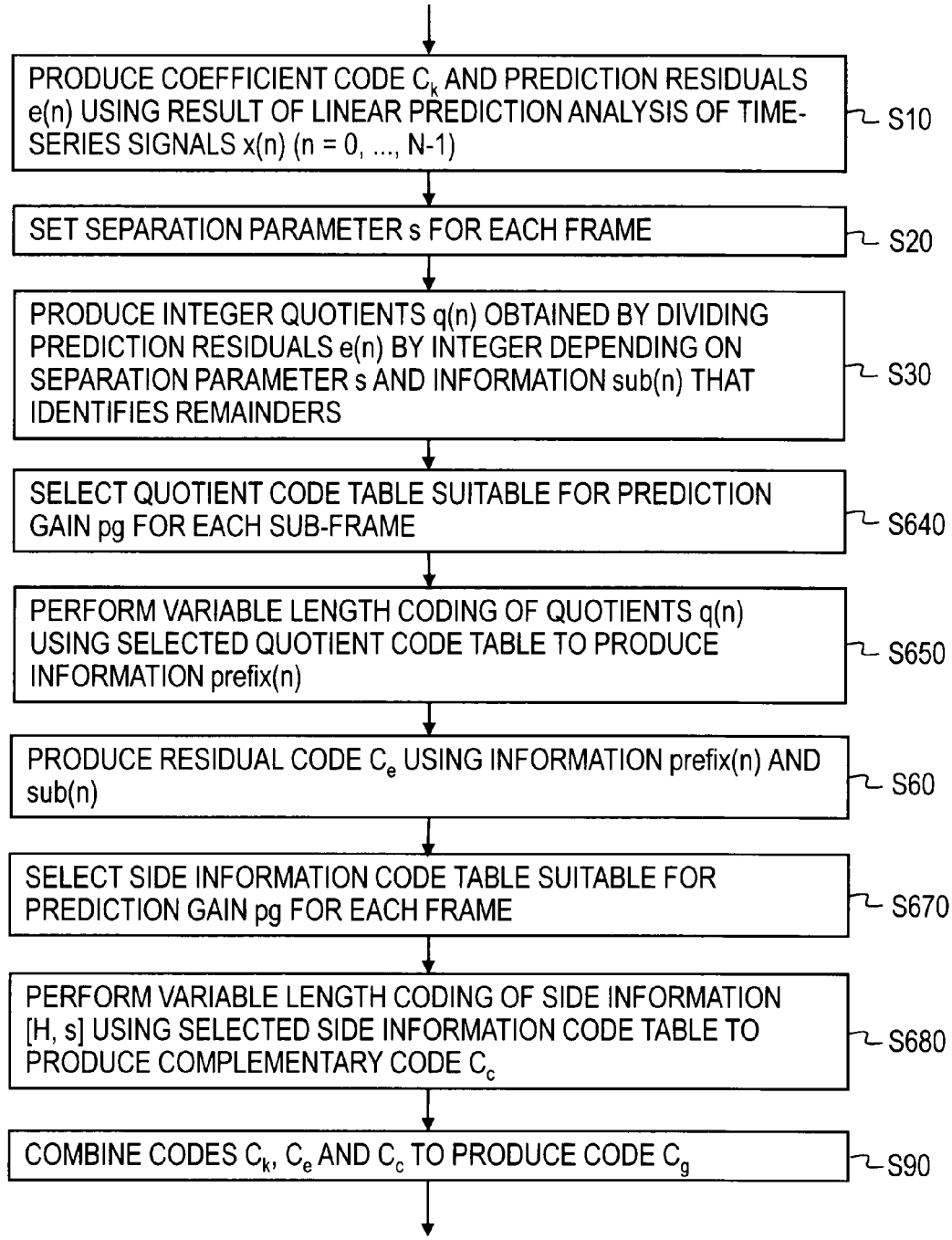
FIG. 37 is a flow chart for illustrating an encoding method according to the third embodiment.

FIG. 37 is a flow chart for illustrating an encoding method according to the third embodiment. The encoding method according to this embodiment will be described below with reference to the drawing.

The processing in steps S10 to S30 described in the first embodiment is performed, and then, the quotients q(n) output from the separating unit 122a, the separation parameter s output from the separation parameter setting unit 121 and the quantized PARCOR coefficients i(m) (m=1, . . . , M) output from quantizer 2113 are input to the quotient code table selector 522d (FIG. 34). Using these pieces of information, the quotient code table selector 522d selects, for each sub-frame, a quotient code table suitable for the prediction gain pg from the sets T1 and T2 of quotient code tables used for variable length coding of the quotients q(n), stored in the quotient code table storage 122e (step S640). Details of step S640 are the same as details of step S40 according to the first embodiment except that the quotient code table is selected for each sub-frame.

Then, the quotient code table selector 522d passes a parameter p that identifies the set T1 or T2 to which the quotient code table T1[$h_i$, s] or T2[$h_i$, s] selected for each sub-frame in step S640 belongs and the side information [H, s] corresponding to the selected quotient code table T1[$h_i$, s] or T2[$h_i$, s] to the quotient coding unit 522b. The quotients q(n) output from the separating unit 122a for the frame comprising the sub-frames are also input to the quotient coding unit 522b. Using these pieces of information, the quotient coding unit 522b searches the quotient code table storage 122e to extract the quotient code table T1[$h_i$, s] or T2[$h_i$, s] corresponding to the parameter p and the side information [$h_i$, s]. Then, using the extracted quotient code table T1[$h_i$, s] or T2[$h_i$, s] for each sub-frame, the quotient coding unit 522b performs variable length coding of the quotients q(n) to generate the information prefix(n), which is a code corresponding to the quotients q(n) (step S650).

Then, the processing in step S60 described in the first embodiment is performed, and then, the quantized PARCOR coefficients i(m) (m=1, . . . , M) output from the quantizer 2113 are input to the side information code table selector 524. Using this information, the side information code table selector 524 selects, for each frame, a side information code table suitable for the prediction gain pg from a set of side information code tables including the side information code tables used for variable length coding of the side information [H, s] based on a determination criterion corresponding to the prediction effectiveness of the time-series signals x(n) (in other words, a determination criterion for determining information corresponding to the index representing the prediction effectiveness of the time-series signals x(n)), and outputs a parameter w that identifies the selected side information code table (step S670). Details of step S670 are the same as those of step S70 in the first embodiment except that the side information [H, s] is used instead of the side information [h, s].

Then, the side information [H, s] output from the quotient code table selector 522d and the parameter w output from the side information code table selector 524 are input to the side information coding unit 523. The side information coding unit 523 extracts the side information code table identified by the parameter w from the side information code table storage 525. Then, using the extracted side information code table, the information coding unit 523 performs variable length coding of each piece of side information [H, s] to generate a complementary code $C_c$ corresponding to the side information [H, s] (step S680).

Then, the processing in step S90 described in the first embodiment is performed.

(Decoding Method)

Figure 38:
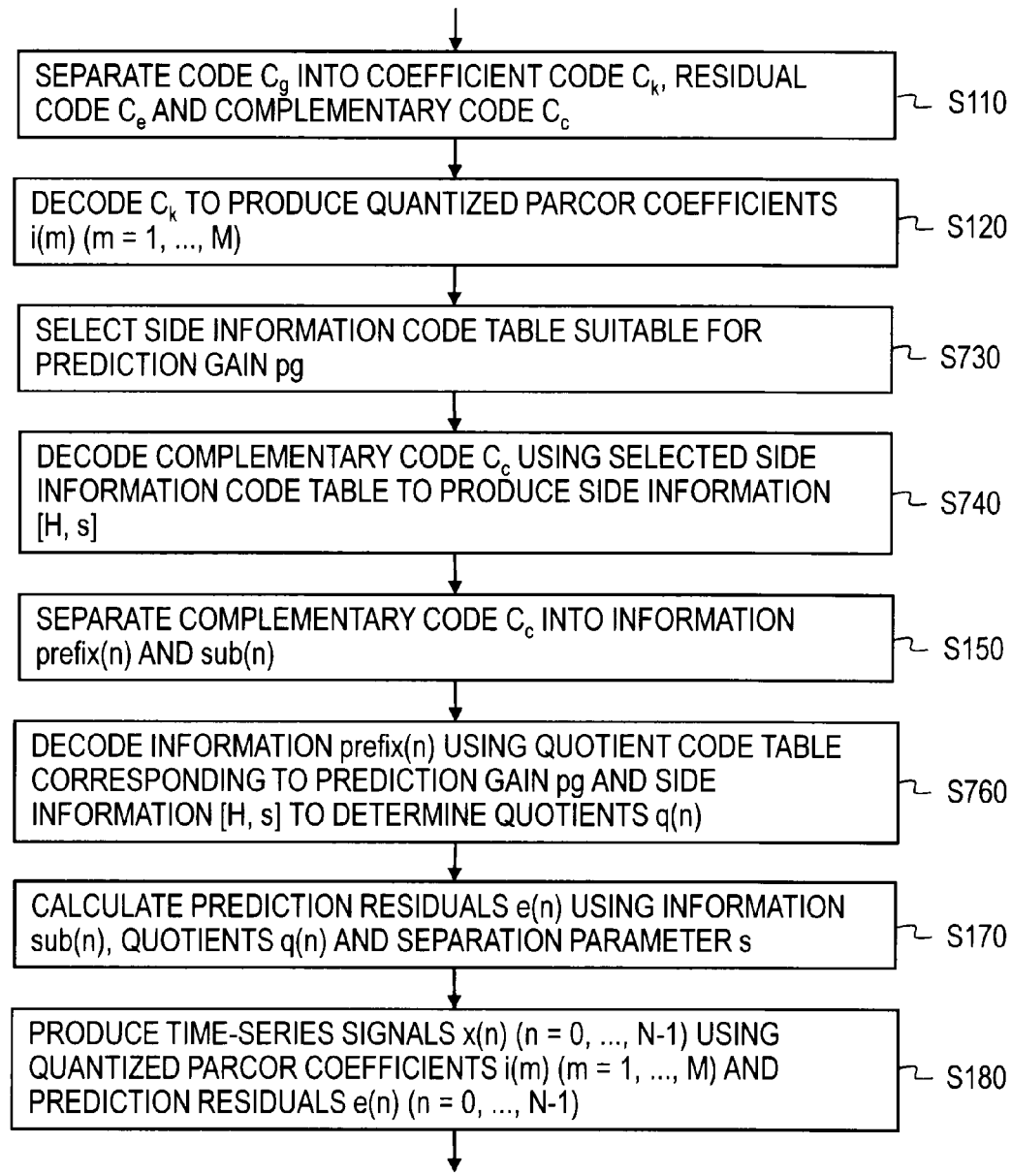
FIG. 38 is a flow chart for illustrating a decoding method according to the third embodiment.

FIG. 38 is a flow chart for illustrating a decoding method according to the third embodiment. The decoding method according to this embodiment will be described below with reference to this drawing.

The processing in steps S110 and S120 described in the first embodiment is first performed. Then, using the generated quantized PARCOR coefficients i(m) (m=1, . . . , M), the side information code table selector 623 (FIG. 35) selects a side information code table suitable for the prediction gain pg from a set of side information code tables including the side information code tables used for decoding of the complementary code $C_c$ corresponding to the side information [H, s], and outputs the parameter w that identifies the selected side information code table (step S730). Details of the processing in step S730 are the same as those of step S130 in the first embodiment except that the side information [H, s] is used instead of the side information [h, s].

Then, the complementary code $C_c$ corresponding to the side information [H, s] and the parameter w that identifies the side information code table selected in step S730 are input to the side information decoding unit 622. The side information decoding unit 622 extracts the side information code table identified by the parameter w from the side information code table storage 624. Then, using the extracted side information code table, the side information decoding unit 622 decodes the complementary code $C_c$ corresponding to the side information [H, s] to generate the side information [H, s] including the set of the separation parameter s and the integrated index H (step S740).

Then, the processing in step S150 described in the first embodiment is performed. Then, the side information [H, s] output from the side information decoding unit 622, the information prefix(n) output from the separator 2221a and the quantized PARCOR coefficients i(m) (m=1, . . . , M) output from the coefficient decoding unit 2231 are input to the quotient decoding unit 621c. The quotient decoding unit 621c decodes the information prefix(n) by using each sub-frame's quotient code table corresponding to the prediction gain pg and the side information [H, s] identified by these pieces of information to generate the quotients q(n), and outputs the quotients q(n) (step S760). Details of the processing in step S760 are the same as in step S160 according to the first embodiment except that the side information [H, s] is used instead of the side information [h, s] and the quotient code table is selected for each sub-frame.

Then, the processing in steps S170 and S180 described in the first embodiment is performed.

Modifications of Third Embodiment

The modification 1 of the first embodiment may be applied to the third embodiment. That is, the residual coding unit 520 may further have a signal converter 126, and the residual decoding unit 620 may further have a signal inverse converter 225. In this case, the prediction residuals e(n) can be mapped to integers e'(n) equal to or greater than 0 before the setting and encoding of the separation parameter described in this embodiment, and the prediction residuals e(n) can be reproduced by inverse conversion of the integers e'(n) reproduced by the decoding process described in this embodiment.

The modification 2 of the first embodiment can also be applied to the third embodiment. That is, the modification 2 of the first embodiment can be applied to this embodiment by replacing the quotient code table index h with the integrated index H. Furthermore, both the modifications 1 and 2 of the first embodiment can be applied to the third embodiment at the same time.

As a further alternative, the second embodiment and the third embodiment may be combined with each other. That is, variable length coding using a side information code table suitable for the prediction gain pg may be performed on side information [S, H] including the integrated parameter S, which is an integration of the separation parameters s, set for the sub-frames of a frame, and the integrated index H, which is an integration of the quotient code table indices $h_i$ that identify the quotient code tables selected for the sub-frame of a frame. FIG. 39 is a table showing a relationship between the frequency of selection of the quotient code table selected for each frame and the combination of the integrated parameter S, which is an integration of the separation parameters $s_i$ for the frame, and the integrated index H, which is an integration of the quotient code table indices $h_i$ for the frame, according to this modification.

Fourth Embodiment

Next, a fourth embodiment of the present invention will be described. According to this embodiment, prediction residuals e(n) generated based on the result of long-term prediction are encoded. Differences from the first embodiment will next be described mainly, and a description of commonalities with the first embodiment will be omitted.

(Configuration)

Figure 40:
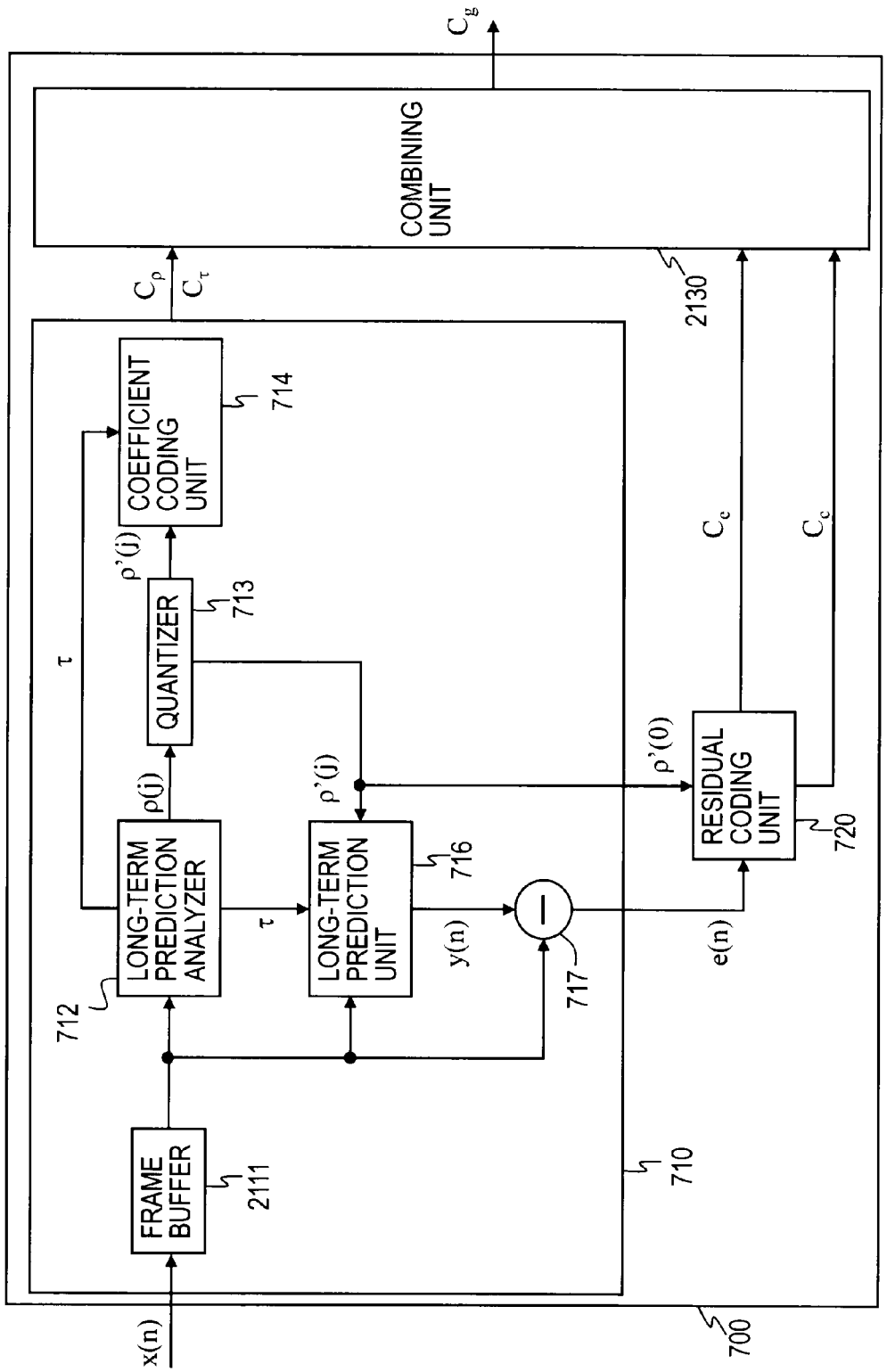
FIG. 40 is a block diagram for illustrating a functional configuration of an encoder according to a fourth embodiment.
Figure 41:
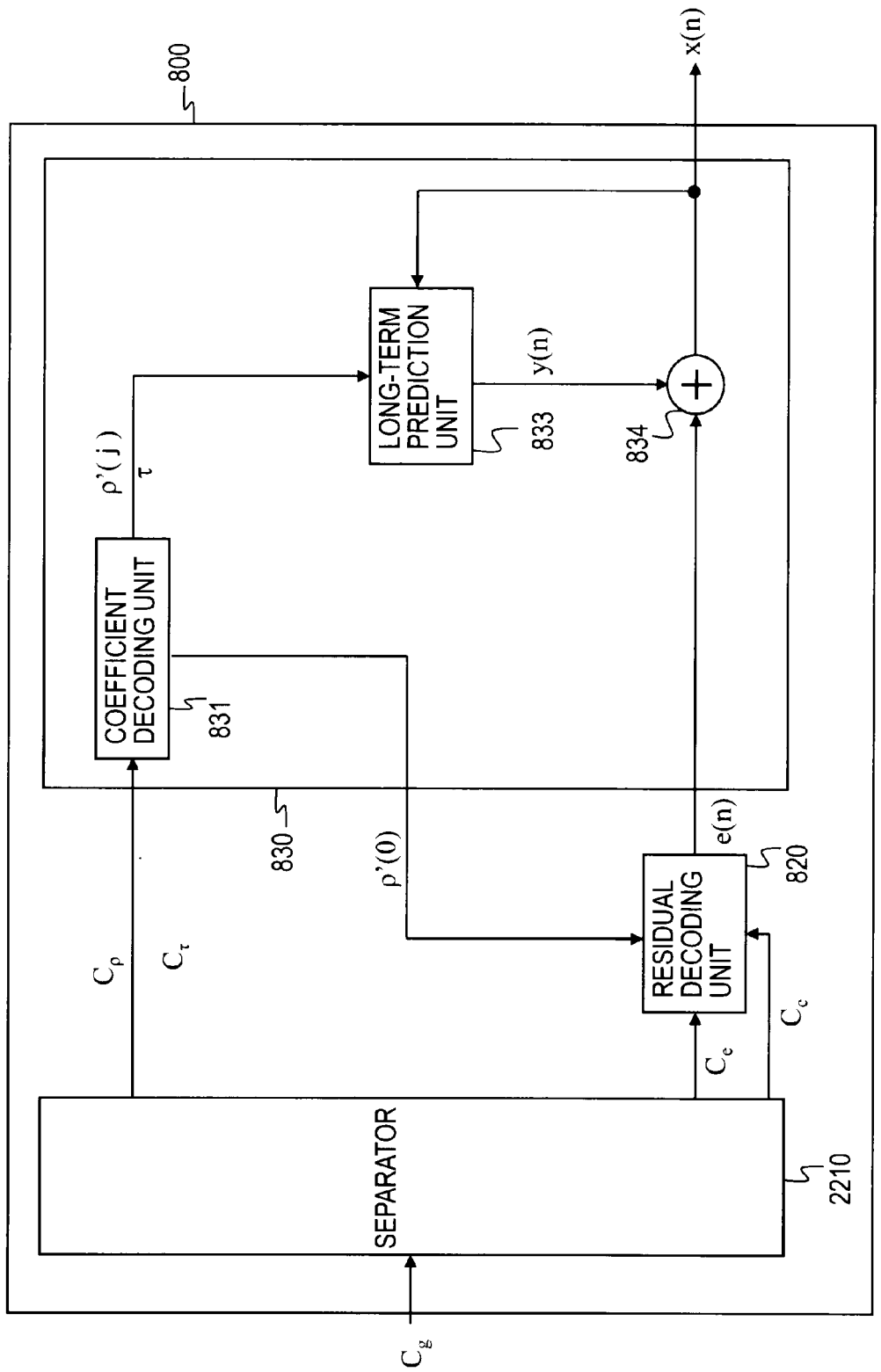
FIG. 41 is a block diagram for illustrating a functional configuration a decoder according to the fourth embodiment.

FIG. 40 is a block diagram for illustrating a functional configuration of an encoder 700 according to the fourth embodiment. FIG. 41 is a block diagram for illustrating a functional configuration a decoder 800 according to the fourth embodiment. In these drawings, the same components as described earlier are denoted by the same reference numerals, and descriptions thereof will be omitted.

As shown in FIG. 40, the encoder 700 according to this embodiment has a prediction coding unit 710, a residual coding unit 720 and a combining unit 2130. The configuration of the residual coding unit 720 is the same as that of the residual coding unit 120 according to the first embodiment except that the residual coding unit 720 uses a coefficient (a gain) obtained by long-term prediction instead of the coefficient (the PARCOR coefficient, for example) obtained by linear prediction. In this embodiment, FIG. 9 showing the residual coding unit 120 according to the first embodiment will be used to describe the residual coding unit 720 in detail.

As shown in FIG. 41, the decoder 800 according to this embodiment has a separator 2210, a residual decoding unit 820 and a prediction decoding unit 830. The configuration of the residual decoding unit 820 is the same as that of the residual decoding unit 220 according to the first embodiment except that the residual decoding unit 820 uses a coefficient (a gain) obtained by long-term prediction instead of the coefficient (the PARCOR coefficient, for example) obtained by linear prediction. In this embodiment, FIG. 11 showing the residual decoding unit 220 according to the first embodiment will be used to describe the residual decoding unit 820 in detail.

(Encoding Method)

Figure 42:
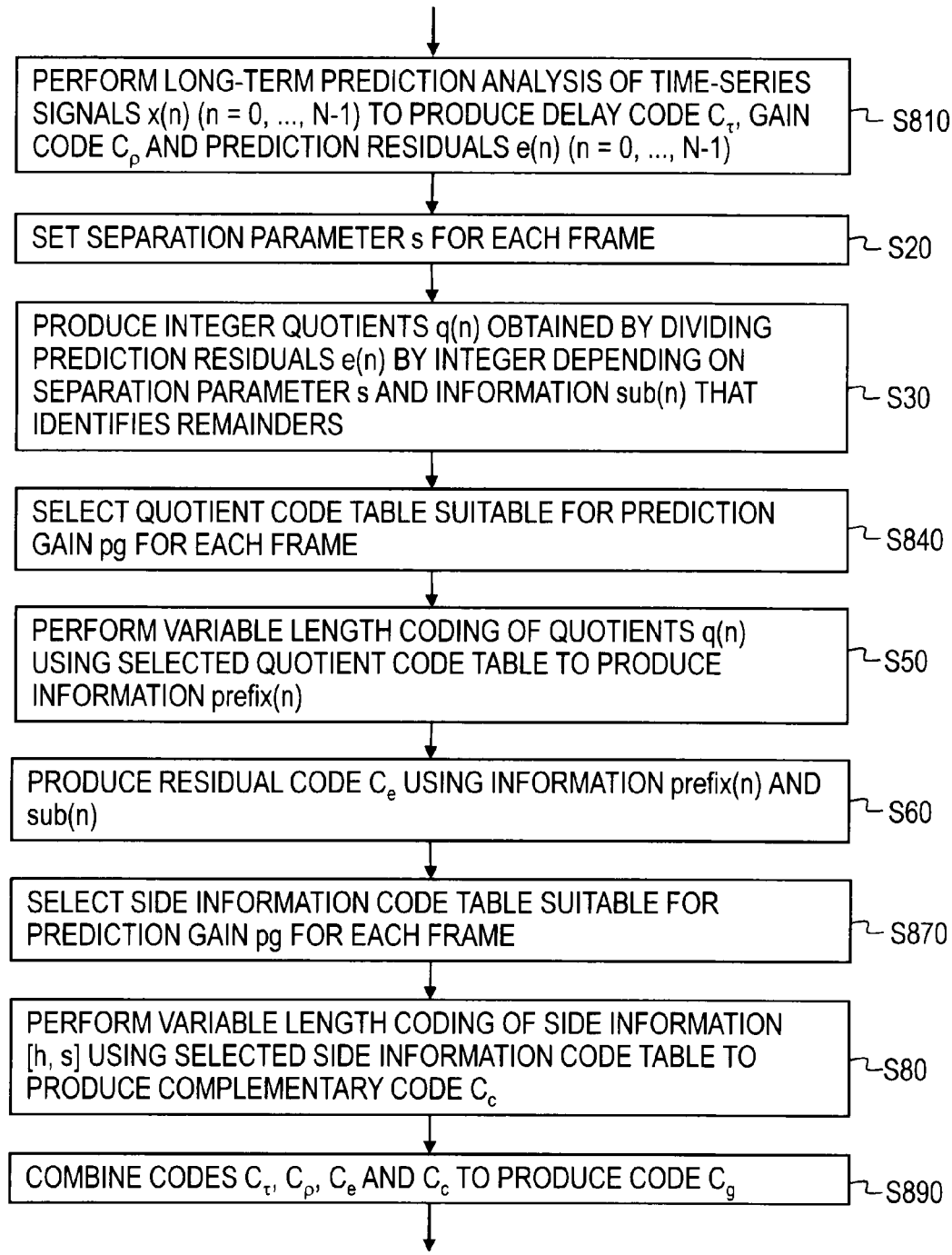
FIG. 42 is a flow chart for illustrating an encoding method according to the fourth embodiment.

FIG. 42 is a flow chart for illustrating an encoding method according to the fourth embodiment. The encoding method according to this embodiment will be described below with reference to the drawing.

Time-series signals x(n) similar to those in the first embodiment are input to the prediction coding unit 710 in the encoder 700 (FIG. 40). The time-series signals x(n) are buffered in the frame buffer 2111, and one frame of time-series signals x(n) (n=0, ..., N−1) are fed into a long-term prediction analyzer 712. The long-term prediction analyzer 712 performs long-term prediction analysis of the time-series signals x(n) (n=0, ..., N−1) and calculates gains ρ(j) (j=−tap, ..., tap) and a delay value τ (minimum delay value $T_{min} \leq \tau \leq$ maximum delay value $T_{max}$) that minimize the energy corresponding to the prediction residuals e(n) expressed by the formula (3). The long-term prediction analyzer 712 may be configured to perform direct long-term prediction analysis of the time-series signals x(n) (n=0, ..., N−1) or to map the input nonlinearly quantized time-series signals x(n) (n=0, ..., N−1) into linearly quantized signals or other nonlinearly quantized signals before performing long-term prediction analysis. The calculated gains ρ(j) (j=−tap, ..., tap) are fed into a quantizer 713. The quantizer 713 quantizes the gains ρ(j) (j=−tap, ..., tap) to generate quantized gains ρ'(j) (j=−tap, ..., tap) and outputs the quantized gains ρ'(j). For example, to generate a 4-bit quantized gain ρ'(j) from the gain ρ(j), the possible range of the gain ρ(j) is divided into 16 sub-ranges, and each of the 4-bit values "0000" to "1111" is assigned to a different one of the 16 sub-ranges. Then, the 4-bit value assigned to the sub-range corresponding to the input gain ρ(j) is output as the quantized gain ρ'(j). The delay value τ and the quantized gains ρ'(j) (j=−tap, ..., tap) are input to a coefficient coding unit 714, and the coefficient coding unit 714 generates and outputs a delay code $C_\tau$ corresponding to the delay value τ and a gain code $C_\rho$ corresponding to the gains ρ(j) (j=−tap, ..., tap). The delay value τ, the quantized gains ρ'(j) (j=−tap, ..., tap) and the time-series signals x(n) (n=0, ..., N−1) are also input to a long-term prediction unit 716. The long-term prediction unit 716 generates long-term prediction values y(n) (n=0, ..., N−1) using the long-term prediction filter expressed by the formula (4) and outputs the long-term prediction values y(n). Then, a subtractor 717 calculates prediction residuals e(n) (n=0, ..., N−1) by subtracting the long-term prediction values y(n) from the time-series signals x(n) (step S810).

Then, the processing in steps S20 and S30 described in the first embodiment is performed, and then, the quotients output from the separating unit 122a, the separation parameter s output from the separation parameter setting unit 121 (FIG. 9) and the quantized gain ρ'(0) output from the quantizer 713 are input to the quotient code table selector 122d in the residual coding unit 720. Using these pieces of information, the quotient code table selector 122d selects, for each frame, a quotient code table suitable for the prediction gain pg form a set of quotient code tables used for variable length coding of the quotients q(n), stored in the quotient code table storage 122e (step S840). Details of step S840 are basically the same as those of the specific example S40-2 of step S40 described in the first embodiment, for example. However, according to this embodiment, the quantized gain ρ'(0), a gain ρ"(0) obtained by inverse quantization of the quantized gain ρ'(0) or the like is used instead of the PARCOR coefficient i(1), the PARCOR coefficient k'(1) obtained by inverse quantization of the quantized PARCOR coefficient i(1) or the linear prediction coefficient α(1). That is, in step S41 (FIG. 18A), it is determined whether or not the quantized gain ρ'(0) or the gain ρ"(0) obtained by inverse quantization of the quantized gain ρ'(0) is equal to or greater than the threshold th, instead of determining whether or not the quantized PARCOR coefficient i(1) or the like is equal to or greater than the predetermined threshold th. The inverse quantization of the quantized gain ρ'(0) is a process of determining a predetermined value of ρ"(0) within the allowed range for the gain ρ(0) corresponding to the quantized gain ρ'(0). For example, supposing that the quantized gain ρ'(0) is the quantized value of the gain ρ(0) within η1≤ρ(0)<η2, the gain ρ"(0) obtained by inverse quantization of the quantized gain ρ'(0) is the average of η1 and η2, for example. As an alternative to the quantized gain ρ'(0) and the gain ρ"(0), a quantized gain or a gain for another tap may be used. Step S840 can be the same as the example S40-2 in the other respects.

Then, the processing in steps S50 and S60 in the first embodiment is performed, and then, the quantized gains ρ'(j) (j=−tap, ..., tap) output from the quantizer 713 are input to the side information code table selector 124 (FIG. 9). Using this information, the side information code table selector 124 in the residual coding unit 720 selects, for each frame, a side information code table suitable for the prediction gain pg from a set of side information code tables including the side information code tables used for variable length coding of the side information [h, s] based on a determination criterion corresponding to the prediction effectiveness of the time-series signals x(n) (in other words, a determination criterion for determining information corresponding to the index representing the prediction effectiveness of the time-series signals x(n)), and outputs a parameter w that identifies the selected side information code table (step S870). Details of step S870 are basically the same as the specific example S70-2 of step S70 described in the first embodiment, for example. However, according to this embodiment, the quantized gain $\rho'(0)$ or the gain $\rho''(0)$ obtained by inverse quantization of the quantized gain $\rho'(0)$ is used instead of the PARCOR coefficient i(1), the PARCOR coefficient k'(1) obtained by inverse quantization of the quantized PARCOR coefficient i(1) or the linear prediction coefficient $\alpha(1)$, for example. That is, in step S71 (FIG. 18B), it is determined whether or not the quantized gain $\rho'(0)$ or the gain $\rho''(0)$ obtained by inverse quantization of the quantized gain $\rho'(0)$ is equal to or greater than the predetermined threshold th, instead of determining whether or not the quantized PARCOR coefficient i(1) or the like is equal to or greater than the predetermined threshold th. As an alternative to the quantized gain $\rho'(0)$ and the gain $\rho(0)$, a quantized gain or a gain for another tap may be used. Step S870 can be the same as the example S70-2 in the other respects.

Then, the processing in step S80 described in the first embodiment is performed, and then, the delay code $C_\tau$ corresponding to the delay value $\tau$, the gain code $C_\rho$ corresponding to the gains $\rho(j)$ (j=−tap, . . . , tap), the residual code $C_e$ corresponding to the prediction residuals e(n) and the complementary code $C_c$ corresponding to the side information [h, s] generated as described above are input to the combining unit 2130 (FIG. 40), and the combining unit 2130 combines these codes to generate a code $C_g$ and outputs the code $C_g$ (step S890).

(Decoding Method)

Figure 43:
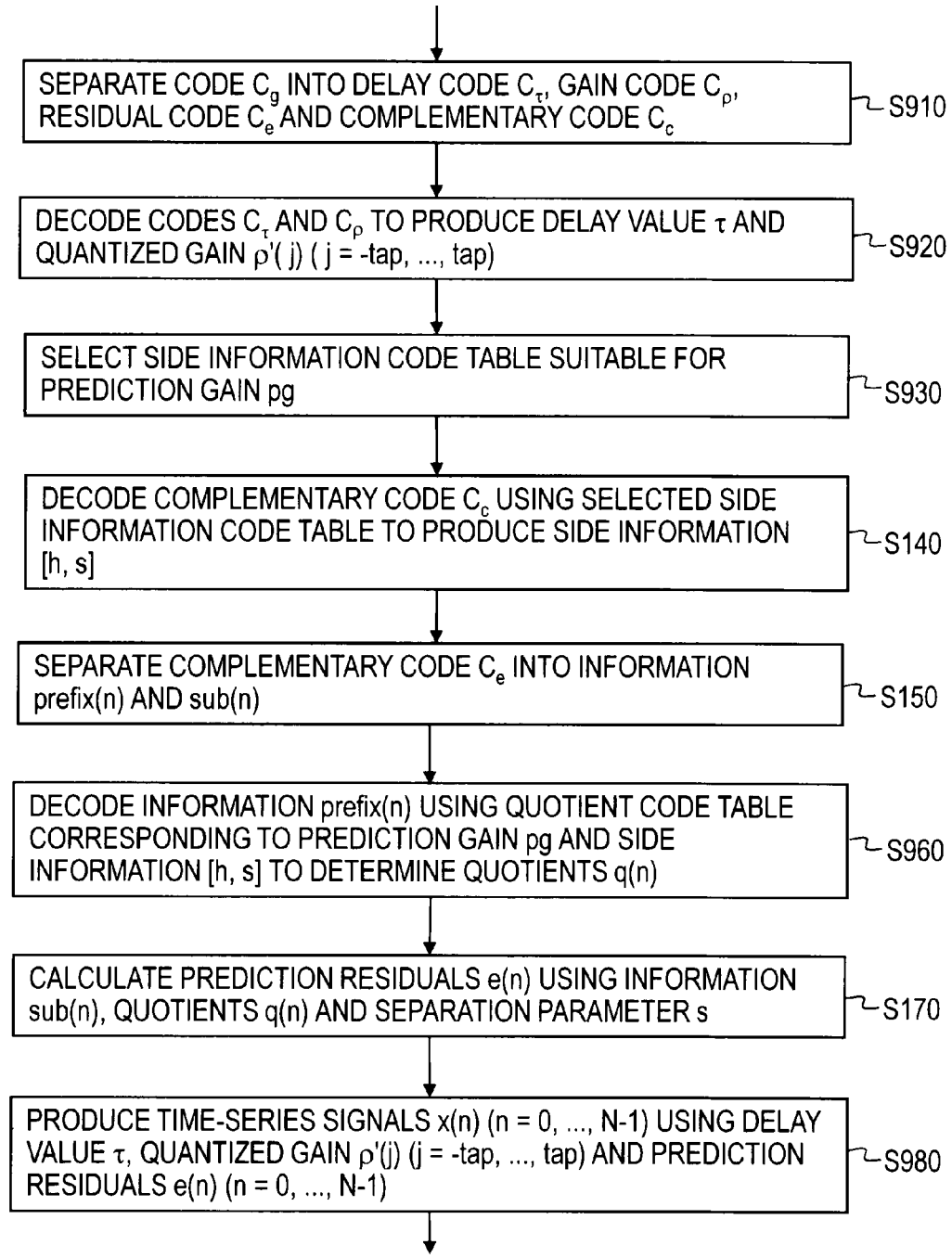
FIG. 43 is a flow chart for illustrating a decoding method according to the fourth embodiment.

FIG. 43 is a flow chart for illustrating a decoding method according to the fourth embodiment. The decoding method according to this embodiment will be described below with reference to this drawing.

The separator 2210 in the decoder 800 (FIG. 41) separates the code $C_g$ input to the decoder 800 into the delay code $C_\tau$, the gain code $C_\rho$, the residual codes $C_e(n)$ and the complementary code $C_c$ (step S910).

The delay code $C_\tau$ and the gain code $C_\rho$ are input to a coefficient decoding unit 831, and the coefficient decoding unit 831 decodes the delay code $C_\tau$ and the delay code $C_\rho$ to generate the delay value $\tau$ and the quantized gains $\rho'(j)$ (j=−tap, . . . , tap) (step S920).

The generated quantized gains $\rho'(j)$ (j=−tap, . . . , tap) are input to the side information code table selector 223 (FIG. 11) in the residual decoding unit 820 (FIG. 41). Using the quantized gains $\rho'(j)$ (j=−tap, . . . , tap), the side information code table selector 223 selects a side information code table suitable for the prediction gain pg from a set of side information code tables including the side information code tables used for decoding of the complementary code $C_c$ corresponding to the side information [h, s] based on a determination criterion corresponding to the prediction effectiveness of the time-series signals x(n) (in other words, a determination criterion for determining information corresponding to the index representing the prediction effectiveness of the time-series signals x(n)), and outputs a parameter w that identifies the selected side information code table (step S930). Details of step S930 are basically the same as those of the specific example S130-2 of Step S130 described in the first embodiment, for example. However, according to this embodiment, the quantized gain $\rho'(0)$, the gain $\rho''(0)$ obtained by inverse quantization of the quantized gain $\rho'(0)$ or the like is used instead of the PARCOR coefficient i(1), the PARCOR coefficient k'(1) obtained by inverse quantization of the quantized PARCOR coefficient i(1) or the linear prediction coefficient $\alpha(1)$. That is, in step S131 (FIG. 20A), it is determined whether or not the quantized gain $\rho'(0)$ or the gain $\rho''(0)$ obtained by inverse quantization of the quantized gain $\rho'(0)$ is equal to or greater than the threshold th, instead of determining whether or not the quantized PARCOR coefficient i(1) or the like is equal to or greater than the predetermined threshold th. As an alternative to the quantized gain $\rho'(0)$ and the gain $\rho(0)$, a quantized gain or a gain for another tap may be used. In the case where whether to use the long-term prediction or not is determined for each frame, the determination information can be used for selecting the side information code table. Step S930 can be the same as the example S130-2 in the other respects.

Then, the processing in steps S140 and S150 described in the first embodiment is performed, and then, the side information [h, s] output from the side information decoding unit 222 (FIG. 11), the information prefix(n) output from the separator 2221a, and the quantized gains $\rho'(0)$ output from the coefficient decoding unit 831 are input to the quotient decoding unit 221c. The quotient decoding unit 221c in the residual decoding unit 820 decodes the information prefix(n) by using the quotient code table, for each frame, corresponding to the prediction gain pg and the side information [h, s] specified by the input information, to determine the quotients q(n) and outputs the quotients q(n) (step S960). Details of step S960 are basically the same as those of the specific example S160-2 of Step S160 described in the first embodiment, for example. However, according to this embodiment, the quantized gain $\rho'(0)$, the gain $\rho''(0)$ obtained by inverse quantization of the quantized gain $\rho'(0)$ or the like is used instead of the PARCOR coefficient i(1), the PARCOR coefficient k'(1) obtained by inverse quantization of the quantized PARCOR coefficient i(1) or the linear prediction coefficient $\alpha(1)$. That is, in step S161 (FIG. 20B), it is determined whether or not the quantized gain $\rho'(0)$ or the gain $\rho''(0)$ obtained by inverse quantization of the quantized gain $\rho'(0)$ is equal to or greater than the threshold th, instead of determining whether or not the quantized PARCOR coefficient i(1) or the like is equal to or greater than the predetermined threshold th. As an alternative to the quantized gain $\rho'(0)$ and the gain $\rho(0)$, a quantized gain or a gain for another tap may be used. In the case where whether to use the long-term prediction or not is determined for each frame, the determination information can be used for selecting the side information code table. Step S960 can be the same as the example S160-2 in the other respects.

Then, the processing in step S170 described in the first embodiment is performed, and then, the delay value $\tau$ and the quantized gains $\rho'(j)$ (j=−tap, . . . , tap) generated by the coefficient decoding unit 831 are fed into a long-term prediction unit 833. Using the gains $\rho''(j)$ (j=−tap, . . . , tap) obtained by inverse quantization of the quantized gains $\rho'(j)$ (j=−tap, . . . , tap) and the time-series signals x(n) (n=0, . . . , N−1) previously output from an adder 834, the long-term prediction unit 833 generates long-term prediction values y(n) (n=0, . . . , N−1) with the long-term prediction filter expressed by the formula (4). The long-term prediction values Y(n) (n=0, . . . , N−1) output from the long-term prediction unit 833 and the prediction residuals e(n) (n=0, . . . , N−1) output from the residual decoding unit 820 are input to the adder 834. The adder 834 sums the long-term prediction values y(n) and the prediction residuals e(n) to generate the time-series signals x(n) (n=0, . . . , N−1) and outputs the time-series signals x(n) (step S980).

Modifications of Fourth Embodiment

The fourth embodiment described above is configured by replacing the linear prediction according to the first embodiment with the long-term prediction. However, the fourth embodiment may be configured by replacing the linear prediction according to the second embodiment, the third embodiment or a combination thereof with the long-term prediction. Alternatively, the modification 1 or 2 of the first embodiment may be applied to the fourth embodiment or a modification thereof.

Fifth Embodiment

According to a fifth embodiment, the first embodiment (short-term prediction) and the fourth embodiment (long-term prediction) are combined with each other. That is, respective codes based on the schemes 1 and 2 are generated, and either of the resulting codes having a smaller code amount is selected finally. In the encoding based on the scheme 1, first prediction residuals $e_S(n)$ generated by only linear prediction analysis as in the first embodiment are encoded. In the encoding based on scheme 2, second prediction residuals $e_L(n)$ generated by long-term prediction analysis, as in the fourth embodiment, of the first prediction residuals $e_S(n)$ generated by linear prediction analysis as in the first embodiment are encoded. In this embodiment, the type of the selected prediction analysis scheme (the scheme 1 or 2) is used as an index for selecting a processing suitable for the prediction gain pg. When the prediction effectiveness of the time-series signals $x(n)$ is high, the code amount of the code based on the scheme 2 is smaller than the code amount of the code based on the scheme 1. When the prediction effectiveness of the time-series signals $x(n)$ is low, the code length of the code based on the scheme 1 is smaller than the code amount of the code based on the scheme 2.

Differences from the first and fourth embodiments will next be described mainly, and a description of commonalities with the first and fourth embodiments will be omitted.

(Configuration)

Figure 44:
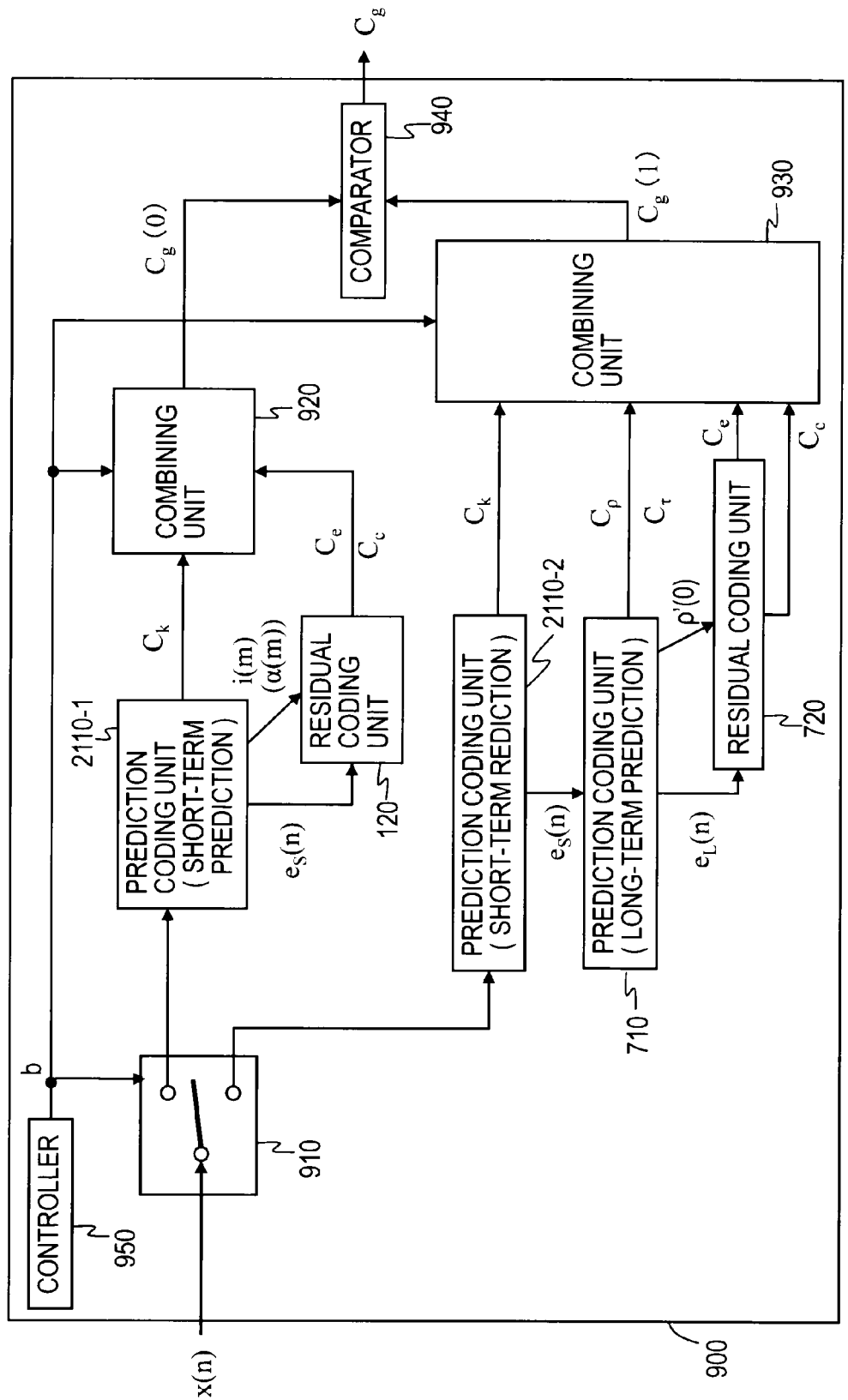
FIG. 44 is a block diagram for illustrating a functional configuration of an encoder according to a fifth embodiment.
Figure 45:
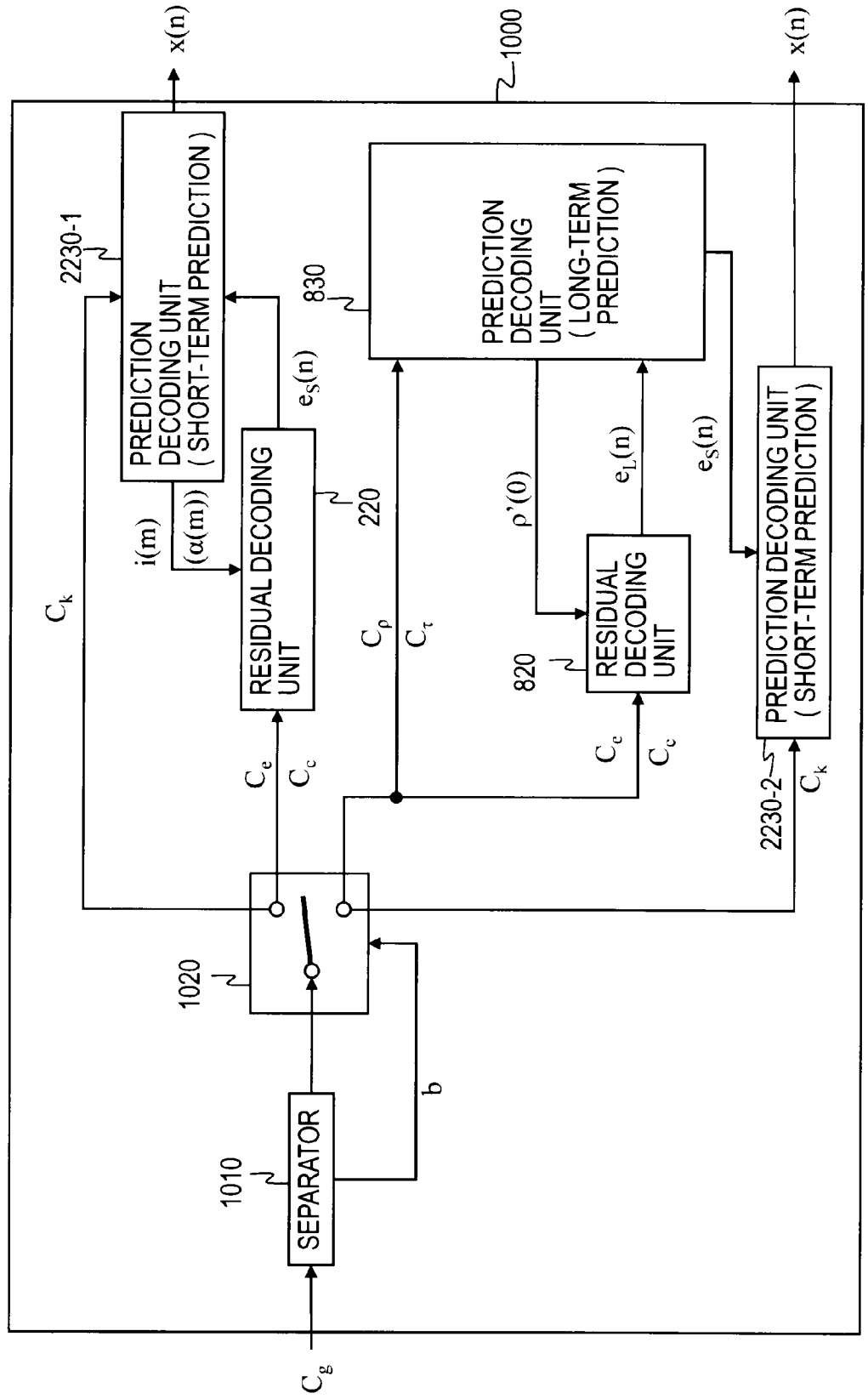
FIG. 45 is a block diagram for illustrating a functional configuration of a decoder according to the fifth embodiment.

FIG. 44 is a block diagram for illustrating a functional configuration of an encoder 900 according to the fifth embodiment. FIG. 45 is a block diagram for illustrating a functional configuration of a decoder 1000 according to the fifth embodiment. In these drawings, the same components as in the first and fourth embodiments are denoted by the same reference numerals as in the first and fourth embodiments, and descriptions thereof will be omitted.

As shown in FIG. 44, the encoder 900 according to this embodiment has a selector 910, combining units 920 and 930, a comparator 940, a controller 950, prediction coding units 2110-1 and 2110-2 configured the same as the prediction coding unit 2110, residual coding units 120 and 720, and a prediction coding unit 710. As shown in FIG. 45, the decoder 1000 according to this embodiment has a separator 1010, a selector 1020, residual decoding units 220 and 820, a prediction decoding unit 830, and prediction decoding units 2230-1 and 2230-2 configured the same as the prediction decoding unit 2230.

(Preprocessing)

The preprocessing is the same as those according to the first and fourth embodiments. However, as shown in FIG. 6B or by Properties 4 and 7, the type of the prediction analysis scheme and the frequency distribution of the separation parameter s and quotient code table selected are correlated with each other. Therefore, the side information code table optimal for variable length coding of the side information [h, s] is likely to vary with the type of the prediction analysis scheme. Thus, in many cases, the set of side information code tables stored in the residual coding unit 120 and the residual decoding unit 220 and the set of side information code tables stored in the residual coding unit 720 and the residual decoding unit 820 differ from each other. In this embodiment, it is assumed that the set of side information code tables stored in the residual coding unit 120 and the residual decoding unit 220 and the set of side information code tables stored in the residual coding unit 720 and the residual decoding unit 820 differ from each other. That is, in this embodiment, the side information code table suitable for the type of the selected prediction analysis scheme is selected in the encoding. In other words, in this embodiment, different side information code tables are selected in the encoding depending on the types of the selected prediction analysis schemes. Similarly, in this embodiment, the side information code table suitable for the type of the selected prediction synthesizing scheme is selected in the decoding. In other words, in this embodiment, different side information code tables are selected in the decoding depending on the types of the selected prediction synthesizing schemes. The prediction synthesizing scheme is determined by the corresponding prediction analysis scheme.

(Encoding Method)

Figure 46:
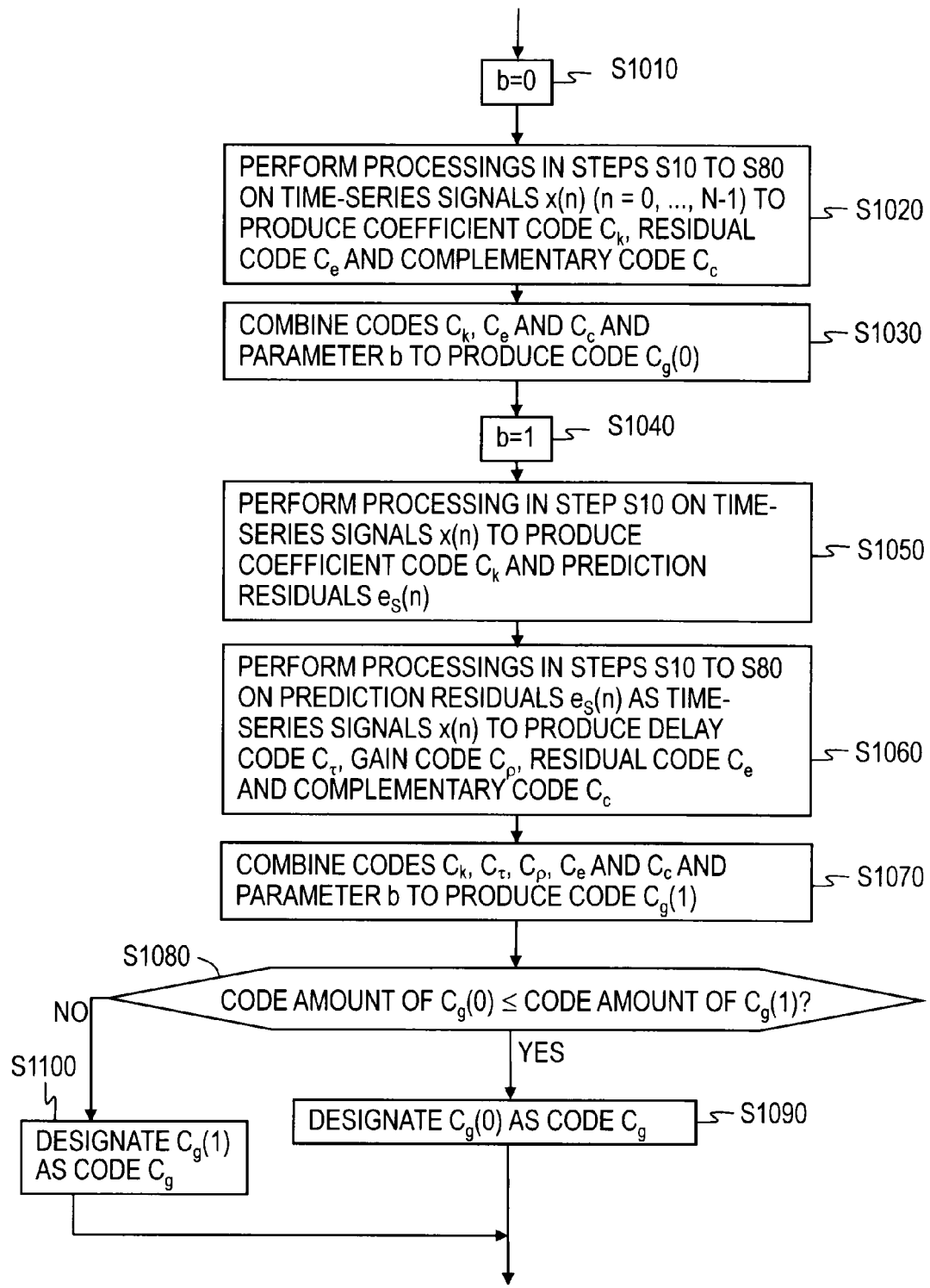
FIG. 46 is a flow chart for illustrating an encoding method according to the fifth embodiment.

FIG. 46 is a flow chart for illustrating an encoding method according to the fifth embodiment. The processing described below is performed for each frame.

First, the controller 950 in the encoder 900 (FIG. 44) sets a parameter b at 0 (step S1010). The parameter b=0 and the time-series signals $x(n)$ are input to the selector 910. The selector 910 having receives the parameter b=0 outputs the time-series signals $x(n)$ to the prediction coding unit 2110-1. Then, the prediction coding unit 2110-1 and the residual coding unit 120 perform the processing in steps S10 to S80 shown in FIG. 16 on the input one frame of time-series signals $x(n)$ (n=0, ..., N−1), thereby generating the coefficient code $C_k$ corresponding to the quantized PARCOR coefficients i(m) (m=1, ..., M), the residual code $C_e$ corresponding to the prediction residuals $e_S(n)$, and the complementary code $C_c$ corresponding to the side information [h, s] (step S1020). Then, the coefficient code $C_k$, the residual code $C_e$, the complementary code $C_c$ and the parameter b=0 are input to the combining unit 920, and the combining unit 920 combines the coefficient code $C_k$, the residual code $C_e$, the complementary code $C_c$ and the parameter b=0 to generate a code $C_g(0)$ and outputs the code $C_g(0)$ (step S1030).

Then, the controller 950 sets the parameter b at 1 (step S1040). The parameter b=1 and the time-series signals $x(n)$ (n=0, ..., N−1) are input to the selector 910. The selector 910 having receives the parameter b=1 inputs one frame of time-series signals $x(n)$ (n=0, ..., N−1) to the prediction coding unit 2110-2. Then, the prediction coding unit 2110-2 performs the processing in step S10 shown in FIG. 16 on the input one frame of time-series signals $x(n)$ (n=0, ..., N−1), thereby generating the coefficient code $C_k$ corresponding to the quantized PARCOR coefficients i(m) (m=1, ..., M) and the prediction residuals $e_S(n)$ (n=0, ..., N−1) (step S1050). The prediction residuals $e_S(n)$ are input to the prediction coding unit 710. The prediction coding unit 710 and the residual coding unit 720 perform the processing in steps S810 to S80 with the time-series signals $x(n)$ replaced with prediction residuals $e_S(n)$, thereby generating the delay code $C_\tau$ corresponding to the delay value τ, the delay code $C_\rho$ corresponding to the quantized gains ρ'(j) (j=−tap, ..., tap), the residual code $C_e$ corresponding to the prediction residuals $e_L(n)$ (n=0, ..., N−1) and the complementary code $C_c$ corresponding to the side information [h, s] (step S1060). Then, the coefficient code $C_k$, the delay code $C_\tau$, the delay code $C_\rho$, the residual code $C_e$, the complementary code $C_c$ and the parameter b=1 are input to the combining unit 920, and the combining unit 920 combines the coefficient code $C_k$, the delay code $C_\tau$, the delay code $C_\rho$, the residual code $C_e$, the complementary code $C_c$ and the parameter b=1 to generate a code $C_g(1)$ (step S1070).

Then, the code $C_g(0)$ and the code $C_g(1)$ are input to the comparator 940. The comparator 940 compares the code amount between the codes to determine whether or not the code amount of the code $C_g(0)$ is equal to or smaller than the code amount of the code $C_g(1)$ (step S1080). This determination corresponds to the determination criterion corresponding to the prediction effectiveness of the time-series signals x(n) (in other words, the determination criterion for determining information corresponding to the index representing the prediction effectiveness of the time-series signals x(n)). If the code amount of the code $C_g(0)$ is equal to or smaller than the code amount of the code $C_g(1)$, the code $C_g(0)$ is output as the final code $C_g$ (step S1090). If the code amount of the code $C_g(0)$ is larger than the code amount of the code $C_g(1)$, the code $C_g(1)$ is output as the final code $C_g$ (step S1100).

(Decoding Method)

Figure 47:
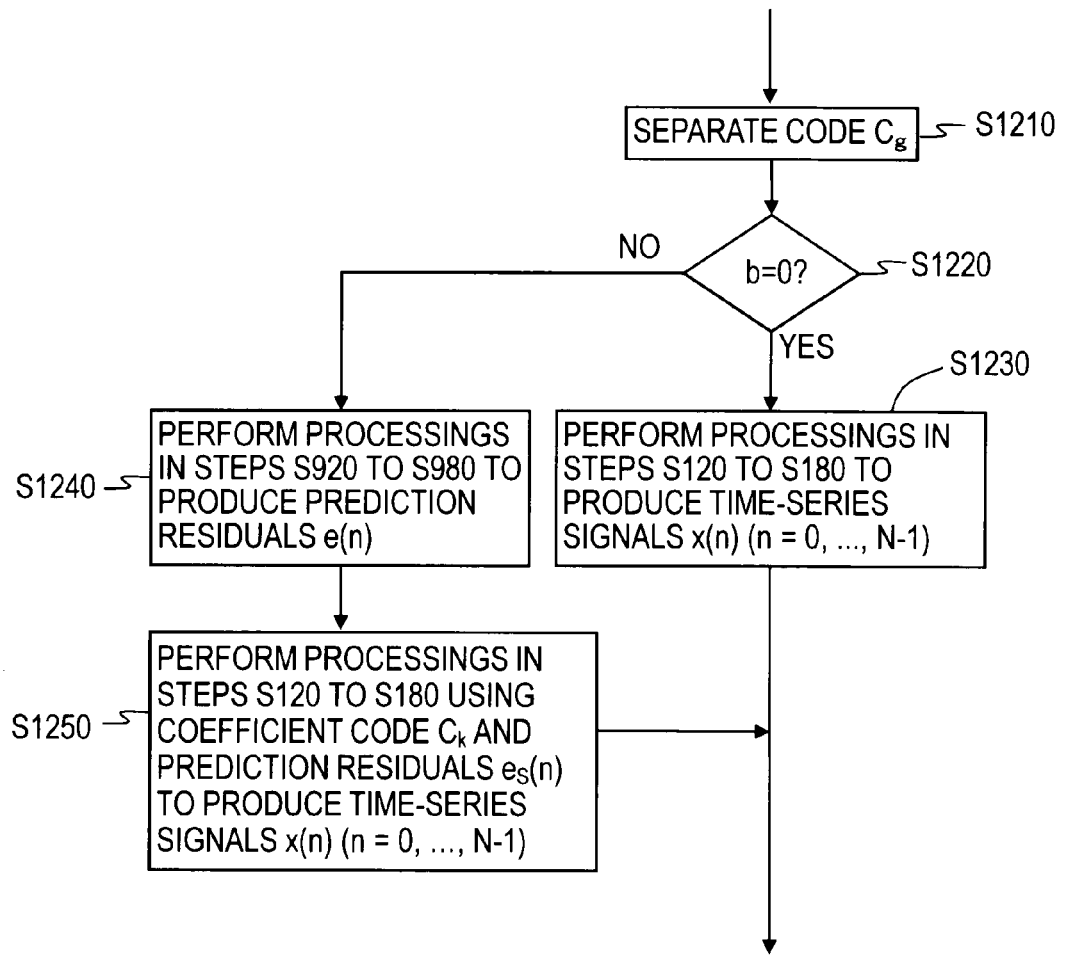
FIG. 47 is a flow chart for illustrating a decoding method according to the fifth embodiment.

FIG. 47 is a flow chart for illustrating a decoding method according to the fifth embodiment.

First, the code $C_g$ is input to the separator 1010 in the decoder 1000 (FIG. 45), and the separator 1010 separates the code $C_g$ into the coefficient code $C_k$, the residual code $C_e$, the complementary code $C_c$ and the parameter b=0 (when $C_g=C_g(0)$) or into the coefficient code $C_k$, the delay code $C_\tau$, the delay code $C_\rho$, the residual code $C_e$, the complementary code $C_c$ and the parameter b=1 (when $C_g=C_g(1)$) (step S1210).

The parameter b and the codes generated by the separator 1010 are input to the selector 1020. The selector 1020 determines whether b=0 or not (step S1220).

If b=0, the selector 1020 outputs the coefficient code $C_k$ to the prediction coding unit 2230-1 and the residual code $C_e$ and the complementary code $C_c$ to the residual decoding unit 220. Then, the prediction coding unit 2230-1 and the residual decoding unit 220 performs the processing in steps S120 to S180 shown in FIG. 19 to generate the time-series signals x(n) (n=0, . . . , N−1) and outputs the time-series signals x(n) (step S1230).

If b=1, the selector 1020 outputs the delay code $C_\tau$ and the delay code $C_\rho$ to the prediction decoding unit 830, the residual code $C_e$ and the complementary code $C_c$ to the residual decoding unit 820 and the coefficient code $C_k$ to the prediction decoding unit 2230-2. The residual decoding unit 820 and the prediction decoding unit 830 performs the processing in steps S920 to S980 shown in FIG. 43 to generate the prediction residuals $e_S(n)$ (n=0, . . . , N−1) and outputs the prediction residuals $e_S(n)$ (step S1240). The prediction residuals $e_S(n)$ (n=0, . . . , N−1) are input to the prediction decoding unit 2230-2. Using the coefficient code $C_k$ corresponding to the quantized PARCOR coefficients i(m) (m=1, . . . , M) and the prediction residuals $e_S(n)$ (n=0, . . . , N−1), the prediction decoding unit 2230-2 performs the processing in steps S120 and S180 shown in FIG. 19 to generate the time-series signals x(n) (n=0, . . . , N−1) and outputs the time-series signals x(n) (step S1250).

Modification of Fifth Embodiment

According to this embodiment described above, the first and fourth embodiments are combined with each other. However, according to this embodiment, the second embodiment, the third embodiment or a combination thereof may be used instead of the first embodiment. Alternatively, according to this embodiment, a modification of the first embodiment, a modification of the second embodiment, a modification of the third embodiment or a combination thereof may be used instead of the first embodiment.

In the process according to this embodiment described above, the linear prediction analysis and a combination of the long-term prediction analysis and the linear prediction analysis are used. However, a multi-channel prediction analysis or a combination of the multi-channel prediction analysis and the long-term prediction analysis or linear prediction analysis may also be used.

Other Modifications

The present invention is not limited to the embodiments described above. For example, although two sets T1 and T2 of quotient code tables are set depending on the prediction gain pg in the embodiments and the modifications thereof described above, the present invention is not limited to these embodiments and modifications thereof, and three or more sets of quotient code tables may be set depending on the prediction gain pg. Alternatively, only one set of quotient code table may be set regardless of the prediction gain pg. The method of encoding the quotients q(n) may be fixed to the Alpha coding or the like.

As the information used for estimating the prediction gain, the value of the prediction order adaptively determined may also be used. The prediction order selected tends to be lower as the prediction gain decrease and be higher as the prediction gain increase. Therefore, the set of quotient code tables or the side information code table may be selected based on the criterion to determine the selected prediction order.

Although two side information code tables Tc[1] and Tc[2] are set depending on the prediction gain pg in the embodiments and the modifications thereof described above, the present invention is not limited to these embodiments and modifications thereof, and three or more side information code tables may be set depending on the prediction gain pg.

In the embodiments and the modifications thereof described above, the set of quotient code tables and the side information code table are selected based on one determination criterion for the prediction gain pg. However, different determination criteria for the prediction gain pg may be used in selection of the set of quotient code tables and in selection of the side information code table.

Although the side information includes the separation parameter s and the quotient code table index h in the embodiments and the modifications thereof described above, the side information may include only one of the separation parameter s and the quotient code table index h. In this case, the separation parameter s or the quotient code table index h that is not included in the side information may be separately encoded and output, or the bits thereof may be output as a code as they are. If the quotient code table is fixed, the quotient code table index h is not necessary, so that the side information includes only the separation parameter s.

Although the side information includes all the bits of the separation parameter s and/or the quotient code table index h in the embodiments and the modifications thereof described above, the side information may include only a part of the bits of the separation parameter s and/or the quotient code table index h. In this case, the bits of the separation parameter s and/or the quotient code table index h that are not included in the side information may be separately encoded and output or may be output as a code as they are. For example, if the side information includes information on two higher-order bits of the separation parameter $s_i$ for each of a plurality of subframes and the quotient code table index h, the remaining bits of each separation parameter $s_i$ are output as a code as they are.

The processing described above can be performed not only sequentially in the order described above but also in parallel with each other or individually as required or depending on the processing power of the apparatus that performs the processing. Furthermore, of course, other various modifications can be appropriately made without departing form the spirit of the present invention.

In the case where the configuration described above is implemented by a computer, the specific processing capabilities of the apparatuses are described in a program. The computer executes the program to implement the processing capabilities described above.

The program that describes the specific processing can be recorded in a computer-readable recording medium. The computer-readable recording medium may be any type of recording medium, such as a magnetic recording device, an optical disk, a magneto-optical recording medium and a semiconductor memory.

The program may be distributed by selling, transferring or lending a portable recording medium, such as a DVD and a CD-ROM, in which the program is recorded, for example. Alternatively, the program may be distributed by storing the program in a storage device in a server computer and transferring the program from the server computer to other computers via a network.

The computer that executes the program first temporarily stores, in a storage device thereof, the program recorded in a portable recording medium or transferred from a server computer, for example. Then, when performing the processing, the computer reads the program from the recording medium and performs the processing according to the read program. In an alternative implementation, the computer may read the program directly from the portable recording medium and perform the processing according to the program. As a further alternative, the computer may perform the processing according to the program each time the computer receives a program transferred from the server computer. As a further alternative, the processing described above may be performed by on an application service provider (ASP) basis, in which the server computer does not transmit the program to the computer, and the processing capabilities are implemented only through execution instruction and result acquisition. The programs according to the embodiments of the present invention include a quasi-program, which is information processed by a computer (data or the like that is not a direct instruction to a computer but has a property that defines the processing performed by the computer).

In the embodiments described above, the apparatuses are implemented by executing a predetermined program on a computer. However, at least a part of the processing may be implemented in the form of hardware.

INDUSTRIAL APPLICABILITY

Industrial applications of the present invention include a lossless compression encoding and decoding technique for an acoustic signal, for example. In addition, the present invention is not limited to the acoustic signal but can also be applied to a lossless compression coding and decoding technique for a video signal, a biological signal, a seismic signal or the like.

DESCRIPTION OF
REFERENCE NUMERALS

| | |
|---|---|
| 100, 700, 2100 | encoder |
| 200, 800, 2200 | decoder |

What is claimed is:

1. An encoding method, implemented by an encoder, comprising:
    (A) a step of performing, by circuitry of the encoder, a prediction analysis of time-series signals to generate prediction residuals expressed by integers;
    (B) a step of setting an integer separation parameter corresponding to magnitude of the prediction residuals for each certain time segment; and
    (C) a step of selecting a side information code table from a set of side information code tables including a side information code table used for variable length coding of side information corresponding to the separation parameter, based on a determination criterion corresponding to an index representing a prediction effectiveness of the time-series signals,
    wherein each of the side information code tables is a code table in which side information is associated with a code assigned to side information,
    amplitude of a separation parameter corresponding to side information associated with a code having shortest code length in a first side information code table is equal to or smaller than amplitude of a separation parameter corresponding to side information associated with a code having shortest code length in a second side information code table, and
    the first side information code table is the side information code table selected in the step (C) when the index representing the prediction effectiveness is a first value, and the second side information code table is the side information code table selected in the step (C) when the index representing the prediction effectiveness is a second value greater than the first value.

2. The encoding method according to claim 1, wherein the prediction residuals are obtained by a prediction analysis of the time-series signals according to a prediction analysis scheme selected based on the determination criterion, and
    the step (C) includes a step of selecting a different one of the side information code tables depending on the type of the prediction analysis scheme selected based on the determination criterion.

3. The encoding method according to claim 2, wherein the prediction analysis scheme is selected from a prediction analysis scheme that involves both a short-term prediction analysis and a long-term prediction analysis and a prediction analysis scheme that involves only the short-term prediction analysis.

4. An encoding method, implemented by an encoder, comprising:
    (A) a step of performing, by circuitry of the encoder, a prediction analysis of time-series signals according to a prediction analysis scheme selected from a prediction analysis scheme that involves both a short-term prediction analysis and a long-term prediction analysis and a prediction analysis scheme that involves only the short-term prediction analysis to generate prediction residuals expressed by integers;
    (B) a step of setting an integer separation parameter corresponding to magnitude of the prediction residuals for each certain time segment; and
    (C) a step of selecting, from a set of side information code tables including a side information code table used for variable length coding of side information corresponding to the separation parameter, a different one of the side information code tables, depending on a type of the prediction analysis scheme selected, wherein each of the side information code tables is a code table in which side information is associated with a code assigned to the side information, amplitude of a separation parameter corresponding to side information associated with a code having shortest code length in a first side information code table is equal to or smaller than amplitude of a separation parameter corresponding to side information associated with a code having shortest code length in a second side information code table, and the first side information code table is the side information code table selected in the step (C) when the prediction analysis scheme involves only the short-term prediction analysis, and the second side information code table is the side information code table selected in the step (C) when the prediction analysis scheme involves both the short-term prediction analysis and the long-term prediction analysis.

5. An encoding method, implemented by an encoder, comprising:
(A) a step of performing, by circuitry of the encoder, a prediction analysis of time-series signals to generate prediction residuals expressed by integers;
(B) a step of setting an integer separation parameter corresponding to magnitude of the prediction residuals for each certain time segment; and
(C) a step of selecting a side information code table from a set of side information code tables including a side information code table used for variable length coding of side information corresponding to the separation parameter, based on a determination criterion corresponding to a prediction gain or information for estimating the prediction gain, the prediction gain being a ratio of an energy corresponding to the time-series signals to an energy corresponding to the prediction residuals,
wherein each of the side information code tables is a code table in which side information is associated with a code assigned to the side information,
amplitude of a separation parameter corresponding to side information associated with a code having shortest code length in a first side information code table is equal to or smaller than amplitude of a separation parameter corresponding to side information associated with a code having shortest code length in a second side information code table, and
the first side information code table is the side information code table selected in the step (C) when a value corresponding to the prediction gain is a first value, and the second side information code table is the side information code table selected in the step (C) when the value corresponding to the prediction gain is a second value greater than the first value.

6. The encoding method according to claim 5, wherein the information corresponding to the prediction gain or the information for estimating the prediction gain includes a coefficient of a prediction filter obtained by a prediction analysis of the time-series signals or a coefficient capable of being converted to the coefficient of the prediction filter, and
the step (C) includes a step of selecting the side information code table based on a determination criterion corresponding to the coefficient of the prediction filter obtained by the prediction analysis of the time-series signals or the coefficient capable of being converted to the coefficient of the prediction filter.

7. The encoding method according to claim 5, wherein prediction residuals are obtained by a prediction analysis of the time-series signals according to a prediction analysis scheme selected based on the determination criterion, and
the step (C) includes a step of selecting a different one of the side information code tables depending on a type of the prediction analysis scheme selected based on the determination criterion.

8. The encoding method according to claim 7, wherein the prediction analysis scheme is selected from a prediction analysis scheme that involves both a short-term prediction analysis and a long-term prediction analysis and a prediction analysis scheme that involves only the short-term prediction analysis.

9. The encoding method according to claim 1, 2, 3, 4, 5, 6, 7 or 8, wherein the side information corresponds to information formed by integrating each portion that is included in bits representing each of separation parameters set for a plurality of time segments.

10. An encoding method, implemented by an encoder, comprising:
(A) a step of performing, by circuitry of the encoder, a prediction analysis of time-series signals to generate prediction residuals expressed by integers;
(B) a step of setting an integer separation parameter corresponding to magnitude of the prediction residuals for each certain time segment; and
(C) a step of selecting a side information code table from a set of side information code tables including a side information code table used for variable length coding of side information corresponding to the separation parameter, based on a determination criterion corresponding to an index representing a prediction effectiveness of the time-series signals,
wherein the side information further corresponds to a quotient code table index that identifies a quotient code table that is a code table used for variable length coding of integer quotients, the quotients obtained by dividing the prediction residuals or integers equal to or greater than 0 that correspond to monotonically increasing function values of magnitude of the prediction residuals by the separation parameter set for the time segment to which the prediction residuals belong or an integer corresponding to a mapped value of the separation parameter, respectively,
each of the side information code tables is a code table in which side information is associated with a code assigned to the side information,
the quotient code table corresponding to side information associated with a code having shortest code length in a second side information code table is more similar to an Alpha code table used for Alpha coding than the quotient code table corresponding to side information associated with a code having shortest code length in a first side information code table, and
the first side information code table is the side information code table selected in the step (C) when the index representing the prediction effectiveness is a first value, and the second side information code table is the side information code table selected in the step (C) when the index representing the prediction effectiveness is a second value greater than the first value.

11. The encoding method according to claim 10, wherein each of the Alpha code table and the quotient code table is a code table in which quotients are associated with codes assigned to the quotients, respectively, and
the quotient code table is more similar to the Alpha code table as a total sum of $(bu(k)-bx(k))(fu(k)-fx(k))$ with respect to k decreases, where a bit length of a code associated with a quotient k in the Alpha code table is denoted as bu(k), a bit length of a code associated with the quotient k in a certain quotient code table is denoted as bx(k), $fu(k)=0.5^{bu(k)}$, and $fx(k)=0.5^{bx(k)}$.

12. The encoding method according to claim 10, further comprising:
  a step of selecting a quotient code table from a set of quotient code tables based on a second determination criterion corresponding to the index representing the prediction effectiveness,
  wherein the side information corresponds to the quotient code table index that identifies the quotient code table selected.

13. The encoding method according to claim 10, wherein the quotient code table is selected for each time segment, and
  the side information corresponds to information formed by integrating each portion that is included in bits representing each of quotient code table indices that identify the quotient code tables selected for a plurality of time segments.

14. The encoding method according to claim 1, 4, 5, or 10, further comprising a step of setting information including first information and second information as a code corresponding to the prediction residuals, the first information identifying integer quotients, the quotients obtained by dividing the prediction residuals or integers equal to or greater than 0 that correspond to monotonically increasing function values of magnitude of the prediction residuals by the separation parameter set for the time segment to which the prediction residuals belong or an integer corresponding to a mapped value of the separation parameter, respectively, and the second information identifying a remainder of the division.

15. A non-transitory computer-readable recording medium that stores a program that makes a computer execute a process of an encoding method according to claim 1, 4, 5, or 10.

16. A decoding method, implemented by a decoder, comprising:
  (A) a step of decoding, by circuitry of the decoder, a first code to generate coefficients of a prediction synthesis filter or coefficients capable of being converted to coefficients of the prediction synthesis filter; and
  (B) a step of selecting a side information code table, from a set of side information code tables, the side information code table being used for decoding of a second code to obtain side information corresponding to an integer separation parameter which is used for obtaining prediction residuals for each time segment, based on a determination criterion corresponding to an index representing a prediction effectiveness of time-series signals synthesized by the prediction synthesis filter,
  wherein each of the side information code tables is a code table in which side information is associated with a code assigned to the side information,
  amplitude of a separation parameter corresponding to side information associated with a code having shortest code length in a first side information code table is equal to or smaller than amplitude of a separation parameter corresponding to side information associated with a code having shortest code length in a second side information code table, and
  the first side information code table is the side information code table selected in the step (B) when the index representing the prediction effectiveness is a first value, and the second side information code table is the side information code table selected in the step (B) when the index representing the prediction effectiveness is a second value greater than the first value.

17. The decoding method according to claim 16, wherein the prediction residuals are used for prediction synthesis of the time-series signals according to a prediction synthesis scheme selected based on the determination criterion, and
  the step (B) is to select a different one of the side information code tables depending on a type of the prediction synthesis scheme selected based on the determination criterion.

18. The decoding method according to claim 17, wherein the prediction synthesis scheme is selected from a prediction synthesis scheme that involves both a short-term prediction synthesis and a long-term prediction synthesis and a prediction synthesis scheme that involves only the short-term prediction synthesis.

19. A decoding method, implemented by a decoder, comprising:
  (A) a step of decoding, by circuitry of the decoder, a first code to generate coefficients of a prediction synthesis filter or coefficients capable of being converted to the coefficients of the prediction synthesis filter; and
  (B) a step of selecting a side information code tables depending on a type of a prediction synthesis scheme, from a set of side information code tables, the side information code table being used for decoding of a second code to obtain side information corresponding to an integer separation parameter which is used for obtaining prediction residuals for each time segment,
  wherein each of the side information code tables is a code table in which side information is associated with a code assigned to the side information, and
  amplitude of a separation parameter corresponding to side information associated with a code having shortest code length in a first side information code table is equal to or smaller than amplitude of a separation parameter corresponding to side information associated with a code having shortest code length in a second side information code table, wherein
  the first side information code table is the side information code table selected in the step (B) when the prediction synthesis scheme involves only a short-term prediction synthesis, and the second side information code table is the side information code table selected in the step (B) when the prediction synthesis scheme involves both a short-term prediction synthesis and a long-term prediction synthesis.

20. A decoding method, implemented by a decoder, comprising:
  (A) a step of decoding, by circuitry of the decoder, a first code to generate coefficients of a prediction synthesis filter or coefficients capable of being converted to the coefficients of the prediction synthesis filter; and
  (B) a step of selecting a side information code table, from a set of side information code tables, the side information code table being used for decoding of a second code to obtain side information corresponding to an integer separation parameter which is used for obtaining prediction residuals for each time segment, based on a determination criterion corresponding to a prediction gain or information for estimating the prediction gain,
  wherein each of the side information code tables is a code table in which side information is associated with a code assigned to the side information,
  amplitude of a separation parameter corresponding to side information associated with a code having shortest code length in a first side information code table is equal to or smaller than amplitude of a separation parameter corresponding to side information associated with a code having shortest code length in a second side information code table, and the first side information code table is the side information code table selected in the step (B) when a value corresponding to the prediction gain is a first value, and the second side information code table is the side information code table selected in the step (B) when the value corresponding to the prediction gain is a second value greater than the first value.

21. The decoding method according to claim 20, wherein the information corresponding to the prediction gain or the information for estimating the prediction gain includes a coefficient of the prediction synthesis filter or a coefficient capable of being converted to the coefficient of the prediction synthesis filter, and the step (B) includes a step of selecting the side information code table based on the coefficient of the prediction synthesis filter or the coefficient capable of being converted to the coefficient of the prediction synthesis filter.

22. The decoding method according to claim 20, wherein the step (B) includes a step of selecting a different one of the side information code tables depending on a type of the prediction synthesis.

23. The decoding method according to claim 22, wherein the prediction synthesis is a prediction synthesis that involves both a short-term prediction synthesis and a long-term prediction synthesis or a prediction synthesis that involves only the short-term prediction synthesis.

24. The decoding method according to claim 16, 17, 18, 19, 20, 21, 22, or 23, wherein the side information corresponds to information formed by integrating each portion that is included in bits representing each of separation parameters set for a plurality of time segments.

25. A decoding method, implemented by a decoder, comprising:
    (A) a step of decoding, by circuitry of the decoder, a first code to generate coefficients of a prediction synthesis filter or coefficients capable of being converted to coefficients of the prediction synthesis filter; and
    (B) a step of selecting a side information code table, from a set of side information code tables, the side information code table being used for decoding of a second code to obtain side information corresponding to an integer separation parameter which is used for obtaining prediction residuals for each time segment, based on a determination criterion corresponding to an index representing a prediction,
    wherein the side information further corresponds to a quotient code table index that identifies a quotient code table that is a code table used to obtain integer quotients by variable length decoding,
    the side information code table is a code table in which side information is associated with a code assigned to the side information, and
    the quotient code table corresponding to side information associated with a code having shortest code length in a second side information code table is more similar to an Alpha code table used for Alpha decoding than the quotient code table corresponding to side information associated with a code having shortest code length in a first side information code table, wherein
    the first side information code table is the side information code table selected in the step (B) when the index representing a prediction effectiveness is a first value, and the second side information code table is the side information code table selected in the step (B) when the index representing a prediction effectiveness is a second value greater than the first value.

26. The decoding method according to claim 25, wherein each of the Alpha code table and the quotient code table is a code table in which quotients are associated with codes assigned to the quotients, respectively, and
    the quotient code table is more similar to the Alpha code table as a total sum of $(bu(k)-bx(k))(fu(k)-fx(k))$ with respect to k decreases, where a bit length of a code associated with a quotient k in the Alpha code table is denoted as $bu(k)$, a bit length of a code associated with the quotient k in a certain quotient code table is denoted as $bx(k)$, $fu(k)=0.5^{bu(k)}$, and $fx(k)=0.5^{bx(k)}$.

27. The decoding method according to claim 25, further comprising:
    a step of selecting, from a set of quotient code tables, a quotient code table selected based on a second determination criterion corresponding to the index representing a prediction effectiveness,
    wherein the side information corresponds to the quotient code table index that identifies the quotient code table selected.

28. The decoding method according to claim 25, wherein the quotient code table is selected for each time segment, and
    the side information corresponds to information formed by integrating each portion that is included in bits representing each of quotient code table indices that identify the quotient code tables selected for a plurality of time segments.

29. A non-transitory computer-readable recording medium that stores a program that makes a computer execute a process of a decoding method according to claim 16, 19, 20, or 25.

30. An encoder, comprising:
    circuitry configured to:
    perform a prediction analysis of time-series signals to generate prediction residuals expressed by integers;
    set an integer separation parameter corresponding to magnitude of the prediction residuals for each certain time segment; and
    select a side information code table from a set of side information code tables including a side information code table used for variable length coding of side information corresponding to the separation parameter, based on a determination criterion corresponding to an index representing a prediction effectiveness of the time-series signals,
    wherein each of the side information code tables is a code table in which side information is associated with a code assigned to side information,
    amplitude of a separation parameter corresponding to side information associated with a code having shortest code length in a first side information code table is equal to or smaller than amplitude of a separation parameter corresponding to side information associated with a code having shortest code length in a second side information code table, and
    the first side information code table is the side information code table selected by the circuitry when the index representing the prediction effectiveness is a first value, and the second side information code table is the side information code table selected by the circuitry when the index representing the prediction effectiveness is a second value greater than the first value.

31. An encoder, comprising:
circuitry configured to:
perform a prediction analysis of time-series signals according to a prediction analysis scheme selected from a prediction analysis scheme that involves both a short-term prediction analysis and a long-term prediction analysis and a prediction analysis scheme that involves only the short-term prediction analysis to generate prediction residuals expressed by integers;
set an integer separation parameter corresponding to magnitude of the prediction residuals for each certain time segment; and
select, from a set of side information code tables including a side information code table used for variable length coding of side information corresponding to the separation parameter, a different one of the side information code tables depending on a type of the prediction analysis scheme selected,
wherein each of the side information code tables is a code table in which side information is associated with a code assigned to the side information,
amplitude of a separation parameter corresponding to side information associated with a code having shortest code length in a first side information code table is equal to or smaller than amplitude of a separation parameter corresponding to side information associated with a code having shortest code length in a second side information code table, and
the first side information code table is the side information code table selected by the circuitry when the prediction analysis scheme involves only the short-term prediction analysis, and the second side information code table is the side information code table selected by the circuitry when the prediction analysis scheme involves both the short-term prediction analysis and the long-term prediction analysis.

32. An encoder, comprising:
circuitry configured to:
generate prediction residuals expressed by integers using a result of a prediction analysis of time-series signals;
set an integer separation parameter depending on amplitude of the prediction residuals for each certain time segment; and
select a side information code table from a set of side information code tables including a side information code table used for variable length coding of side information corresponding to the separation parameter, based on a determination criterion corresponding to a prediction gain or information for estimating the prediction gain, the prediction gain being a ratio of an energy corresponding to the time-series signals to an energy corresponding to the prediction residuals,
wherein each of the side information code tables is a code table in which side information is associated with a code assigned to the side information,
amplitude of a separation parameter corresponding to side information associated with a code having shortest code length in a first side information code table is equal to or smaller than amplitude of a separation parameter corresponding to side information associated with a code having shortest code length in a second side information code table, and
the first side information code table is the side information code table selected by the circuitry when a value corresponding to the prediction gain is a first value, and the second side information code table is the side information code table selected by the circuitry when the value corresponding to the prediction gain is a second value greater than the first value.

33. A decoder, comprising:
circuitry configured to:
decode a first code to generate coefficients of a prediction synthesis filter or coefficients capable of being converted to the coefficients of the prediction synthesis filter; and
select a side information code table, from a set of side information code tables, the side information code table being used for decoding of a second code to obtain side information corresponding to an integer separation parameter which is used for obtaining prediction residuals for each time segment based on a determination criterion corresponding to an index representing a prediction effectiveness of time-series signals synthesized by the prediction synthesis filter,
wherein each of the side information code tables is a code table in which side information is associated with a code assigned to the side information,
amplitude of a separation parameter corresponding to side information associated with a code having shortest code length in a first side information code table is equal to or smaller than amplitude of a separation parameter corresponding to side information associated with a code having shortest code length in a second side information code table, and
the first side information code table is the side information code table selected by the circuitry when the index representing the prediction effectiveness is a first value, and the second side information code table is the side information code table selected by the circuitry when the index representing the prediction effectiveness is a second value greater than the first value.

34. A decoder, comprising:
circuitry configured to:
decode a first code to generate coefficients of a prediction synthesis filter or coefficients capable of being converted to the coefficients of the prediction synthesis filter; and
select a side information code table depending on a type of a prediction synthesis scheme, from a set of side information code tables, the side information code table being used for decoding of a second code to obtain side information corresponding to an integer separation parameter which is used for obtaining prediction residuals for each time segment,
wherein each of the side information code tables is a code table in which side information is associated with a code assigned to the side information, and
amplitude of a separation parameter corresponding to side information associated with a code having shortest code length in a first side information code table is equal to or smaller than amplitude of a separation parameter corresponding to side information associated with a code having shortest code length in a second side information code table, wherein
the first side information code table is the side information code table selected by the circuitry when the prediction synthesis scheme involves only a short-term prediction synthesis, and the second side information code table is the side information code table selected by the circuitry when the prediction synthesis scheme involves both a short-term prediction synthesis and a long-term prediction synthesis.

35. A decoder, comprising:

circuitry configured to:

decode a first code to generate coefficients of a prediction synthesis filter or coefficients capable of being converted to the coefficients of the prediction synthesis filter; and select a side information code table, from a set of side information code tables, the side information code table being used for decoding of a second code to obtain side information corresponding to an integer separation parameter which is used for obtaining prediction residuals for each time segment, based on a determination criterion corresponding to a prediction gain or information for estimating the prediction gain, wherein each of the side information code tables is a code table in which side information is associated with a code assigned to the side information, amplitude of a separation parameter corresponding to side information associated with a code having shortest code length in a first side information code table is equal to or smaller than amplitude of a separation parameter corresponding to side information associated with a code having shortest code length in a second side information code table, and the first side information code table is the side information code table selected by the circuitry when a value corresponding to the prediction gain is a first value, and the second side information code table is the side information code table selected by the circuitry when the value corresponding to the prediction gain is a second value greater than the first value.

* * * * *